US011797227B2

(12) United States Patent
Ware et al.

(10) Patent No.: US 11,797,227 B2
(45) Date of Patent: Oct. 24, 2023

(54) MEMORY CONTROLLER FOR MICRO-THREADED MEMORY OPERATIONS

(71) Applicant: Rambus Inc., Sunnyvale, CA (US)

(72) Inventors: Frederick A. Ware, Los Altos Hills, CA (US); Craig E. Hampel, Los Altos, CA (US); Wayne S. Richardson, Saratoga, CA (US); Chad A. Bellows, Birmingham, MI (US); Lawrence Lai, San Jose, CA (US)

(73) Assignee: Rambus Inc., San Jose, CA (US)

( * ) Notice: Subject to any disclaimer, the term of this patent is extended or adjusted under 35 U.S.C. 154(b) by 601 days.

(21) Appl. No.: 16/405,479

(22) Filed: May 7, 2019

(65) Prior Publication Data

US 2019/0339908 A1 Nov. 7, 2019

Related U.S. Application Data

(63) Continuation of application No. 15/486,068, filed on Apr. 12, 2017, now Pat. No. 10,331,379, which is a (Continued)

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0613* (2013.01); *G06F 3/0673* (2013.01); (Continued)

(58) Field of Classification Search
None
See application file for complete search history.

(56) References Cited

U.S. PATENT DOCUMENTS 4,377,855 A 3/1983 Lavi
4,542,483 A 9/1985 Procyk
(Continued)

FOREIGN PATENT DOCUMENTS

CN 1214515 A 4/1999
DE 102005021894 A1 1/2006
(Continued)

OTHER PUBLICATIONS

Micron, SDR SDRAM MT48LC* spec sheet, 1999, Micron, 94pages (Year: 1999).*
(Continued)

*Primary Examiner* — Gary W. Cygiel

(57) ABSTRACT

A micro-threaded memory device. A plurality of storage banks are provided, each including a plurality of rows of storage cells and having an access restriction in that at least a minimum access time interval must transpire between successive accesses to a given row of the storage cells. Transfer control circuitry is provided to transfer a first amount of data between the plurality of storage banks and an external signal path in response to a first memory access request, the first amount of data being less than a product of the external signal path bandwidth and the minimum access time interval.

21 Claims, 25 Drawing Sheets

Related U.S. Application Data continuation of application No. 14/449,610, filed on Aug. 1, 2014, now Pat. No. 9,652,176, which is a continuation of application No. 13/901,014, filed on May 23, 2013, now Pat. No. 9,292,223, which is a continuation of application No. 10/998,402, filed on Nov. 29, 2004, now Pat. No. 8,595,459.

(51) Int. Cl.

| | |
|---|---|
| ***G11C 7/22*** | (2006.01) |
| ***G11C 11/4076*** | (2006.01) |
| ***G11C 11/4097*** | (2006.01) |
| ***G11C 8/06*** | (2006.01) |

(52) U.S. Cl.

CPC .......... *G11C 7/1006* (2013.01); *G11C 7/1042* (2013.01); *G11C 7/22* (2013.01); *G11C 8/06* (2013.01); *G11C 11/4076* (2013.01); *G11C 11/4097* (2013.01)

(56) References Cited

U.S. PATENT DOCUMENTS 4,569,036 A 2/1986 Fujii
4,633,434 A 12/1986 Scheuneman
4,636,982 A 1/1987 Takemae et al.
4,646,268 A 2/1987 Kuno
4,654,781 A 3/1987 Schwartz et al.
4,670,745 A 6/1987 O'Malley et al.
4,698,788 A 10/1987 Flannagan
4,700,328 A 10/1987 Burghard
4,710,902 A 12/1987 Pelley, III
4,740,921 A 4/1988 Lewandowski
4,758,993 A 7/1988 Takemae
4,766,538 A 8/1988 Miyoshi
4,768,157 A 8/1988 Chauvel et al.
4,787,858 A 11/1988 Killian, Jr.
4,796,230 A 1/1989 Young
4,800,525 A 1/1989 Shah
4,811,302 A 3/1989 Koishi
4,825,413 A 4/1989 Tran
4,837,465 A 6/1989 Rubinstein
4,837,743 A 6/1989 Chiu
4,843,264 A 6/1989 Galbraith
4,862,421 A 8/1989 Tran
4,888,732 A 12/1989 Inoue
4,903,344 A 2/1990 Inoue
4,961,168 A 10/1990 Tran
4,982,370 A 1/1991 Matsumoto
4,984,196 A 1/1991 Tran
4,985,867 A 1/1991 Ishii et al.
4,991,141 A 2/1991 Tran
5,046,050 A 9/1991 Kertis
5,093,806 A 3/1992 Tran
5,111,434 A 5/1992 Cho
5,119,340 A 6/1992 Slemmer
5,121,358 A 6/1992 Slemmer
5,124,610 A 6/1992 Conley
5,124,951 A 6/1992 Slemmer
5,128,897 A 7/1992 McClure
5,132,931 A 7/1992 Koker
5,146,592 A 9/1992 Pfeiffer et al.
5,150,330 A 9/1992 Hag
5,181,205 A 1/1993 Kertis
5,193,072 A 3/1993 Frenkil
5,193,074 A 3/1993 Anami
5,214,610 A 5/1993 Houston
5,222,047 A 6/1993 Matsuda et al.
5,241,503 A 8/1993 Cheng
5,249,165 A 9/1993 Toda
5,251,178 A 10/1993 Childers
5,263,002 A 11/1993 Suzuki
5,267,215 A 11/1993 Tsujimoto
5,274,596 A 12/1993 Watanabe
5,291,444 A 3/1994 Scott
5,301,162 A 4/1994 Shimizu
5,305,280 A 4/1994 Hayano
5,313,603 A 5/1994 Takishima
5,321,646 A 6/1994 Tomishima
5,337,283 A 8/1994 Ishikawa
5,343,438 A 8/1994 Choi
5,383,159 A 1/1995 Kubota
5,390,308 A 2/1995 Ware et al.
5,394,528 A 2/1995 Kobayashi et al.
5,406,526 A 4/1995 Sugibayashi
5,414,662 A 5/1995 Foss
5,418,737 A 5/1995 Tran
5,428,389 A 6/1995 Ito
5,432,743 A 7/1995 Kusakari
5,455,802 A 10/1995 McClure
5,471,425 A 11/1995 Yumitori
5,485,430 A 1/1996 McClure
5,517,456 A 5/1996 Chishiki
5,530,814 A 6/1996 Wong et al.
5,546,346 A 8/1996 Agata et al.
5,559,970 A 9/1996 Sharma
5,587,960 A 12/1996 Ferris
5,614,855 A 3/1997 Lee et al.
5,652,870 A 7/1997 Yamasaki et al.
5,655,113 A 8/1997 Leung et al.
5,666,322 A 9/1997 Conkle
5,675,180 A 10/1997 Pedersen
5,689,472 A 11/1997 Tanaka et al.
5,701,270 A 12/1997 Rao
5,717,871 A 2/1998 Hsieh et al.
5,717,901 A 2/1998 Sung et al.
5,748,561 A 5/1998 Hotta
5,751,657 A 5/1998 Hotta
5,787,267 A 7/1998 Leung et al.
5,793,998 A 8/1998 Copeland et al.
5,801,985 A 9/1998 Roohparvar et al.
5,822,772 A 10/1998 Chan et al.
5,852,725 A 12/1998 Yen
5,864,505 A 1/1999 Higuchi
5,870,347 A 2/1999 Keeth et al.
5,875,132 A 2/1999 Ozaki
5,881,017 A 3/1999 Matsumoto et al.
5,892,981 A 4/1999 Wiggers
5,893,927 A 4/1999 Hovis
5,903,509 A 5/1999 Ryan et al.
5,933,387 A 8/1999 Worley
5,936,885 A 8/1999 Morita
5,958,033 A 9/1999 Schubert et al.
5,963,488 A 10/1999 Inoue
5,995,438 A 11/1999 Jeng et al.
5,996,051 A 11/1999 Mergard
6,018,478 A 1/2000 Higuchi
6,034,878 A 3/2000 Osaka et al.
6,047,347 A 4/2000 Hansen et al.
6,049,855 A 4/2000 Jeddeloh
6,050,983 A 4/2000 Moore et al.
6,065,092 A 5/2000 Roy
6,075,728 A 6/2000 Inoue
6,125,157 A 9/2000 Donnelly et al.
6,138,185 A 10/2000 Nelson et al.
6,141,273 A 10/2000 Ku et al.
6,144,220 A 11/2000 Young et al.
6,160,750 A 12/2000 Shieh
6,163,491 A 12/2000 Iwamoto et al.
6,185,149 B1 2/2001 Fujioka et al.
6,209,056 B1 3/2001 Suh
6,240,039 B1 5/2001 Lee et al.
6,240,040 B1 5/2001 Akaogi et al.
6,247,084 B1 6/2001 Apostol et al.
RE37,409 E 10/2001 Richardson et al.
6,311,313 B1 10/2001 Camporese et al.
6,356,975 B1 3/2002 Barth et al.
6,363,454 B1 3/2002 Lakhani et al.
6,366,995 B1 4/2002 Vilkov et al.
6,393,543 B1 5/2002 Vilkov et al.
6,396,764 B1 5/2002 Holland
6,434,081 B1 8/2002 Johnson et al.
6,446,158 B1 9/2002 Karabatsos

(56) References Cited

U.S. PATENT DOCUMENTS

| | | | |
|---|---|---|---|
| 6,587,917 | B2 | 7/2003 | Simmons |
| 6,591,349 | B1 | 7/2003 | Steinman et al. |
| 6,625,687 | B1 | 9/2003 | Halbert et al. |
| 6,678,204 | B2 | 1/2004 | Nagashima et al. |
| 6,680,736 | B1 | 1/2004 | Cho |
| 6,687,796 | B1 | 2/2004 | Laine et al. |
| 6,725,316 | B1 | 4/2004 | Gans |
| 6,742,098 | B1 | 5/2004 | Halbert et al. |
| 6,748,556 | B1 | 6/2004 | Storino et al. |
| 6,754,120 | B1 | 6/2004 | Bellows et al. |
| 6,813,688 | B2 | 11/2004 | Wu et al. |
| 6,825,841 | B2 | 11/2004 | Hampel et al. |
| 6,854,042 | B1 | 2/2005 | Karabatsos |
| 6,877,079 | B2 | 4/2005 | Yoo et al. |
| 6,885,572 | B2 | 4/2005 | Fujisawa |
| 6,895,474 | B2 | 5/2005 | Ryan et al. |
| 6,920,540 | B2 | 7/2005 | Hampel et al. |
| 7,039,782 | B2 | 5/2006 | Garrett, Jr. et al. |
| 7,187,572 | B2 | 3/2007 | Perego et al. |
| 7,254,075 | B2 | 8/2007 | Woo et al. |
| 7,266,667 | B2 | 9/2007 | Oh |
| 7,280,428 | B2 | 10/2007 | Ware et al. |
| 7,281,079 | B2 | 10/2007 | Bains et al. |
| 7,363,422 | B2 | 4/2008 | Perego et al. |
| 7,369,444 | B2 | 5/2008 | Perego et al. |
| 7,386,696 | B2 | 6/2008 | Jakobs et al. |
| 7,505,356 | B2 | 3/2009 | Ware et al. |
| 7,729,151 | B2 | 6/2010 | Tsern et al. |
| 7,907,470 | B2 | 3/2011 | Ware et al. |
| 8,028,144 | B2 | 9/2011 | Hampel et al. |
| 8,050,134 | B2 | 11/2011 | Ware et al. |
| 9,257,161 | B2 | 2/2016 | Garrett, Jr. |
| 2001/0037428 | A1 | 11/2001 | Hsu |
| 2002/0138687 | A1* | 9/2002 | Yang .................. G06F 13/1642 711/105 |
| 2003/0009612 | A1 | 1/2003 | Latta |
| 2003/0048616 | A1 | 3/2003 | Ko et al. |
| 2003/0052885 | A1 | 3/2003 | Hampel et al. |
| 2003/0112031 | A1* | 6/2003 | Agrawal .......... H03K 19/17744 326/41 |
| 2003/0123318 | A1* | 7/2003 | Nagashima ......... G11C 11/4097 365/233.1 |
| 2003/0174573 | A1 | 9/2003 | Suzuki et al. |
| 2003/0197201 | A1 | 10/2003 | Yanagawa |
| 2004/0019756 | A1 | 1/2004 | Perego et al. |
| 2004/0037133 | A1 | 2/2004 | Park et al. |
| 2004/0073772 | A1 | 4/2004 | Hokenek et al. |
| 2004/0105292 | A1 | 6/2004 | Matsui |
| 2004/0120197 | A1 | 6/2004 | Kondo et al. |
| 2004/0120210 | A1 | 6/2004 | Lee |
| 2004/0177210 | A1 | 9/2004 | Choi |
| 2004/0221186 | A1 | 11/2004 | Lee et al. |
| 2004/0225853 | A1 | 11/2004 | Lee et al. |
| 2004/0256638 | A1 | 12/2004 | Perego et al. |
| 2005/0015539 | A1 | 1/2005 | Horii et al. |
| 2005/0083721 | A1 | 4/2005 | Hampel et al. |
| 2005/0152210 | A1 | 7/2005 | Park et al. |
| 2005/0182885 | A1 | 8/2005 | Matsui et al. |
| 2006/0004976 | A1 | 1/2006 | Rader |
| 2006/0039227 | A1 | 2/2006 | Lai et al. |
| 2006/0047899 | A1 | 3/2006 | Iida et al. |
| 2006/0067146 | A1 | 3/2006 | Woo et al. |
| 2006/0072366 | A1 | 4/2006 | Ware et al. |
| 2007/0268765 | A1 | 11/2007 | Woo et al. |
| 2008/0028135 | A1 | 1/2008 | Rajan et al. |
| 2008/0062807 | A1 | 3/2008 | Ware et al. |
| 2009/0157994 | A1 | 6/2009 | Hampel et al. |
| 2010/0211748 | A1 | 8/2010 | Perego et al. |

FOREIGN PATENT DOCUMENTS

| | | | |
|---|---|---|---|
| EP | 0339224 | A2 | 11/1989 |
| EP | 0887737 | A2 | 12/1998 |
| EP | 0910091 | A2 | 4/1999 |
| EP | 1248267 | A2 | 10/2002 |
| GB | 2367400 | A | 4/2002 |
| JP | 05-290573 | A | 5/1993 |
| JP | 07-262767 | | 10/1995 |
| JP | 9-231760 | A | 9/1997 |
| JP | H09-231760 | A | 9/1997 |
| JP | 10-172283 | | 6/1998 |
| JP | 2000-066950 | A | 3/2000 |
| JP | 2000-082287 | | 3/2000 |
| JP | 2002-251883 | A | 9/2002 |
| JP | 2003-007052 | | 1/2003 |
| JP | 2003-223785 | A | 8/2003 |
| JP | 2003-317474 | A | 11/2003 |
| JP | 2004-005856 | A | 1/2004 |
| JP | 2004-139552 | A2 | 5/2004 |
| WO | WO-1991-016680 | A1 | 10/1991 |
| WO | WO-2004-034401 | A2 | 4/2004 |
| WO | WO-2006-039106 | | 4/2006 |
| WO | WO-2009-089301 | | 7/2009 |

OTHER PUBLICATIONS

Aimoto et al., "SP23.3 A 7168GIPS 3.84GB/s 1W Parallel Image-Processing RAM Integrating a 16Mb DRAM and 128 Processors," ISSCC, Feb. 1996, pp. 372-373/476. 3 pages.

Amendment and Response dated Apr. 20, 2010 re U.S. Appl. No. 12/392,071. 12 pages.

Chang, Kun-Yung, "Design of a CMOS Asymmetric Serial Link," A Dissertation Submitted to the Department of Electrical Engineering and the Committee on Graduate Studies of Stanford University, Aug. 1999. 133 pages.

CN Board Opinion dated Dec. 1, 2011 re CN Application No. 200580045523.7. 8 pages. (With Translation).

CN Office Action dated Dec. 22, 2010 re Rejection Decision for CN Application No. 200580045523.7. 14 pages. (With Translation).

CN Office Action dated Mar. 24, 2010 re CN Application No. 200580045523.7, Includes Text of the Second Office Action and Translation. 14 pages. (With Translation).

CN Response dated Jun. 3, 2010 re CN Patent Application No. 200580045523.7. 11 pages. (With Translation).

Cuppu, V., et al. "A Performance Comparison of Contemporary DRAM Architectures", Proceedings of the 26th International Symposium on Computer Architecture, Atlanta, GA, May 2-4, 1999; [International Symposium on Computer Architecture (ISCA)], Los Alamitos, CA; IEEE Comp. Soc, US, vol. Conf. 26, May 2, 1999 (May 2, 1999), pp. 222-233. XP000887620. ISBN: 978-0-7695-0171-0. 12 pages.

Elpida Memory Inc., "User's Manual: New Features of DDR3 Sdram," Document E1503E10 (Ver.1.0), published Mar. 2009. 18 pages.

EP Communication pursuant to Article 94(3) EPC, dated Jul. 30, 2010 in EP Application No. 05852108.8-2210. 6 pages.

EP Examination Report dated Apr. 24, 2013 in EP Application No. 11184623.4. 7 pages.

EP Examination Report dated Jul. 29, 2013 re EP Application No. 11168736.4. 10 pages.

EP Examination Report dated Jun. 3, 2013 in EP Application No. 05852180.8. 8 pages.

EP Extended European Search Report dated Mar. 27, 2012 re EP Application No. 11168734.9. 9 pages.

EP Extended European Search Report dated Mar. 27, 2012 re EP Application No. 11168735.6. 9 pages.

EP Extended European Search Report dated Mar. 28, 2012 re EP Application No. 11168736.4. 11 pages.

EP Extended Search Report dated Dec. 30, 2011 re EP Application No. 11179126.5. 10 pages.

EP Extended Search Report dated Dec. 30, 2011 re EP Application No. 11184623.4. 9 pages.

EP Extended Search Report dated Jan. 2, 2012 re EP Application No. 11184627.5. 7 pages.

EP Office Action dated Apr. 24, 2013 in EP Application No. 11179126.5. 9 pages.

EP Office Action dated Apr. 24, 2013 in EP Application No. 11184627.5. 7 pages.

(56) References Cited

OTHER PUBLICATIONS

EP Office Action dated Mar. 23, 2012 re EP Application No. 05852180.8. 5 pages.
EP Office Communication dated Aug. 1, 2013 in EP Application 11168735.6. 23 pages.
EP Office Communication dated Aug. 1, 2013 re EP Application No. 11168734.9. 24 pages.
EP Office Communication dated Jan. 11, 2012 re EP Application No. 07782931.5. 7 pages.
EP Office Communication dated Nov. 24, 2010 re EP Application No. 09167223.8. 6 pages.
EP Official Communication dated Sep. 27, 2012 in EP Application No. 09167223.8-1233. 2 pages.
EP Provision of the Minutes in Accordance With Rule 124(4) EPC with mail date of Mar. 15, 2016 re EP Appln. No. 05852180.8. 7 Pages.
EP Provision of the Minutes Rule 124(4) EPC dated Jan. 27, 2014 re EP Application No. 07782931.5. 12 pages.
EP Reponse with EP Appln. No. 11168736.4 filed on Jan. 16, 2016 in Response to the Summons to Attend Oral Proceedings of Aug. 17, 2015. 31 Pages.
EP Response dated Oct. 8, 2013 in EP Application No. 05852180.8, Includes New Claims (Highlighted and Clear copies) and New Description pp. 2, 2a, and 2b (Highlighted and Clear copies). 47 pages.
EP Response dated Apr. 15, 2010 to the Official Communication dated Oct. 5, 2009 re EP Application No. 07783931.5-1233. 25 pages.
EP Response dated Apr. 4, 2011 to the Official Communication dated Nov. 24, 2010 re EP Application No. 09167223.8, Includes New Claims (Highlighted & Clear Copy) and Cross-Reference of New Claims. 41 pages.
EP Response dated Aug. 29, 2012 to the Official Communication dated Mar. 27, 2012, Application No. 11168735.6. 21 pages.
EP Response dated Dec. 10, 2013 in EP Application No. 07782931.5, Includes the Main Request and Auxiliary Requests I-IV (Clear and Highlighted Copies). 63 pages.
EP Response dated Feb. 3, 2011 to the Official Communication dated Jul. 30, 2010 re EP Application No. 05852180.8. 33 pages.
EP Response dated Feb. 5, 2014 in EP Application No. 11168736.4, Includes New Claims (Clear and Highlighted Copies) and New Description pages (Clear and Highlighted Copies). 30 pages.
EP Response dated Feb. 6, 2014 in EP Application No. 11168734.9, Includes New Claims (Highlighted and Clear Copies) and New Description pages. 26 pages.
EP Response dated Feb. 6, 2014 in EP Application No. 11168735.6, Includes New Claims (Highlighted and Clear Copies) and New Description pages. 23 pages.
EP Response dated Jul. 20, 2012 to the Official Communication dated Jan. 11, 2012 in EP Application No. 07782931.5-1233, Includes New Claims (Clear and Highlighted Copies). 23 pages.
EP Response dated Jul. 22, 2015 in EP Application No. 11168735.6, Includes Summons to Attend Oral Proceedings. 10 pages.
EP Response dated Jul. 23, 2015 in EP Application No. 05852180.8, Includes Summons to Attend Oral Proceedings. 14 pages.
EP Response dated Jul. 30, 2012 in response to the Official Communication dated Feb. 6, 2012 and to the Extended European Search Report dated Dec. 30, 2012, in EP Application No. 11 184 623.4, Includes New Claims (Clear and Highlighted Copies). 29 pages.
EP Response dated Jul. 30, 2012 in Response to the Official Communication dated Feb. 6, 2012 and to the Extended European Search Report dated Dec. 30, 2012, in EP Application No. 11 184 627.5, Includes New Description pp. 2, 2a, and 22. 13 pages.
EP Response dated Jul. 30, 2012 to the Official Communication dated Feb. 6, 2011 and the extended European Search Report dated Dec. 30, 2011, in EP Application No. 11 179 126.5, Includes New Claims (Clear and Highlighted Copies). 26 pages.
EP Response dated Nov. 4, 2013 in EP Application No. 11179126.5, Includes New Claims (Clear and Highlighted copies). 19 pages.
EP Response dated Nov. 4, 2013 in EP Application No. 11184623.4, Includes New Claims (Clear and Highlighted copies). 20 pages.
EP Response dated Nov. 4, 2013 in EP Application No. 11184627.5, Includes New Claims (Clear and Highlighted versions). 17 pages.
EP Response dated Sep. 6, 2012 to the Official Communication dated May 2, 2012, Application No. 11168734.9. 22 pages.
EP Response dated Sep. 6, 2012 to the Official Communication dated May 2, 2012, Application No. 11168736.4. 27 pages.
EP Response dated Sep. 6, 2012 to the Official Communication dated Mar. 23, 2012, Application No. 05852180.8. 19 pages.
EP Response to Official Communication dated Aug. 29, 2012, in EP Application No. 11168735.6, Includes New Claims (Clear and Highlighted Copies). 19 pages.
EP Response to the Decision to Refuse European Patent Application of Nov. 14, 2012, dated Mar. 22, 2013 in EP Application No. 09 167 223.8. 71 pages.
EP Response to the Official Communication of Jan. 31, 2012 and the telephone call with Mr. Wolff of Sep. 21, 2012, dated Sep. 24, 2012 in EP Application No. 09167223.8. 11 pages.
EP Response with EP Appln. No. 05852180.8 filed on Jan. 15, 2016 in Response to Summons to Attend Oral Proceedings of Aug. 20, 2015. 78 Pages.
EP Submission dated Feb. 3, 2012 in Response to the Official Communication dated Jan. 31, 2012 re EP Application No. 09167223.8. 4 pages.
EP Submission dated Jan. 15, 2014 in EP Application No. 07782931.5, Includes Auxiliary Request V (Clear and Highlighted copies). 9 pages.
EP Summons to Attend Oral Proceedings dated Aug. 17, 2015 in EP Application No. 11168734.9. 8 pages.
EP Summons to Attend Oral Proceedings dated Aug. 17, 2015 in EP Application No. 11168736.4. 9 pages.
EP Summons to Attend Oral Proceedings re EP Application No. 09167223.8 dated Jan. 31, 2012. 8 pages.
Fairchild Semiconductor, "Design Optimization Techniques for Double Data Rate SDRAM Modules," Jul. 2000. 6 pages.
Final Office Action dated Jul. 7, 2010 re U.S. Appl. No. 12/392,071. 15 pages.
First EP Examination Report dated Oct. 5, 2009, re EP Application No. 07 782 931.5-1233. 5 pages.
Fujitsu Limited, "Memory CMOS 8 x 256K x 32 Bit Double Data Rate FCRAM, MB81N643289-50/-60," pp. 1-56, Fujitsu Semiconductor Data Sheet, Advance Info., AE0.5E. 57 pages.
Garrett, Jr., Billy, U.S. Appl. No. 09/837,307, filed Apr. 17, 2007, re Application and Figures as Filed. 54 pages.
Giacalone et al., "SP23.2: A 1MB, 100MHz Integrated L2 Cache Memory with 128b Interface and ECC Protection," IEEE ISSCC, Feb. 1996, pp. 370-371/475. 3 pages.
Hampel, Craig, U.S. Appl. No. 11/381,349, filed May 2, 2006, re Reply Brief in Response to Examiner's Answer dated Feb. 8, 2010. 6 pages.
Hampel, Craig, U.S. Appl. No. 12/392,071, filed Feb. 24, 2009, re Office Action dated Feb. 17, 2011. 19 pages.
Hirose et al., "A 20-ns 4-Mb CMOS SRAM with Hierarchical Word Decoding Architecture," IEEE, Oct. 1990, pp. 1068-1072, vol. 25, No. 5. 8 pages.
International Preliminary Report on Patentability (Chapter 1) dated Apr. 12, 2007, re International Application No. PCT/US2005/032770. 6 pages.
International Preliminary Report on Patentability (Chapter 1) dated Jun. 7, 2007, re International Application No. PCT/US2005/042722. 10 pages.
International Preliminary Report on Patentability (Chapter II) dated Apr. 9, 2010 re Int'l. Application No. PCT/US07/67814. 7 pages.
International Preliminary Report on Patentability dated Apr. 9, 2010 re Int'l. Application No. PCT/US07/67814. 7 pages.
International Search Report and the Written Opinion for International Application No. PCT/US2007/067814, dated Feb. 29, 2008. 18 pages.
International Search Report and Written Opinion dated Jan. 26, 2006 in International Application No. PCT/US2005/032770. 9 pages.

(56) References Cited

OTHER PUBLICATIONS

International Search Report and Written Opinion dated Jan. 4, 2006 in International Application No. PCT/US2005/028728. 5 pages.
International Search Report and Written Opinion dated May 10, 2006 in International Application No. PCT/US2005/042722. 15 pages.
International Search Report and Written Opinion in International Application No. PCT/US/2005/032770, dated Jan. 26, 2006. 12 pages.
Invitation to Pay Additional Fees from the International Searching Authority in International Application PCT/US2007/067814, dated Dec. 17, 2007. 8 pages.
Jedec, "Minutes of Meeting No. 71, JC-42.3 Committee on RAM Memories," including Proposal to Add Number of Banks Option to the Mode Register for 64M SDRAM, Joint Electron Device Engineering Council (JEDEC), May 25, 1994, New York, pp. 1-14 plus Attachment T. 8 pages.
JP Office Action dated Jun. 19, 2012 for JP Application No. 2009-510005. 6 Pages. (With Translation).
JP Office Action dated Oct. 27, 2011 re JP Application No. 2007-543517. 18 pages. (With Translation).
JP Office Action for JP Appln. No. 2015-152586 dated Sep. 2, 2016. 7 Pages. (With Translation).
JP Response (Argument and Amendment) dated Jun. 7, 2013 in JP Application No. 2007-543517, Includes English Translation. 28 pages.
JP Response dated Apr. 26, 2012, re Argument and Amendment to the Office Action dated Oct. 27, 2011 in JP Application No. 2007-543517. 21 pages. (With Translation).
Kirihata et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588. 10 pages.
Koike et al., "SP23.1: A 60ns 1Mb Nonvolatile Ferroelectric Memory with Non-Driven Cell Plate Line Write/Read Scheme," ISSCC, Feb. 10, 1996, pp. 368-379/475. 3 pages.
Konishi et al., "Session XVIII: Static RAMs, FAM 18.6: A 64Kb CMOS RAM," IEEE International Solid State Circuits Conference, Feb. 12, 1982, pp. 258-259. 3 pages.
KR Office Action dated May 9, 2012 re KR Application No. 2007-7014584. 4 pages. (With Translation).
KR Response (Argument and Amendment) dated May 31, 2013 in KR Application No. 2007-7014584, Includes English Translation of Argument and Claims. 133 pages.
KR Response (Argument/Amendment) dated Jun. 18, 2012 in KR Application No. 10-2007-7014584. 123 pages.
Malviya et al., "Module Threading Technique to Improve DRAM Power and Performance," D&R Industry Articles, dated Mar. 11, 2011, Copyright 2009. 9 pages.
Masumoto, Rodney T., "Configurable On-Chip RAM Incorporated Into High Speed Logic Array," Proceedings of the IEEE 1985 Custom Integrated Circuits Conference, May 20-23, 1985, pp. 240-243. 6 pages.
Micron Technology, Inc., "256Mb: x32 GDDR3 DRAM, MT44H8M32—2 MEG x 32 x 4 Banks," GDDR3_1.fm—Rev A, Jun. 2003. 68 pages.
Micron Technology, Inc., "Designing for High-Density DDR2 Memory," Technical Note, TN-47-16, Rev. B., Dec. 2009. 10 pages.
Micron Technology, Inc., "DRAM Data Book," Preliminary 1997. 71 pages.
Micron Technology, Inc., "Graphics DDR3 Dram," Advance, 256 Mb x 32 GDDR3 DRAM, © 2003, pp. 1-67. 67 pages.
Micron Technology, Inc., "Micron Synchronous DRAM 128Mb: x32 SDRAM," pp. 1-52, Rev. 9/00. 52 pages.
Micron Technology, Inc., "Synchronous DRAM," Rev. Apr. 1996. 43 pages.
Minutes of Meeting No. 70, JC-42.3 Committee on RAM Memories, Mar. 9, 1994, Orlando, Florida. 41 pages.
Nakamura et al., "FA14.2: A 29ns 64Mb DRAM with Hierarchical Array Architecture," ISSCC, Feb. 1995, pp. 246-247/373. 3 pages.
Nitta et al., "SP23.5: A 1.6GB/s Data-Rate 1Gb Synchronous DRAM with Hierarchical Square-Shaped Memory Block & Distributed Bank Architecture," IEEE ISSCC Digest of Technical Papers, pp. 376-377, 477, Feb. 10, 1996. 3 pages.
Non-Final Office Action dated Mar. 1, 2010 re U.S. Appl. No. 12/392,071. 13 pages.
Notice of Allowance and Fee(s) Due dated Aug. 4, 2011 re U.S. Appl. No. 12/392,071. 22 pages.
Nvidia Corporation, "GeForce3: Lightspeed Memory Architecture," Technical Brief, pp. 1-9. 11 pages.
Office Action dated Jan. 5, 2016 re Japanese Application No. 2014-095678. 9 Pages. (With Translation).
Official Communication with Extended European Search Report for EP Application No. 09167223.8-1233, dated Oct. 6, 2009. 8 pages.
Rambus Inc., "Micro-Threading," dated Apr. 3, 2011, found online at rambus.com/in/.../microthreading.html. 4 pages.
Response dated Jan. 7, 2011 to the Notice of Appeal filed Oct. 7, 2010 re U.S. Appl. No. 12/392,071, Includes Request for Continued Examination. 15 pages.
Response dated May 17, 2011 to the Office Action dated Feb. 17, 2011 re U.S. Appl. No. 12/392,071. 26 pages.
Response to Office Action dated May 5, 2009, dated Oct. 5, 2009, re U.S. Appl. No. 11/767,863, filed Jun. 25, 2007. 20 pages.
Response to the Official Communication dated Jan. 31, 2012 (Summons to Attend Oral Proceedings), dated Aug. 28, 2012 in EP Application No. 09167223.8. 55 pages.
Saeki et al., "SP 23.4: A 2.5 ns Clock Access 250MHz 256Mb SDRAM with a Synchronous Mirror Delay," IEEE ISSCC Digest of Technical Papers, pp. 374-375, 476, Feb. 10, 1996. 3 pages.
Sakata et al., "Two-Dimensional Power-Line Selection Scheme for Low Subthreshold-Current Multi-Gigabit DRAM's," IEEE Journal of Solid State Circuits, vol. 29, No. 8, Aug. 1994, pp. 887-893. 9 pages.
Samsung Electronics, "SDRAM Device Operations," 1999. 42 pages.
Satoh et al., "A 209K-Transistor ECL Gate Array with RAM," IEEE Journal of Solid-State Circuits, vol. 24, No. 5, Oct. 1989, pp. 1275-1281. 7 pages.
Schuette, Michael, "Rambus/Kingston Threaded DDR3 Modules," dated Oct. 8, 2009, last updated Oct. 24, 2009. 8 pages.
Standards Information Network, IEEE Press, "The Authoritative Dictionary of IEEE Standards Terms," Copyright 2000, IEEE 100, Seventh Edition, p. 252. 2 pages.
Sugibayashi et al., "A 30-ns 256-Mb DRAM with a Multidivided Array Structure," IEEE, Nov. 1993, pp. 1092-1098, vol. 28, No. 11. 8 pages.
Sugibayashi et al., "WP3.5: A 30ns 256Mb DRAM with Multi-Divided Array Structure," ISSCC Feb. 1993, pp. 50-51/262. 3 pages.
Takase et al., "A 1.6-Gbyte/s DRAM with Flexible Mapping Redundancy Technique and Additional Refresh Scheme," IEEE Journal of Solid-State Circuits, vol. 34, No. 11, Nov. 1999, pp. 1600-1606. 7 pages.
Takase et al., "WP 24.1 A 1.6GB/S DRAM with Flexible Mapping Redundancy Technique and Additional Refresh Scheme," ISSCC99/ Session 24/Paper, Toshiba Corp., WP 24.1, Feb. 17, 1999. 2 pages.
Takase et al., "WP 24.1: A 1.6GB/s DRAM with Flexible Mapping Redundancy Technique and Additional Refresh Scheme," IEEE International Solid-State Circuits Conference, 1999. 8 pages.
Ware et al., "Micro-threaded Row and Column Operations in a DRAM Core," Rambus White Paper, Mar. 2005. 7 pages.
Ware et al., U.S. Appl. No. 12/391,873, filed Feb. 24, 2009, re Notice of Allowance and Fee(s) Due dated Aug. 31, 2010. 10 pages.
Ware et al., U.S. Appl. No. 12/391,873, filed Feb. 24, 2009, re Notice of Allowance and Fee(s) Due dated Nov. 3, 2010. 11 pages.
Ware et al., U.S. Appl. No. 13/019,785, filed Feb. 2, 2011, re Notice of Allowance and Fee(s) Due dated Jun. 29, 2011. 14 pages.
Ware, Frederick A., "Direct RDRAM 256/288-Mbit (512Kx16/18x32s) Data Sheet," Preliminary Information, Rambus Inc., Document DL0060 Version 0.90, 1999, pp. 1-66. 66 pages.
Ware, Frederick, U.S. Appl. No. 10/998,402, filed Nov. 29, 2004, re Amendment mailed Jan. 11, 2011. 10 pages.

(56) References Cited

OTHER PUBLICATIONS

Ware, Frederick, U.S. Appl. No. 10/998,402, filed Nov. 29, 2004, re Amendment/Response to Office Action submitted Aug. 4, 2011. 12 pages.
Ware, Frederick, U.S. Appl. No. 10/998,402, filed Nov. 29, 2004, re Appeal Brief mailed Apr. 6, 2010. 28 pages.
Ware, Frederick, U.S. Appl. No. 10/998,402, filed Nov. 29, 2004, re Corrected Response submitted Feb. 22, 2012 to the Office Action of Nov. 23, 2011. 17 pages.
Ware, Frederick, U.S. Appl. No. 10/998,402, filed Nov. 29, 2004, re Final Office Action dated Nov. 23, 2011. 33 pages.
Ware, Frederick, U.S. Appl. No. 10/998,402, filed Nov. 29, 2004, re Office Action dated Feb. 8, 2011. 3 pages.
Ware, Frederick, U.S. Appl. No. 10/998,402, filed Nov. 29, 2004, re Office Action dated Jul. 9, 2010. 17 pages.
Ware, Frederick, U.S. Appl. No. 10/998,402, filed Nov. 29, 2004, re Office Action dated Mar. 11, 2011. 37 pages.
Ware, Frederick, U.S. Appl. No. 10/998,402, filed Nov. 29, 2004, re Office Action dated Mar. 21, 2012. 36 pages.
Ware, Frederick, U.S. Appl. No. 10/998,402, filed Nov. 29, 2004, re Response submitted Feb. 22, 2012 to the Office Action dated Nov. 23, 2011, Includes Request for Continued Examination. 21 pages.
Ware, Frederick, U.S. Appl. No. 11/767,863, filed Jun. 25, 2007, re Final Office Action dated Mar. 1, 2010. 17 pages.
Ware, Frederick, U.S. Appl. No. 11/767,863, filed Jun. 25, 2007, re Final Office Action dated Nov. 25, 2011. 30 pages.
Ware, Frederick, U.S. Appl. No. 11/767,863, filed Jun. 25, 2007, re Notice of Appeal from the Examiner to the Board of Patent Appeals and Interferences dated Jul. 30, 2010. 1 page.
Ware, Frederick, U.S. Appl. No. 11/767,863, filed Jun. 25, 2007, re Office Action dated Apr. 7, 2010. 3 pages.
Ware, Frederick, U.S. Appl. No. 11/767,863, filed Jun. 25, 2007, re Office Action dated Mar. 10, 2011. 23 pages.
Ware, Frederick, U.S. Appl. No. 11/767,863, filed Jun. 25, 2007, re Office Action dated Mar. 22, 2012. 34 pages.
Ware, Frederick, U.S. Appl. No. 11/767,863, filed Jun. 25, 2007, re Response to Notice of Appeal submitted Dec. 24, 2010. 18 pages.
Ware, Frederick, U.S. Appl. No. 11/767,863, filed Jun. 25, 2007, re Response to Office Action dated Mar. 10, 2011. 15 pages.
Ware, Frederick, U.S. Appl. No. 11/767,863, filed Jun. 25, 2007, re Response After Final Office Action dated Mar. 24, 2010. 15 pages.
Ware, Frederick, U.S. Appl. No. 13/239,846, filed Nov. 15, 2011, re Preliminary Amendment submitted Nov. 16, 2011, Includes Terminal Disclaimer(s). 19 pages.
Ware, Frederick, U.S. Appl. No. 13/239,846, filed Sep. 22, 2011, re Corrected Notice of Allowability dated Jan. 17, 2012. 5 pages.
Ware, Frederick, U.S. Appl. No. 13/239,846, filed Sep. 22, 2011, re Notice of Allowance and Fee(s) Due dated Dec. 6, 2011. 47 pages.
Yamashita et al., "FA 15.2: A 3.84 GIPS Integrated Memory Array Processor LSI with 64 Processing Elements and 2-MB SRAM," IEEE International Solid-State Circuit Conference, pp. 260-261, Feb. 1994. 3 pages.
Yoo et al., "17.7: A 1.8V 700Mb/s/pin 512Mb DDR-II SDRAM with On-Die Termination and Off-Chip Driver Calibration", ISSCC, Feb. 2003, pp. 312-313, 495, 250-251, 535. 6 pages.
Yoo et al., "A 150 MHZ 8-Banks 256M Synchronous DRAM with Wave Pipelining Methods," IEEE ISSCC, Digest of Technical Papers, pp. 250-251, 374, Feb. 17, 1995. 3 pages.
Yoo et al., "SP23.6 A 32-Bank 1Gb DRAM with 1GB/S Bandwidth," ISSCC, Feb. 1996, pp. 378-379/477. 3 pages.
Yoon et al., "A 2.5V 333Mb/pin 1Gb Double Data Rate SDRAM," ISSCC Digest of Technical Papers, Feb. 17, 1999. 11 pages.
Zhao et al., "TA 11.6: An 18Mb, 12.3GB/s CMOS Pipeline-Burst Cache SRAM with 1.54Gb/pin," IEEE International Solid-State Circuits Conference, 1999. 10 pages.
Zheng et al., "Decoupled DIMM: Building High-Bandwidth Memory System Using Low-Speed DRAM Devices," ISCA '09, dated Jun. 20-24, 2009. 12 pages.

* cited by examiner

100

FIG. 18
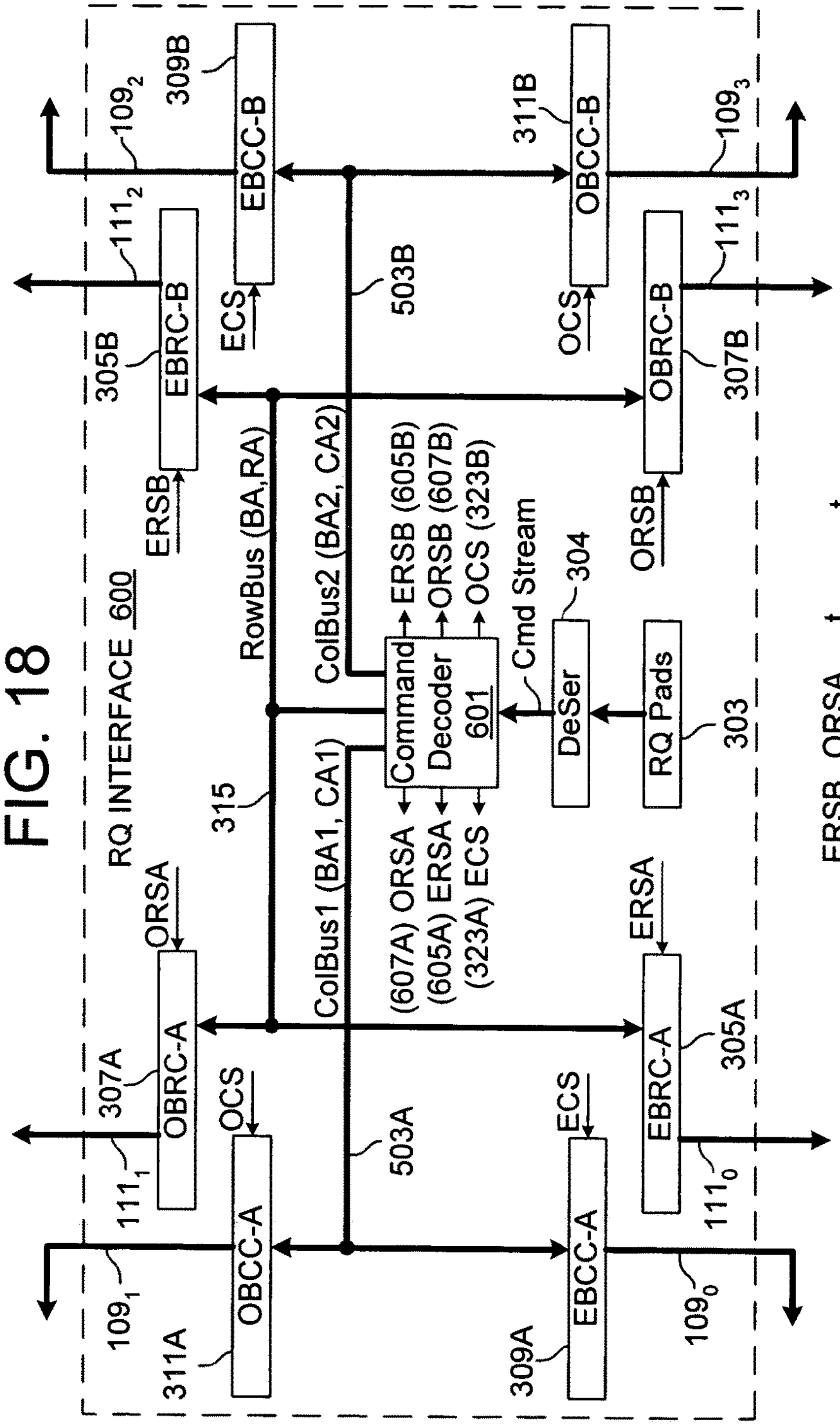
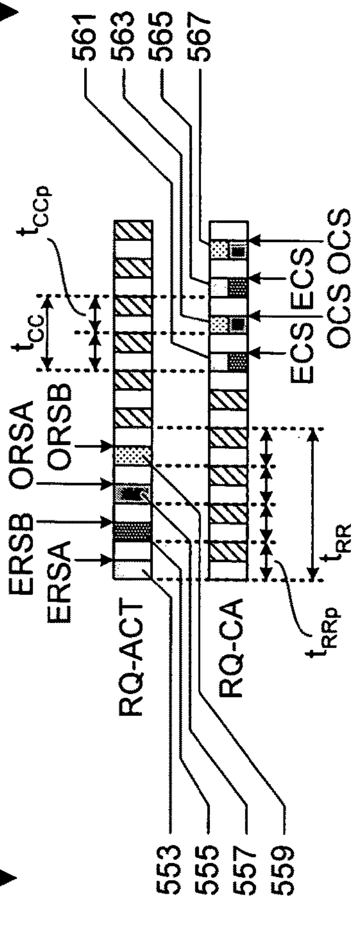
FIG. 19

ST MODE ROW REQ

| | Even | Odd |
|---|---|---|
| RQ11 | OP | OP |
| RQ10 | OP | R8 |
| RQ9 | R9 | R7 |
| RQ8 | R10 | R6 |
| RQ7 | rsrv | R5 |
| RQ6 | rsrv | R4 |
| RQ5 | rsrv | R3 |
| RQ4 | rsrv | R2 |
| RQ3 | rsrv | R1 |
| RQ2 | BA2 | R0 |
| RQ1 | BA1 | rsrv |
| RQ0 | BA0 | rsrv |

FIG. 20A

MT MODE ROW REQ

| | Even | Odd |
|---|---|---|
| RQ11 | OP | OP |
| RQ10 | OP | R8 |
| RQ9 | R9 | R7 |
| RQ8 | R10 | R6 |
| RQ7 | rsrv | R5 |
| RQ6 | rsrv | R4 |
| RQ5 | rsrv | R3 |
| RQ4 | rsrv | R2 |
| RQ3 | BA3 | R1 |
| RQ2 | BA2 | R0 |
| RQ1 | BA1 | rsrv |
| RQ0 | BA0 | rsrv |

FIG. 20B

ST MODE COL REQ

| | Even | Odd |
|---|---|---|
| RQ11 | OP | rsrv |
| RQ10 | OP | rsrv |
| RQ9 | OP | rsrv |
| RQ8 | OP | rsrv |
| RQ7 | OP | C7 |
| RQ6 | C8 | C6 |
| RQ5 | C9 | C5 |
| RQ4 | rsrv | C4 |
| RQ3 | rsrv | rsrv |
| RQ2 | BC2 | rsrv |
| RQ1 | BC1 | rsrv |
| RQ0 | BC0 | rsrv |

FIG. 21A

MT MODE COL REQ

| | Even | Odd |
|---|---|---|
| RQ11 | OP | AP |
| RQ10 | OP | Cy9 |
| RQ9 | OP | Cy8 |
| RQ8 | OP | BCy0 |
| RQ7 | OP | Cx7 |
| RQ6 | Cx8 | Cx6 |
| RQ5 | Cx9 | Cx5 |
| RQ4 | BCy2 | Cx4 |
| RQ3 | BCy1 | Cy7 |
| RQ2 | BCx2 | Cy6 |
| RQ1 | BCx1 | Cy5 |
| RQ0 | BCx0 | Cy4 |

FIG. 21B

MEMORY CONTROLLER FOR MICRO-THREADED MEMORY OPERATIONS

CROSS-REFERENCE TO RELATED APPLICATIONS

This application is a continuation of U.S. patent application Ser. No. 15/486,068, filed on Apr. 12, 2017 for "Micro-Threaded Memory" on behalf of inventors Frederick A. Ware, Craig E. Hampel, Wayne S. Richardson, Chad A. Bellows and Lawrence Lai, which in turn is a continuation of U.S. patent application Ser. No. 14/449,610, filed on Aug. 1, 2014 for "Micro-Threaded Memory" on behalf of inventors Frederick A. Ware, Craig E. Hampel, Wayne S. Richardson, Chad A. Bellows and Lawrence Lai (now U.S. Pat. No. 9,652,176), which in turn is a continuation of U.S. patent application Ser. No. 13/901,014, filed on May 23, 2013 for "Micro-Threaded Memory" on behalf of inventors Frederick A. Ware, Craig E. Hampel, Wayne S. Richardson, Chad A. Bellows and Lawrence Lai (now U.S. Pat. No. 9,292,223), which in turn is a continuation of U.S. patent application Ser. No. 10/998,402, filed on Nov. 29, 2004 for "Micro-Threaded Memory" on behalf of inventors Frederick A. Ware, Craig E. Hampel, Wayne S. Richardson, Chad A. Bellows and Lawrence Lai (now U.S. Pat. No. 8,595,459). Each aforementioned patent and/or application is hereby incorporated by reference.

FIELD OF THE INVENTION

The present invention relates generally to memory systems and components thereof.

BACKGROUND

Although dynamic random access memory (DRAM) remains the memory of choice for a broad class of computing and consumer electronics applications, DRAM core access times have not scaled with memory bandwidth demand. For example, the minimum time between activation of different storage rows in the same storage bank, $t_{RC}$, remains in the neighborhood of 40 nanoseconds for predominant core technologies; a substantial access time penalty for processors operating at gigahertz frequencies. Other core access times such as the minimum time between activation of rows in different banks of a multi-bank array, $t_{RR}$, and minimum time between column access operations (i.e., read or write operations at a specified column address) in the same row, $t_{CC}$, have also been slow to improve.

Designers have countered core timing limitations through a number of architectural and system-level developments directed at increasing the number of column access operations per row activation (e.g., paging, multi-bank arrays, prefetch operation), and maximizing the amount of data transferred in each column access. In particular, signaling rate advances have enabled progressively larger amounts of data to be transferred per column access, thereby increasing peak memory bandwidth. However, as signaling rates progress deeper into the gigahertz range and the corresponding core access times remain relatively constant, column transaction granularity, the amount of data transferred per column access, is forced to scale upwards and is approaching limits imposed by signal paths within the DRAM itself. Further, the trend in some classes of data processing applications, graphics applications for example, is toward smaller data objects (e.g., triangle fragments of a 3D scene) that are often stored in dispersed memory locations. In such applications, the additional power and resources expended to increase the column transaction granularity may provide only limited increase in effective memory bandwidth as much of the fetched data may not be used.

BRIEF DESCRIPTION OF THE DRAWINGS

The present invention is illustrated by way of example, and not by way of limitation, in the figures of the accompanying drawings and in which like reference numerals refer to similar elements and in which:

FIG. 18 illustrates an embodiment of a request interface that may be included within the memory device of FIG. 16;

FIG. 19 illustrates an exemplary timing of control signal assertions by the request decoder of FIG. 18;

FIGS. 20A and 20B illustrate exemplary row request formats;

FIGS. 21A and 21B illustrate exemplary column request formats;

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). Multi-level signaling in which each transmitted symbol conveys more than one bit of information (i.e., bit rate is greater than baud rate) may also be used. A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express an example, not a preference or requirement.

Figure 1:
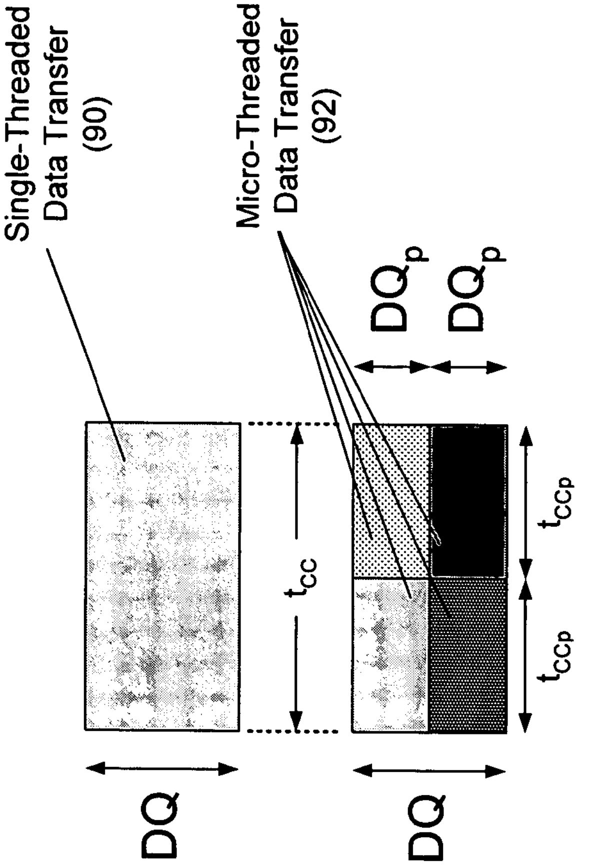
FIG. 1 illustrates partitioning of a data transfer interval and data transfer path to enable reduced column transaction granularity.

In embodiments described herein, the data transfer capacity of a dynamic random access memory (DRAM) device over a given $t_{CC}$ interval, a metric referred to herein as a $t_{CC}$ envelope, is subdivided and allocated to multiple column access transactions, thereby reducing the amount of data transferred in any one transaction, yet maintaining the peak memory bandwidth of the DRAM device. Referring to FIG. 1, for example, instead of following a conventional, single-threaded approach of dedicating each $t_{CC}$ envelope to a single column access transaction as shown at 90, the $t_{CC}$ envelope is partitioned to enable transfer of multiple smaller sets of data in response to multiple micro-threaded column requests as shown at 92. By reducing the column transaction granularity in this manner, the effective bandwidth of the DRAM may be substantially increased over the single-threaded approach as multiple data objects of interest may be specifically addressed in different micro-threaded column access transactions and returned within a given $t_{CC}$ interval, rather than merely a single data object and its potentially superfluous neighboring data.

In one embodiment, the $t_{CC}$ envelope is partitioned temporally into a set of partial $t_{CC}$ intervals ($t_{CCp}$) that are allocated respective micro-threaded column transactions. In another embodiment, the $t_{CC}$ envelope is spatially partitioned, with data path resources between the memory device core and a host device (e.g., a memory controller) being subdivided and allocated to different micro-threaded column transactions. Referring again to FIG. 1, for example, the data links, DQ, that form an external data path between a memory device and memory controller may be partitioned into two or more subsets of data links, $DQ_p$, that are allocated to different micro-threaded column access transactions. In other embodiments, both temporal and spatial partitioning is applied to further reduce the column transaction granularity. In FIG. 1, for example, the $t_{CC}$ envelope is partitioned temporally into two partial $t_{CC}$ intervals, $t_{CCp}$, and spatially into two subsets of data links, DQp, thereby reducing the micro-threaded column transaction granularity to one-fourth of the single-threaded column transaction granularity. The $t_{CC}$ envelope may be subdivided into more or fewer spatial and/or temporal partitions in other embodiments. Also, the multiple micro-threaded column access requests serviced in a partitioned $t_{CC}$ interval may be directed to an open page of the same storage bank, to open pages of different storage banks, or any combination thereof. Also, in one embodiment, more densely pipelined row operations are used to enable sub-banks within a partitioned bank architecture to be separately addressed, in effect, increasing the number of banks within the memory device and enabling each of multiple micro-threaded column accesses, serviced within the same $t_{CC}$ interval, to be directed to an independently selected bank, row and column.

Overview of an Exemplary Micro-Threaded Memory Architecture

Figure 2:
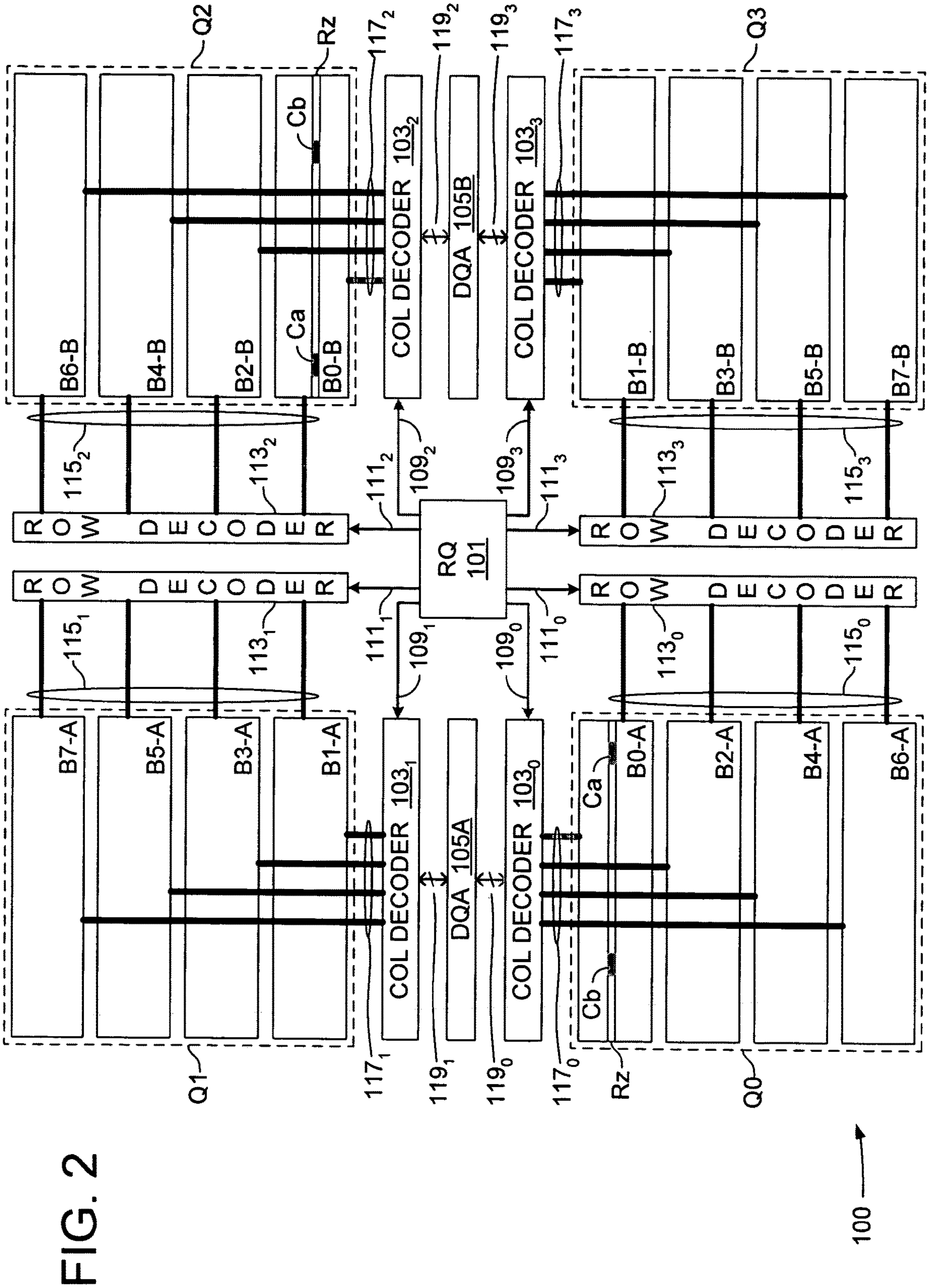
FIG. 2 illustrates an embodiment of a memory device in which micro-threaded column operations may be performed.

FIG. 2 illustrates an embodiment of a memory device 100 in which various types of micro-threaded column operations may be performed. The memory device 100 is assumed, for purposes of description, to be a DRAM device, but may alternately be any type of memory device having multiple storage arrays that share addressing and/or data path resources in a manner that imposes timing constraints on sequential accesses directed to the different storage arrays. Thus, $t_{CC}$ constraints and $t_{RR}$ constraints herein may alternatively be other types of memory access constraints that, together with signaling path bandwidth, define corresponding data transfer envelopes. For example, the $t_{CC}$ envelope partitioning described herein is intended as an instance of more general partitioning of any data transfer envelope defined by an resource-imposed time constraint and signaling path bandwidth. Also, with regard to the timing constraint itself, such constraint may be defined to be a minimum time necessary to avoid resource conflicts within the memory device (e.g., to ensure proper operation), plus an optional tolerance time to account for statistical variation in the time required for circuits and/or signal paths to reach a desired state. A timing constraint may also be enforced or otherwise defined by a timing signal such as a clock signal or strobe signal and thus may be expressed as minimum number of transitions of such timing signal that are to transpire between back-to-back operations in order to avoid resource conflicts within the memory device.

In the particular example shown, the memory device 100 includes a request interface 101, column decoders 103$_0$-103$_3$, row decoders 113$_0$-113$_3$, data path interfaces 105A and 105B and eight storage banks, B0-B7. Each storage bank, B0-B7, is formed by a pair of A and B sub-banks (e.g., sub-banks B0-A and B0-B constitute bank B0, sub-banks B1-A and B1-B constitute bank B1, and so forth), with the sub-banks themselves being organized in four groups of four sub-banks each, referred to herein as quadrants. The four quadrants are designated Q0-Q3 in FIG. 2. In the embodiment of FIG. 2, sub-banks in the same quadrant share a row decoder and column decoder, and are all either A or B sub-banks from either the even bank set or odd bank set. For example, quadrant Q0 includes even-numbered, group A sub-banks (i.e., B0-A, B2-A, B4-A and B6-A) coupled to column decoder 103$_0$ via respective column paths (collectively designated 117$_0$) and to row decoder 113$_0$ via respective sets of word lines (collectively designated 115$_0$). In the remaining quadrants, Q1 includes odd-numbered, group A sub-banks coupled to column decoder 103$_1$ via column paths 117$_1$ and to row decoder 113$_1$ via word lines 115$_1$; Q2 includes even-numbered, group B sub-banks coupled column decoder 103$_2$ via column paths 117$_2$ and to row decoder 113$_2$ via word lines 115$_2$; and Q3 includes odd-numbered, group B sub-banks coupled column decoder 103$_3$ via column paths 117$_3$ and to row decoder 113$_3$ via word lines 115$_3$. While the architecture of memory device 100 is carried forward in descriptions of various memory device embodiments described herein, in all cases such memory devices may have any number of banks, any number of sub-banks per bank, and any number of sub-banks per decoder-sharing group.

When operated as part of a memory system, the request interface 101 of memory device 100 receives a stream of requests (or commands or instructions) from a memory controller or other host device via a request path (not shown), and issues corresponding control and address signals to the row decoders 113 and column decoders 103 to carry out the requested operations. As a matter of terminology, the term "request" is used herein to mean a request, command or instruction issued to the memory device 100 to cause the memory device to take an action specified in the request or by the context in which the request is received. The action taken by the memory device in response to a given request is referred to as an operation, examples of which include row activation operations, column access operations (which may be read or write accesses) and precharge operations. A request and its corresponding operation are referred to collectively herein as a transaction. Also, some transactions may include multiple component requests and operations. In the case of a DRAM device, for example, a complete data access transaction may be specified by a row-activation request, one or more column access requests and a precharge request. A row activation request is directed to a bank and row of the memory device 100 (e.g., specified by bank and row addresses included with the request) and is serviced by enabling the contents of the row to be output onto the bit lines of the bank and thereby transferred into a page buffer (e.g., a storage structure formed by latching sense amplifiers coupled respectively to the bit lines). Column access requests are directed to a bank and column of the memory device 100 (e.g., specified by bank and column addresses included with the request) and are serviced by reading or overwriting data in column-address-specified sub-fields (columns) within the page buffer for the specified bank. After the column accesses directed to an open page (i.e., page buffer content) are completed, a precharge operation may be carried out to precharge the bit lines of the subject bank in preparation for subsequent row activation.

When a row activation request is received, the request interface 101 recovers bank and row address values from the request and forwards the address values via signal paths 111$_1$-111$_3$ to the row decoders 113$_0$-113$_3$ for the bank-address-specified quadrants. In one embodiment, each of the row decoders 113 includes a first stage decoder to select the set of word lines coupled to a bank-address-specified sub-bank, and a second stage decoder to activate a row-address-specified word line within the selected set of word lines, thereby enabling the contents of the cells coupled to the activated word line onto the bit lines of the selected sub-bank. In other embodiments, the bank and row decoding operation may be carried out in more or fewer decoder stages. Also, one or more row address strobe signals may be issued by the request interface 101 or other control logic to control the timing of the word line activation.

When a column access request is received in the memory device 100, the request interface 101 recovers bank and column address values from the request and forwards the address values to the column decoders 103 for the quadrants specified by the bank address. In one embodiment, each of the column decoders 103 includes a bank multiplexer to enable access to the page buffer for a bank-address indicated sub-bank (i.e., via a selected one of column access paths 117), and a column multiplexer to select a column of page buffer storage elements for read or write access. Other circuit arrangements may be used resolve the column access location in alternative embodiments. Also, one or more column address strobe signals may be issued by the request interface 101 or other control logic in the memory device 100 to control the timing of the column access.

After column operations in the open page are completed (e.g., read or write operations carried out in response to corresponding column access requests), a precharge request and associated bank address may be received in the request interface 101 and serviced by deactivating a previously activated word line and precharging the bit lines for the specified bank. After the precharge operation is complete, the specified bank is in condition for another row activation operation.

Still referring to FIG. 2, each of the data path interfaces 105A, 105B is coupled to respective pairs of column decoders 103 via column data paths 119 to enable transfer of read and write data between the column decoders and an external data path (not shown). More specifically, data path interface 105A enables data transfer between a first portion of the external data path and selected sense amplifiers within a page buffer (i.e., selected by column decoder $103_0$ and $103_1$) via column data paths $119_0$ and $119_1$, and data path interface 105B enables data transfer between a second portion of the external data path and selected sense amplifiers within a page buffer (i.e., selected by column decoders $103_2$ and $103_3$) via column data paths $119_2$ and $119_3$.

Figure 3:
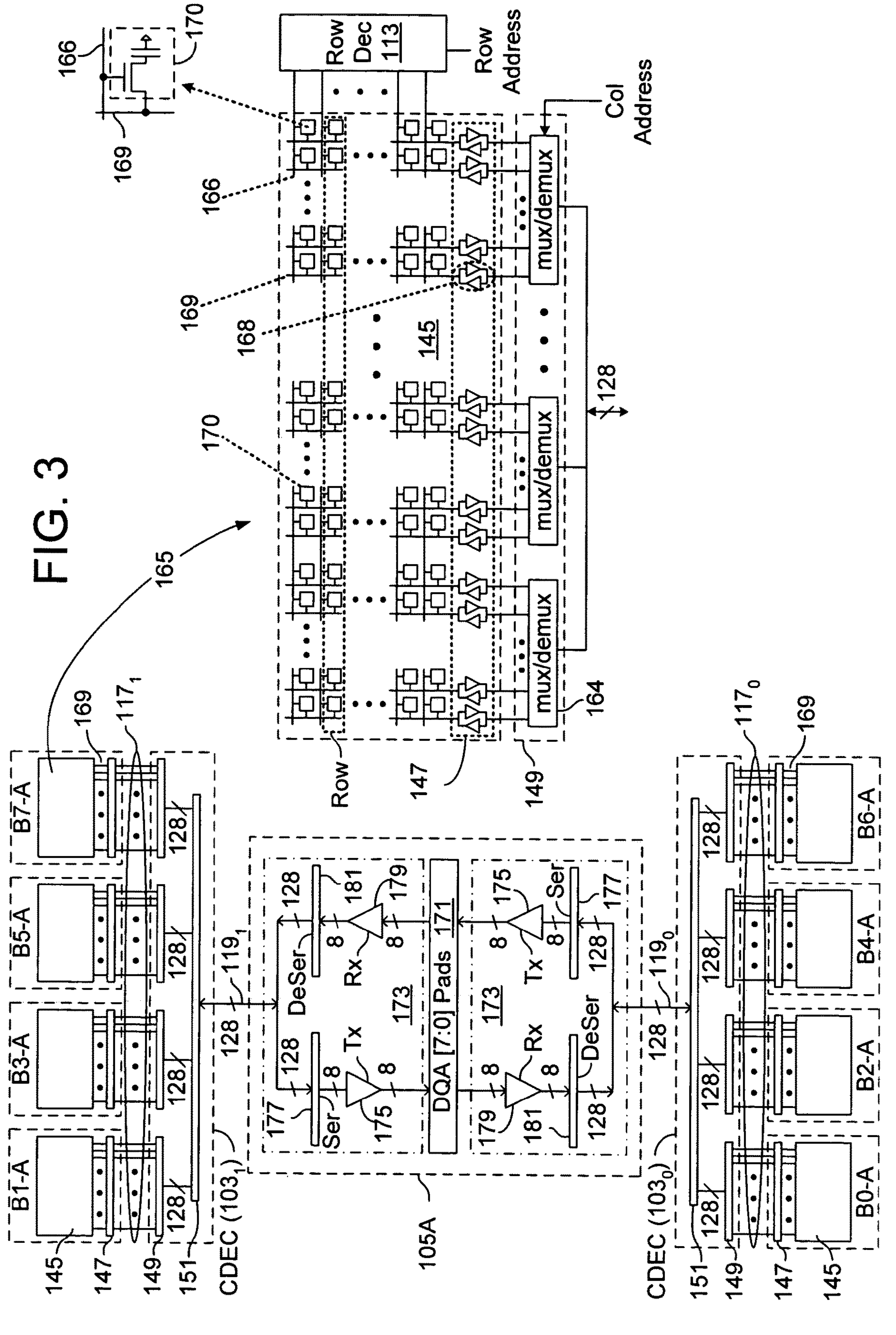
FIG. 3 illustrates more detailed embodiments of sub-banks, column decoders, and data interfaces that may be used within the memory device of FIG. 2.

FIG. 3 illustrates more detailed embodiments of the Q0 and Q1 sub-banks (i.e., sub-banks B0-A through B7-A), column decoders $103_0/103_1$, and data interface 105A that may be used within the memory device 100 of FIG. 2. The Q2 and Q3 sub-banks, column decoders $103_2/103_3$ and data interface 105B may be implemented in embodiments similar or identical to those depicted in FIG. 3 and therefore are not separately described.

In the embodiment of FIG. 3, each of the sub-banks B0-A to B7-A includes a storage array 145 and page buffer 147 coupled to one another via bit lines 169. Referring to detail view 165, the storage array 145 is formed by memory cells 170 arranged in rows and columns. Each column of memory cells 170 is coupled via a bit line 169 to a respective sense amplifier 168 within page buffer 147, and each row of memory cells is coupled via a word line 166 to a row decoder 113 (or component thereof). In the particular embodiment shown, each memory cell 170 is a DRAM memory cell formed by a transistor switch (e.g., having a drain coupled to bit line 169 and a gate coupled to word line 166) and a capacitive storage element coupled between the source of the transistor switch and a cell plate reference or other reference node. Memory cells of other types and configurations may be used in alternative embodiments. As discussed above, during a row activation operation, a word line is activated, and contents of the storage cells 170 coupled to the word line (i.e., the word-line selected row) are enabled onto the bit lines 169 and thereby transferred to the page buffer 147. During a precharge operation, the open page (i.e., content of the page buffer) is closed and the bit lines 169 precharged in preparation for activation of another row. Refresh operations may be performed in rows of a given sub-bank or set of sub-banks through combinations of activation and precharge operations.

As discussed above, the column decoders $103_0$ and $103_1$ enable column operations (i.e., read or write operations) directed to open pages within the sub-banks of quadrants Q0 and Q1, respectively. In the embodiment of FIG. 3, each of the column decoders $103_0$, $103_1$ includes a set of four column multiplexers 149, one for each sub-bank of the corresponding quadrant, and a bank multiplexer 151. The bank multiplexer 151 enables access to (i.e., selects) one of the column multiplexers 149 in response to a bank address, or at least the most significant bits (MSBs) or other subset of bits within the bank address. Referring to detail view 165, the selected column multiplexer 149 includes a set of multiplexer/demultiplexer circuits 164 that each enable read or write access to a respective column-address-selected column of storage elements within the page buffer 147 (column, for short); an operation referred to herein as a column access. In the case of a write operation, the bank multiplexer 151 and column multiplexer 149 perform demultiplexing functions, routing data from the data path interface 105A to the selected column. In a read operation, the bank multiplexer 151 and column multiplexer 149 perform a multiplexing function by routing data from the selected column to the data interface 105A. Note that the bank multiplexer 151 and column multiplexers 149 may be interchanged in an alternative embodiment, so that the bank multiplexer 151 is coupled to the sub-bank bit lines 169 and a single column multiplexer is coupled between the output of the bank multiplexer 151 and the data path interface 105A.

In the embodiment of FIG. 3, the data path interface 105A includes a pair of serdes transceivers 173 (i.e., serializing/deserializing transceivers that perform a parallel-to-serial conversion of outgoing data and a serial-to-parallel conversion of incoming data) each coupled between an external data path interface 171 and a respective one of column decoders $103_0$ and $103_1$. Each serdes transceiver 173 includes a data serializer 177, transmitter 175, data deserializer 181 and receiver 179. In a read operation, the data serializer 177 performs a multiplexing function by receiving a 128-bit read data value (i.e., column data) from the column decoder 103 via column data path 119 and delivering the read data to the transmitter 175 in the form of a sixteen byte stream. The transmitter 175, in turn, transmits each byte via the external data path interface 171 in successive data transmission intervals. The receiver 179 and data deserializer 181 perform the inverse functions of the data serializer 177 and transmitter 175. That is, the receiver 179 samples signals arriving via the external data path interface 171 during successive data reception intervals to deliver a stream of sixteen bytes to the data deserializer 181. The data deserializer 181 performs a demultiplexing function by gathering the incoming stream of bytes into a 128-bit data write data value to be delivered to the corresponding column decoder 103 via column data path 119. Although an 8-bit external data path interface 171 and a 128-bit column data path 119 are shown, different path widths may be used in alternative embodiments. In alternative embodiments in which data multiplexing/demultiplexing is unnecessary (e.g., external data path width matches the column data size of the memory device), the data serializer 177 and/or data deserializer 181 may be omitted.

Still referring to FIG. 3, the transmitters 175 may be, for example, current-mode or voltage-mode output drivers for generating output waveforms having virtually any amplitude and any type of modulation. Also, the transmitters 175 may generate multi-bit symbols (i.e., bit rate greater than baud rate), perform various encoding operations (e.g., 8b/10b) and/or add error checking information into the outgoing bitstream (e.g., parity bits, error-code correction (ECC) bits, checksum, cyclic-redundancy check values, etc.). The receivers 179, similarly, may be designed to sample current-mode or voltage-mode transmissions modulated in any manner, with each sample being resolved into one or more bits according to the number of bits conveyed in each transmitted symbol. The receiver may additionally perform decoding operations and error checking operations. Further, both the transmitter and receiver may be switched between different operating modes and/or frequencies, for example, operating on multi-bit symbols in one mode and single-bit symbols in another mode.

The signaling links that constitute the external data path may be point-to-point or multi-drop, differential or single-ended, and may be used to carry synchronous or asynchronous transmissions. The data path interface 105A, accordingly, may be a synchronous or asynchronous signaling interface. In the case of synchronous transmissions, the transmitted data signals may be self-timed (e.g., carrying clocking information within the data waveform) or accompanied by timing signals such as one or more clock signals, strobe signals or the like. In the case of self-timed transmissions, encoding circuitry may be provided in the transmitter 175 to encode each outgoing bit stream (i.e., the stream transmitted on any single link of the external data path interface in synchronism with one or more transmit clock signals) to ensure sufficient transition density for clock recovery (e.g., 8b/10b encoding), and corresponding clock-data recovery circuitry and decoding circuitry may be provided in the receiver 179 to recover clocking information and the un-encoded transmitted data. Such clocking information, whether received in the form of external timing signals (e.g., clock or strobe signals) or recovered from the incoming bit stream, may be used to control the phase of one or more sampling clock signals that are supplied to the receiver 179 to trigger sampling of the incoming data signals.

Single-Threaded Mode

Figure 4:
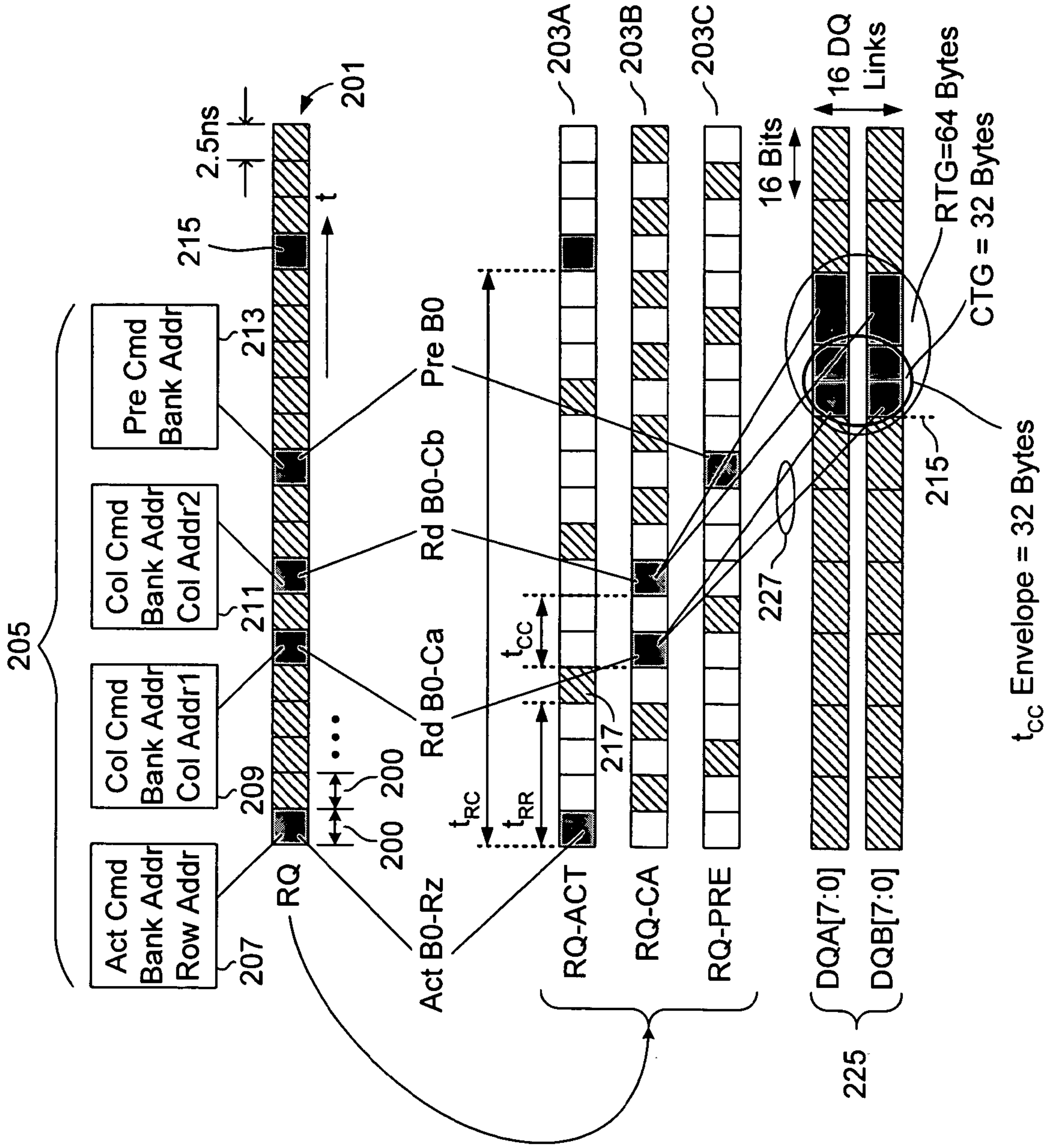
FIG. 4 illustrates a single-threaded mode of operation within the memory device 100 of FIG. 2.

FIG. 4 illustrates a single-threaded mode of operation within the memory device 100 of FIG. 2 and is provided, in part, for contrast with later micro-threaded operating modes described below. Referring to request path 201 (RQ), a pipelined stream of requests is received over a series of request intervals 200, with gray shaded blocks indicating requests that form part of a multi-access read transaction 205 directed to a selected bank. The striped blocks represent requests directed to other banks. In the exemplary embodiment shown, the request path is operated at a legacy signaling rate (i.e., lower than maximum supported signaling rate) of 0.8 Gigabits per second (Gb/s) per link. Each command is transferred over a pair of transmit intervals, thereby establishing a 2.5 ns request interval. In alternative embodiments, higher or lower signaling rates may be used, and each request may be conveyed in more or fewer transmit intervals.

The request path 201 is shown as a set of logical pipelines 203A, 203B and 203C to help visualize the relative timing of different types of requests included in the multi-access read transaction 205. Pipeline 203A is referred to herein as the activation pipeline (RQ-ACT) and carries row activation requests (e.g., 207), each including a row activation command specifier together with bank and row address values to identify the specific row to be activated. Pipeline 203B is referred to herein as the column access pipeline (RQ-CA) and carries column access requests (e.g., 209), each including a column access command specifier, specifying either a read or write access, together with bank and column address values to identify the bank and column to be accessed. Pipeline 203C is referred to herein as the precharge pipeline and carries precharge requests (e.g., 213) each including a precharge command specifier and bank address to indicate the bank to be precharged.

The multi-access read transaction is initiated when a row activation request 207 directed to row 'z' of bank B0 (B0-Rz) is received. The memory device responds to the row activation request by issuing the bank address and row address to the row decoders for bank B0 (i.e., row decoders 113$_0$ and 113$_2$). In the particular embodiment shown, the minimum time between row activations in the same bank, $t_{RC}$, is assumed to be 40 ns so that another row activation request directed to bank B0 is not received until sixteen request intervals later, as shown at 215. Also, the minimum time between row activations in arbitrarily different banks, $t_{RR}$, is assumed to be 10 ns, so that another row activation request 217 is not received until four request intervals later.

The first column access request 209 of two column access requests that form part of the multi-access read transaction 205 is received a predetermined time after the activation request 207 (five request intervals later in this example) and specifies a read at column 'a' of the B0 open page (B0-Ca). As the minimum time between accesses to the same open page, $t_{CC}$, is assumed to be 5 ns in this example, and the memory device is operating in single-threaded mode, the second of the two column access requests, 211, is received two request intervals after receipt of the first column access request (i.e., a $t_{CC}$ interval later), and specifies a read at a different column, column 'b', of the B0 open page (B0-Cb). Referring briefly to FIG. 2, the request interface 201 responds to the first column access request 209 by delivering bank and column address values via shaded column address paths 109$_0$ and 109$_2$ to the even bank column decoders 103$_0$ and 103$_2$ which, in turn, retrieve data from column 'a' of the B0-A and B0-B sub-banks as shown. The retrieved column 'a' data is then delivered to the data interface via the shaded column data paths 119$_0$ and 119$_2$. The request interface 201 similarly responds to the second column access request 211 by delivering bank and column address values to the even bank column decoders 203$_0$ and 203$_2$ which then retrieve data from column 'b' of the B0-A and B0-B sub-banks and output the data to the data path interfaces 105A and 105B.

Returning to FIG. 4, the column data retrieved in response to the first column access request 209 is output onto external DQA and DQB signal paths 225 in a data transfer operation that begins, a predetermined time after receipt of the column access request 209. The correspondence between the column access request 209 and outgoing (or incoming) column data is illustrated by lead lines 227 extending from the column access request (i.e., in pipeline 203B) to a like-shaded data transfer over signal paths 225; a notation used in FIG. 4 and other figures described below. In this single-threaded example, column data is transferred in response to the first column access request over the $t_{CC}$ interval starting at 215. More specifically, column 'a' data is output from sub-bank B0-A over the DQA links (eight links in this example, though more or fewer links may be provided in alternative embodiments), and column 'a' data is output from sub-bank data B0-B over the DQB links, the transfer of column 'a' data from the two B0 sub-banks thus consuming the entire $t_{CC}$ envelope as shown. As discussed above, the $t_{CC}$ envelope is a product of the signaling bandwidth and $t_{CC}$ interval so that, given a 5 ns $t_{CC}$ interval (a value assumed throughout the following description, though virtually any memory core technology having the same or different $t_{CC}$ constraint may be used) and assuming a 3.2 Gb/s signaling rate in each of the 16 DQ links, the $t_{CC}$ envelope is 32 bytes (i.e., [16 links*3.2 Gb/s/link]*5 ns=256 bits=32 bytes). In the single-threaded example shown, each column access request is serviced per $t_{CC}$ interval so that the column transaction granularity, CTG, is also 32 bytes. Thus, the column transaction granularity is coextensive with the $t_{CC}$ envelope.

The column 'b' data retrieved in response to the second column access request 211 is output onto the DQA and DQB signal paths over a $t_{CC}$ interval that begins at the conclusion of the column 'a' data transfer operation. Thus, like the column 'a' transaction that precedes it, the column 'b' transaction consumes the entire $t_{CC}$ envelope and therefore has a column transaction granularity of 32 bytes.

Still referring to FIG. 4, a precharge request 213 is received a predetermined time after the second column access request 211 (three request intervals in this example) and includes a precharge command specifier (Pre Cmd) and bank address that indicates the bank to be precharged; B0 in this case. The request interface executes the requested precharge operation a predetermined time later (e.g., after the column 'b' data has been retrieved from the B0-A/B0-B page buffers) by issuing a disable signal to the row decoders for bank B0, and issuing a precharge-enable signal to the page buffers of sub-banks B0-A and B0-B to precharge the sub-bank bit lines. The precharge operation thus closes the page opened in response to the row activation request 207 and therefore concludes the multi-access read transaction 205. Because each of the two column access operations yielded 32 byte transfers, the row transaction granularity (i.e., amount of data transferred for a given row activation, RTG) is 64 bytes. More or fewer column access transactions may be performed for a given row activation in alternative embodiments, yielding correspondingly increased or decreased row transaction granularity.

Assuming that a steady stream of row activation requests and corresponding column access request pairs and precharge requests are received via the request path 201, the request path 201 may remain fully loaded (i.e., no unused request intervals) and the data path 225, similarly, may be fully consumed with the requested data transfers, each having 32-byte column transaction granularities and 64-byte row transaction granularities. When the signaling rate on the data path 225 is increased to the full rate of the memory device, however, the row and column transaction granularities also increase. For example, in one embodiment, the full signaling rate supported by the data path interface 105 of the FIG. 2 memory device is 6.4 Gb/s (other signaling rates may be supported in alternative embodiments). Because the $t_{CC}$ interval of the memory device remains unchanged, the $t_{CC}$ envelope is doubled to 64 bytes and, if the single-threaded approach were followed, the column transaction granularity and row transaction granularity would also double to 64 bytes and 128 bytes, respectively. To support the increased column transaction granularity, a number of signal paths within the column decoders and data path interface may need to be increased. Referring to FIGS. 2 and 3, for example, because the 64 byte column transaction granularity corresponds to a 256-bit (32 byte) column access in each of the sub-banks, each of the 128-bit signal paths within the column decoders 103 (i.e., between the column multiplexer 149 and bank multiplexer 151) and the data path interfaces 105A, 105B would expand to 256-bit signal paths to support the increased data transfer rate. While potentially realizable, such increased path widths result in increased manufacturing cost and power consumption (i.e., the path widths being increased in each sub-bank and data interface of the memory device) and the headroom available headroom for such increases is shrinking. Also, as discussed above, in applications that tend to access small, dispersed data objects, only a small portion of the data returned in a given column access may be useful. For example, a common triangle size in modern graphics applications is six bytes and, due to rendering order, successively rendered triangles are often unlikely to be acquired in the same column access. In such applications, doubling the column transaction granularity from 32 bytes to 64 bytes may provide little improvement in effective bandwidth.

Figure 5:
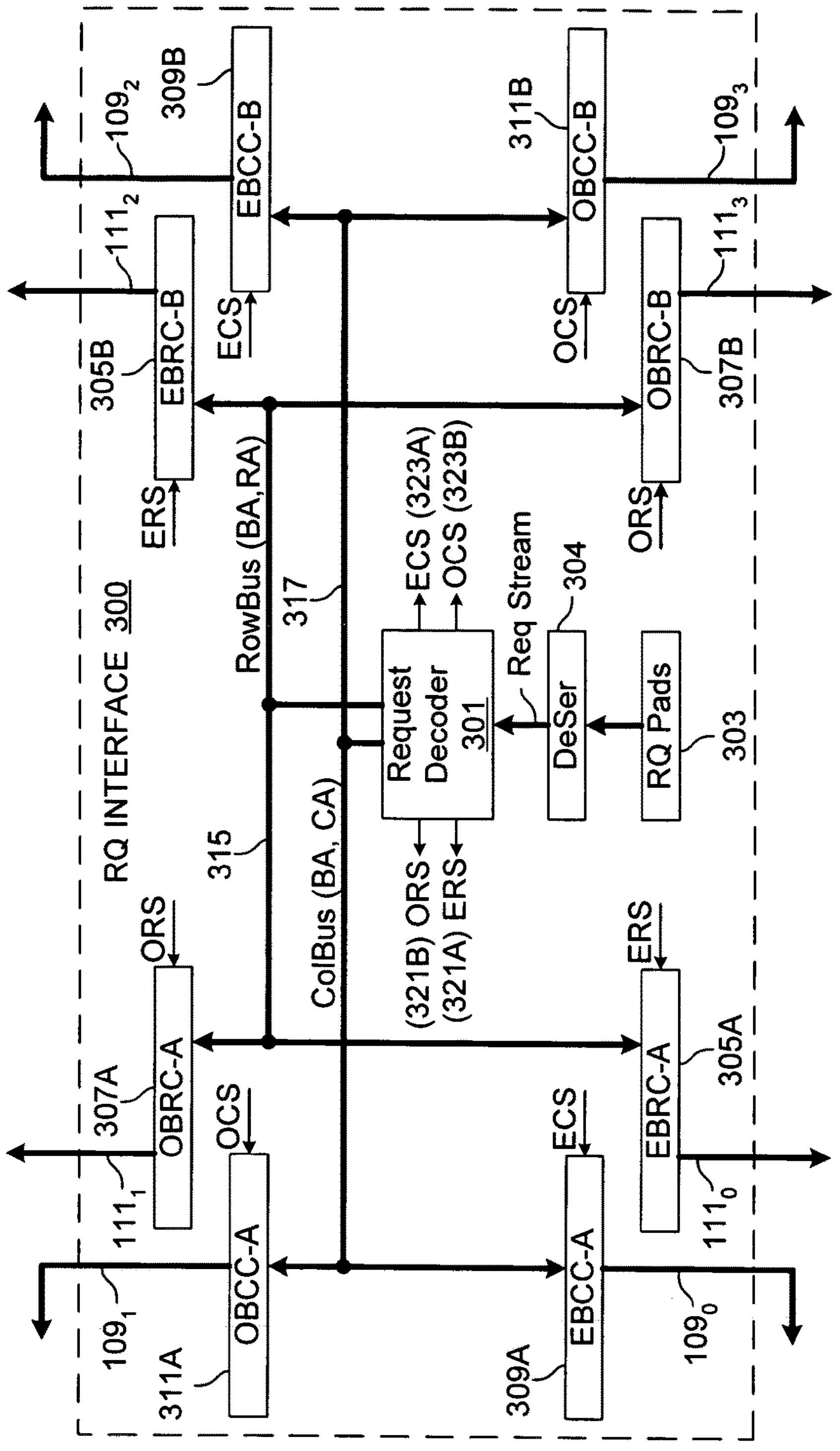
FIG. 5 illustrates an embodiment of a request interface that may be used within the memory device of FIG. 2 to enable single-threaded and micro-threaded memory transactions.

FIG. 5 illustrates a request interface that may be used to support a single-threaded mode of operation within the memory device as well as micro-threaded modes of operation discussed below. The request interface 300 includes a request decoder 301, even-bank row control registers 305A, 305B (EBRC), odd-bank row control registers 307A, 307B (OBRC), even-bank column control registers 309A, 309B (EBCC) and odd-bank column control registers 311A, 3116 (OBCC). The even- and odd-bank row control registers 305, 307 are coupled to the request decoder 301 via a row bus 315, and the even- and odd-bank column control registers 309, 311 are coupled to the request decoder 301 via a column bus 317.

In one embodiment, incoming symbol streams received via request pads 303 (i.e., from an external request path) are deserialized in an optional request deserializer 304 to deliver a corresponding stream of n-bit wide requests to the request decoder 301. (Note that, while pads are referred to in a number of embodiments herein, in all such cases, capacitive-coupling nodes or any other interface to an external signaling path may be used.) The incoming requests may include virtually any type of requests including, without limitation, the row activation requests, column access requests and precharge requests discussed above, as well as other requests used, for example, to initiate refresh operations within one or more storage banks, program operating modes within the memory device (e.g., selecting between single-threaded mode and one or more of a number of different micro-threaded modes; and selecting between a number of different refresh modes, power modes, precharge modes, etc.), initiate signaling calibration and/or training operations, initiate self-tests and so forth.

The request decoder 301, which may be implemented by one or more state machines, microsequencers and/or other control circuitry, decodes each incoming request (e.g., by parsing a command specifier field or operation code field to identify the request) and issues various signals necessary to carry out the requested operation. For example, upon decoding a row activation request having the bank address and row address fields shown in request 207 of FIG. 4, the request decoder 301 may output the row address and bank address onto the row bus 315 along with a control value that indicates an activation operation and then, depending on whether the activation request is directed to an even or odd bank (e.g., determined by inspection of the least significant bit (LSB) or other bit or bits of the bank address), assert an even-row strobe signal 321A (ERS) or odd-row strobe signal 321B (ORS) to load the address and control values from the row bus 315 into the even-bank row control registers 305A, 305B or odd-bank row control registers 307A, 307B. Address and control values loaded into even-bank row control registers 305 are supplied to the even-bank row decoders for the group A and group B sub-banks (i.e., row decoders $\mathbf{113}_0$ and $\mathbf{113}_2$ of FIG. 2) via signal paths $\mathbf{111}_0$ and $\mathbf{111}_2$, respectively, and address and control values loaded into odd-bank row control registers 307 are supplied to the odd-bank row decoders for the group A and group B sub-banks via signal paths $\mathbf{111}_1$ and $\mathbf{111}_3$. In one embodiment, the delivery of address and control values via paths 111 initiates the indicated row operation (e.g., activation or precharge) within the corresponding row decoder so that row operations are effectively initiated in response to assertion of the even-row strobe signal 321A and odd row strobe signal 321B (i.e., when the corresponding registers 305 and 307 are updated). In alternative embodiments, the even-row strobe signal 321A and odd-row strobe signal 321B (or other control signals derived therefrom or independently generated) may be output to the row decoders to initiate row operations therein.

In one embodiment, the request decoder 301 responds to incoming column access requests in substantially the same manner as row activation requests, except that bank address and column address values included with the requests are output onto the column address bus 317 together with a control value that indicates, for example, whether a read or write operation is to be performed. Thereafter, the request decoder 301 asserts either an even-column strobe signal 323A (ECS) or odd-column strobe signal 323B (OCS) to load the address and control values from the column address bus 317 into either the even-bank column control registers 309A, 309B or odd-bank column control registers 311A, 311B, thereby initiating the specified column access operation in the corresponding column decoder (i.e., the contents of the column control registers 309 and 311 are output to corresponding column decoders via paths 109 to initiate column access operations therein). As with row requests, the request decoder 301 may inspect one or more bits of the bank address to determine whether a given column access request is directed to an odd or even bank and assert either the even-column strobe signal 323A or odd-column strobe signal 323B accordingly. Alternatively, the request decoder 301 may associate incoming column access requests with previously received row activation requests according to a predetermined protocol so that the bank address received in a row activation request is used to determine the set of banks, even or odd, to which a subsequently received column access request is directed. In such an embodiment, the LSB of the bank address (or other bit(s) used to specify the target set of banks) may be omitted from the column access request to enable other requests or information (e.g., precharge information) to be conveyed therein. In either case, bank and column address values (which may omit the LSB bit or other bit(s) of the bank address used to specify the target set of banks) loaded into even-bank column control registers 309 are output to the even-bank column decoders for the group A and group B sub-banks, respectively (i.e., column decoders $\mathbf{103}_0$ and $\mathbf{103}_2$ of FIG. 7), and bank and column address values loaded into odd-bank column control registers 311 are output to the odd-bank column decoders.

Figure 6:
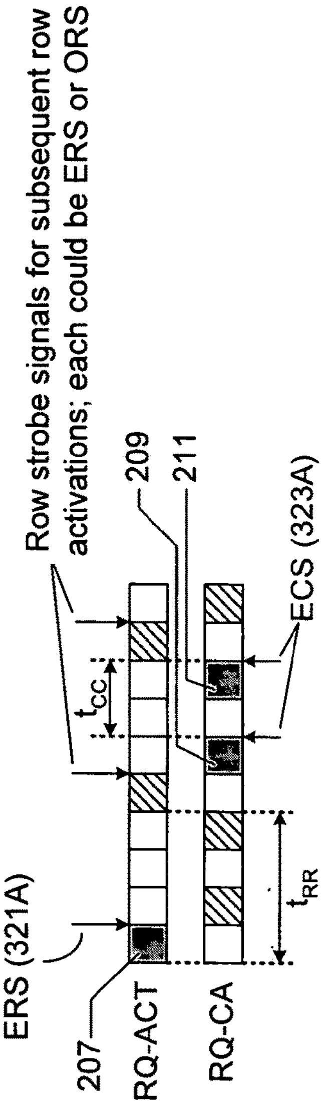
FIG. 6 illustrates an exemplary timing of row and column strobe signal assertions by the request decoder of FIG. 5 when the memory device of FIG. 2 is operating in a single-threaded mode.

FIG. 6 illustrates an exemplary timing of row and column strobe signal assertions by the request decoder 301 of FIG. 5 when the memory device 100 of FIG. 2 is operating in a single-threaded mode. As shown, upon decoding a row activation request 207, the request decoder 301 asserts either an even-row strobe signal 321A (ERS) or an odd-row strobe signal 3216 (ORS) to load either the even-row control registers 305A, 305B3 or the odd row control registers 307A, 307B, respectively, with the bank address, row address and control information provided in the request 207, thereby initiating a row activation operation in either the even or odd bank sets. Although assertion of even row strobe signal 321A is shown in FIG. 6, odd row strobe signal 3216 would be asserted to initiate row activation in an odd bank set. The least significant bit of the bank address may be used to control which of the two strobe signals 321A and 3216 is asserted, and therefore need not be loaded into the selected control register. After a $t_{RR}$ interval has elapsed, another row activation request directed to a different bank is received, and another strobe signal 321A or 3216 is asserted to initiate a corresponding row activation operation.

Upon decoding a column access request 209 directed to the row activated in response to row activation command 207 (i.e., specifying the same bank address as row activation command 207), the request decoder asserts either an even-column strobe signal 323A (ECS) or odd-column strobe signal 3236 (OCS) to load either the even-column control registers 309A, 309B or odd-column control registers 311A, 311B, respectively, with the bank address, column address and control information provided in the request 209, thereby initiating a column access operation (e.g., a read or write operation) within the open page for the specified bank. Although assertion of even column strobe signal 323A is shown in FIG. 6, odd column strobe signal 3236 would be asserted to initiate a column access operation in a transaction directed to a bank in the odd bank set. Again, the least significant bit of the bank address may be used to control which of the two strobe signals 323A, 323B is asserted to initiate a column access operation. After a $t_{CC}$ interval has elapsed, another column access request 211, directed to the same bank as request 209 but different column address, is received within the request decoder 301. Upon decoding the column access request 211, the request decoder asserts either the even-column strobe signal 323A or odd-column strobe signal 323B to load the corresponding pair of registers 309A/309B or 311A/311B (i.e., the same pair of registers loaded in response to decoding request 209, as both requests are directed to the same open page) and thereby initiate a second column access operation directed to the row activated in response to request 207. Thus, a column strobe signal (323A or 323B) is asserted once per $t_{CC}$ interval to enable the specified data transfer to be carried out over the complete $t_{CC}$ interval and using all the links of the DQ path. That is, when the memory device of FIG. 2 is operated in single-threaded mode, the data transfer in response to a column access request consumes the entire $t_{CC}$ envelope.

Reflecting on the operation of the request interface 300 of FIG. 5, it should be noted that because both the even-row control registers 305A, 305B are operated in lock step (i.e., 305A and 305B are loaded in response to the same strobe signal 321A), registers 305A and 305B may be replaced by a single row control register which, when loaded, initiates the specified row operation (e.g., activation or precharge) in the sub-bank quadrants that form the even bank set (i.e., Q0, Q2). Similarly, the odd-row control register pair 307A/307B, even-column control register pair 309A/309B and odd-column control register pair 311A/311B may each be replaced by a respective single register. Further, if the request interface 300 did not include support for micro-threaded column operations, the entire register set could be reduced to a single row control register and a single column control register, the control and address information loaded into each register being provided to the row and column decoders in all four quadrants of the memory device 100. In such an embodiment, the row and column decoders within each quadrant may determine whether to initiate a row or column operation, for example, based on the least significant bit of the bank address (i.e., if BA[0] is a '0', row/column operations are initiated in the decoders of the even quadrants, Q0/Q2, and if BA[0] is a '1', row/column operations are initiated in the decoders of the odd quadrants, Q1/Q3). When the memory device 100 is operated in micro-threaded mode, however, the additional row control registers enable temporally overlapping row operations in different regions of memory device 100 and the additional column control registers enable temporally overlapping column operations in different regions of memory device 100. In one embodiment, the different regions in which overlapping operations are performed are the even and odd bank sets of memory device 100. In another embodiment, the different regions are the four quadrants of the memory device 100. These embodiments and others are discussed in further detail below.

Micro-Threaded Memory Transactions

Figure 7:
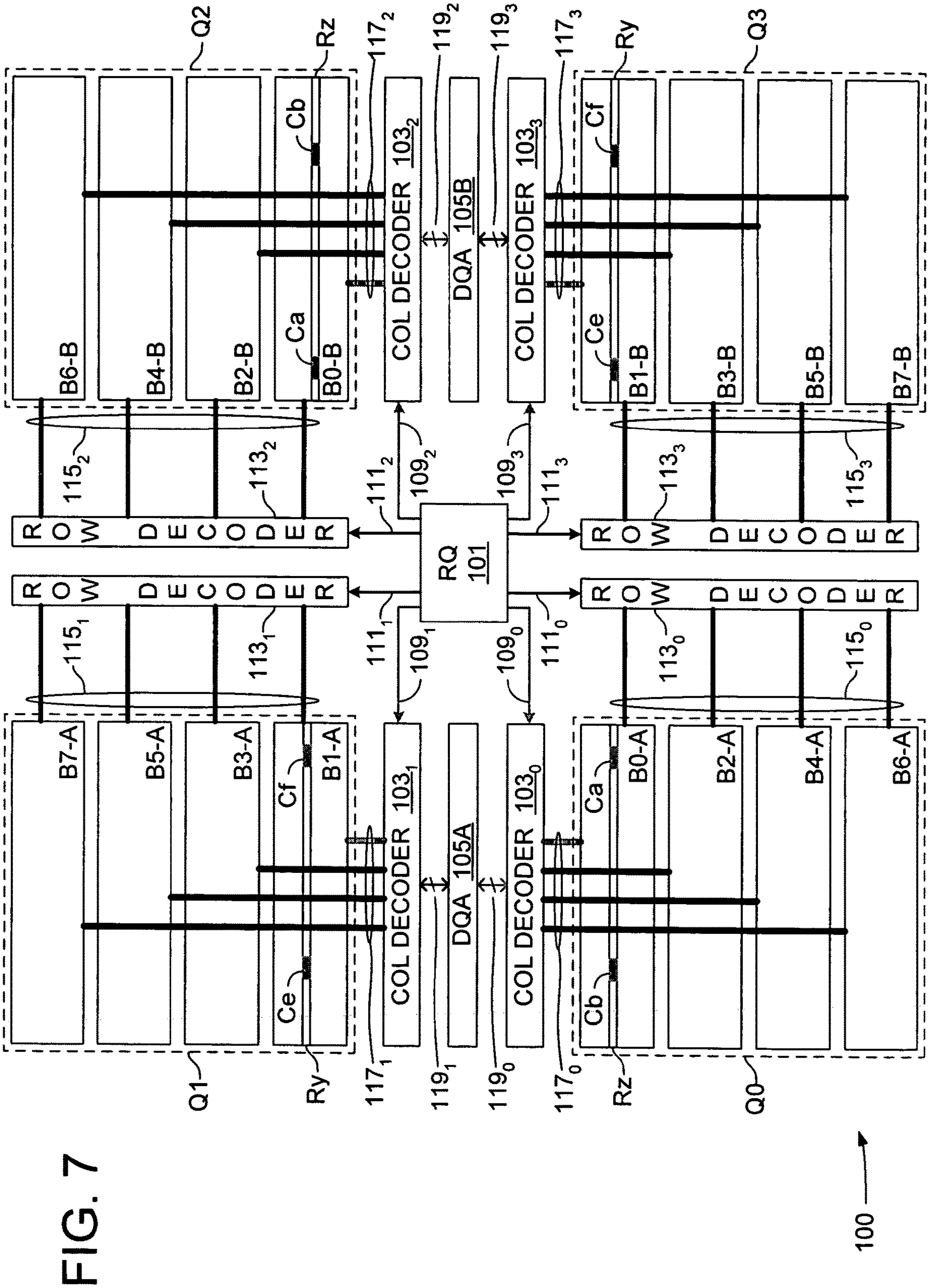
FIGS. 7 and 8 illustrate a memory device and an exemplary sequence of micro-threaded memory transactions that may be performed in the memory device when operated in a micro-threaded mode.
Figure 8:
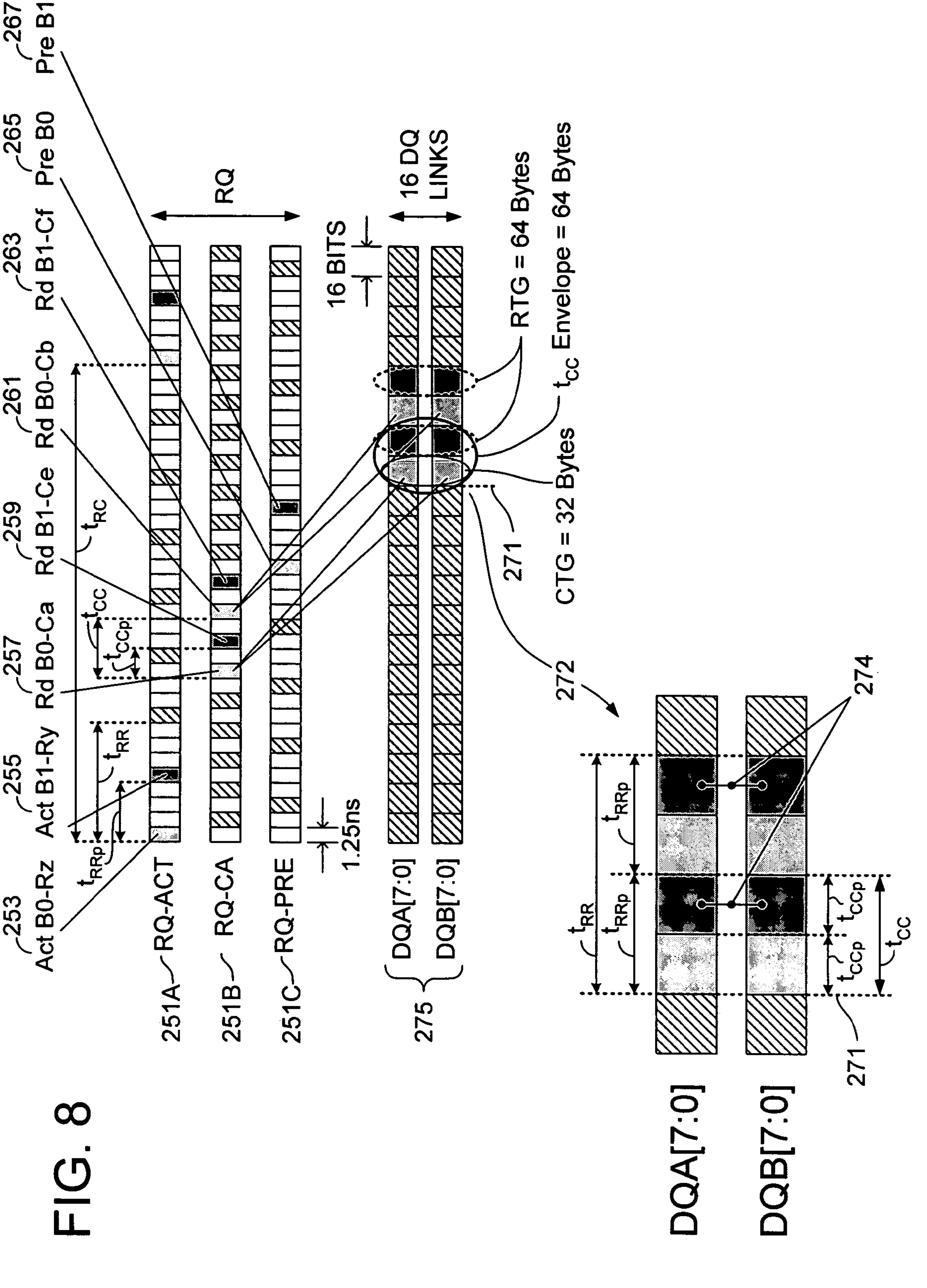

FIGS. 7 and 8 illustrate an exemplary sequence of micro-threaded memory transactions that may be performed in the memory device 100 of FIG. 2 when operated in a micro-threaded mode at full signaling rate (e.g., data path and request path signaling rates increased to 6.4 Gb/s and 1.6 Gb/s, respectively; doubling the 3.2 Gb/s and 0.8 Gb/s legacy signaling rates described above). Rather than allocating the full $t_{CC}$ envelope to a single column access (i.e., as in the single-threaded mode described in reference to FIGS. 2-6) and redesigning the memory device 100 to include double-width internal data path widths, the $t_{CC}$ envelope is subdivided into sub-envelopes that are allocated to alternating transactions in the odd and even bank sets. That is, recognizing that the $t_{RR}$ constraint applies to arbitrary bank selection and is imposed primarily to avoid conflicting use of resources shared by banks in the same bank set, (e.g., row decoders shared by even banks and row decoders shared by odd banks), it follows that row activation operations directed alternately to the odd and even bank sets may be executed in sub-intervals within the overall $t_{RR}$ interval, referred to herein as partial $t_{RR}$ intervals, $t_{RRp}$. Further, because distinct sets of column decoders and distinct data path resources are provided for the even and odd bank sets, micro-threaded column operations directed to the activated rows in alternate bank sets may be executed one after another within a single $t_{CC}$ interval referred to herein as partial $t_{CC}$ intervals, $t_{CCp}$. Through this approach, decoder and data path resources within the memory device 100 that are used at approximately 50% duty in single-threaded mode (i.e., using either the even-bank resources or the odd-bank resources for a given row or column operation) are used concurrently in the micro-threaded mode to support micro-threaded column access operations. Because the data transferred in each micro-threaded column access operation consumes only a portion of a $t_{CC}$ envelope, reduced column transaction granularity is achieved relative to the granularity for single-threaded operation at the same signaling rate. Thus, data throughput is effectively doubled without having to double the widths of internal data paths of the memory device, while at the same time reducing column transaction granularity.

Referring to the depiction of memory device 100 in FIG. 7 and the row activation pipeline 251A shown in FIG. 8, a first row activation request 253 initiates activation of bank B0, row 'z' (i.e., "Rz" in FIG. 7, "Act B0-Rz" in FIG. 8). One $t_{CC}$ interval later (i.e., four 1.25 ns request intervals later at the exemplary 1.6 Gb/s request path signaling rate shown), a second activation request 255 initiates activation of bank B1, row 'y' (Act B1-Ry). Note that, while two row activation requests 253, 255 are received within a single $t_{RR}$ interval, the two requests are directed alternately to even and odd banks (B0 and B1 in this example) and therefore do not conflict. A predetermined time after receipt of the B0-Rz activation request 253, a first micro-threaded column access request 257 specifying a read at bank B0, column 'a' is received (i.e., Rd B0-Ca), as shown in column access pipeline 251B. Similarly, a predetermined time after receipt of the B1-Ry activation request 255, and before the $t_{CC}$ interval for the first micro-threaded column access request 257 has elapsed, a second micro-threaded column access request 259 specifying a read at bank B1, column 'e' is received (Rd B1-Ce). Thus, two micro-threaded column access requests 257, 259 are received within a single $t_{CC}$ interval and, because the requests are directed alternately to odd and even bank sets, are serviced without conflict. More specifically, as shown at 275, read data retrieved from column 'a' of sub-banks B0-A and B0-B is delivered to the data interfaces 105A and 105B for transmission on the DQA and DQB links, respectively, during the first half of the $t_{CC}$ interval starting at 271, and read data retrieved from column 'e' of sub-banks B1-A and B1-B is delivered to the data interfaces 105A and 105B for transmission on the DQA and DQB links during a second half of the same $t_{CC}$ interval. By this arrangement, the 64-byte $t_{CC}$ envelope is effectively partitioned between two micro-threaded column access operations each having a 32-byte column transaction granularity, with the data for each micro-threaded column access operation being output onto the DQA and DQB links during a respective $t_{CCp}$ interval as shown in expanded view 272.

Additionally, because the $t_{CC}$ envelope is partitioned between column accesses directed to odd and even bank sets, the data transmitted during either partial $t_{CC}$ interval may be carried by the existing data path interfaces 105A/105B. Accordingly, the internal data path width of the memory device 100 need not be increased to accommodate the increased data path bandwidth, avoiding the added manufacturing/operating costs and headroom issues discussed above.

Still referring to FIGS. 7 and 8, a $t_{CC}$ interval after receipt of the first B0-directed micro-threaded column access request 257, a second micro-threaded column access request 261 directed to B0 and specifying a read at column 'b' is received (i.e., Rd B0-Cb). Similarly, a $t_{CC}$ interval after receipt of the first B1-directed micro-threaded column access request 259, a second B1-directed micro-threaded column access request 263 specifying a read at column 'f' is received (i.e., Rd B1-Cf). The second B0-directed and B1-directed micro-threaded column access requests 261, 263 are serviced in the same manner as the first B0-directed and B1-directed micro-threaded column access requests 257, 259, resulting in transmission of B0, column 'b' data over the first half of the $t_{CC}$ interval (i.e., first $t_{CCp}$ interval) that immediately succeeds the transmission of the B1, column 'e' data, and transmission of B1, column 'f' data over the second half of the $t_{CC}$ interval. Thus, four micro-threaded column operations are executed, resulting in four 32-byte data transfers over a single $t_{RR}$ interval starting at 271. As each row activation yields two 32-byte column data transfers, each within a respective $t_{RRp}$ interval as shown at 274, the row transaction granularity is 64 bytes, half the 128-byte data transfer capacity of the data path over the $t_{RR}$ interval (i.e., half the 128-byte $t_{RR}$ envelope).

Precharge requests 265 and 267 directed to banks B0 and B1 are received in the request interface 101 a predetermined time after receipt of the micro-threaded column access requests 261 and 263 directed to the same banks (i.e., as shown in precharge pipeline 251C). The precharge requests 265, 267 are serviced in the manner discussed above to close the open pages in the specified banks.

Figure 9:
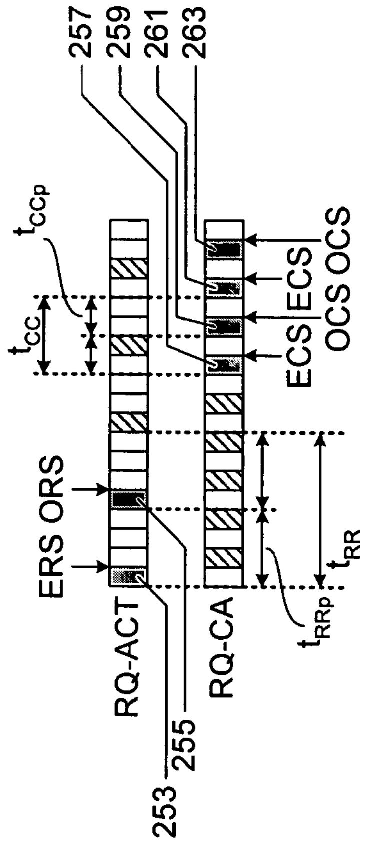
FIG. 9 illustrates an exemplary timing of register strobe signal assertions by the request decoder of FIG. 5.

FIG. 9 illustrates an exemplary timing of row and column strobe signal assertions by the request decoder 301 of FIG. 5 when in a micro-threaded mode. As shown, upon decoding a row activation request 253 directed to an even bank, the request decoder 301 asserts the even-row strobe signal 321A to load even-row control registers 305A, 305B and thereby deliver bank and address values to the row decoders for the even banks. After a partial $t_{RR}$ interval ($t_{RRp}$) has elapsed, a row activation request 255 directed to an odd bank is received. Upon decoding the odd-bank row activation request 255, the request decoder 301 asserts the odd-row strobe signal 3216 to load odd-bank row control registers 307A, 307B and thereby deliver bank and row address values to the row decoders for the odd banks. Thus, assuming a fully loaded row activation pipeline, the request decoder alternately asserts the even-row and odd-row strobe signals 321A, 3216 after each $t_{RRp}$ interval to deliver bank and row address values alternately to the row decoders for the odd and even bank sets.

Still referring to FIG. 9, upon decoding a column access request 257 (i.e., a micro-threaded column access request) directed to an even bank, the request decoder 301 asserts the even-column strobe signal 323A to load even-bank column control registers 309A, 309B and thereby deliver bank and column address values to the column decoders for the even banks. After a partial $t_{CC}$ interval ($t_{CCp}$) has elapsed, a column access request 259 directed to an odd bank is received. Upon decoding the odd-bank column access request 259, the request decoder 301 asserts the odd-column strobe signal 3236 to load odd-bank column control registers 311A, 3116 and thereby deliver bank and column address values to the column decoders for the odd banks. Thus, assuming a fully loaded column access pipeline, the request decoder 301 alternately asserts the ECS and OCS signals after each $t_{CCp}$ interval to deliver bank and column address values alternately to the column decoders for the odd and even bank sets. As shown in FIG. 8, the alternating assertion of the ECS and OCS signals enables a time-staggered transfer of column data for multiple micro-threaded column access operations within a single $t_{CC}$ interval. The ECS and OCS signals are asserted by the request decoder 301 during a second $t_{CC}$ interval in response to column access requests 261 and 263, respectively, thereby enabling the time staggered data transfer to be repeated during a subsequent $t_{CC}$ interval as shown in FIG. 8.

Figure 10:
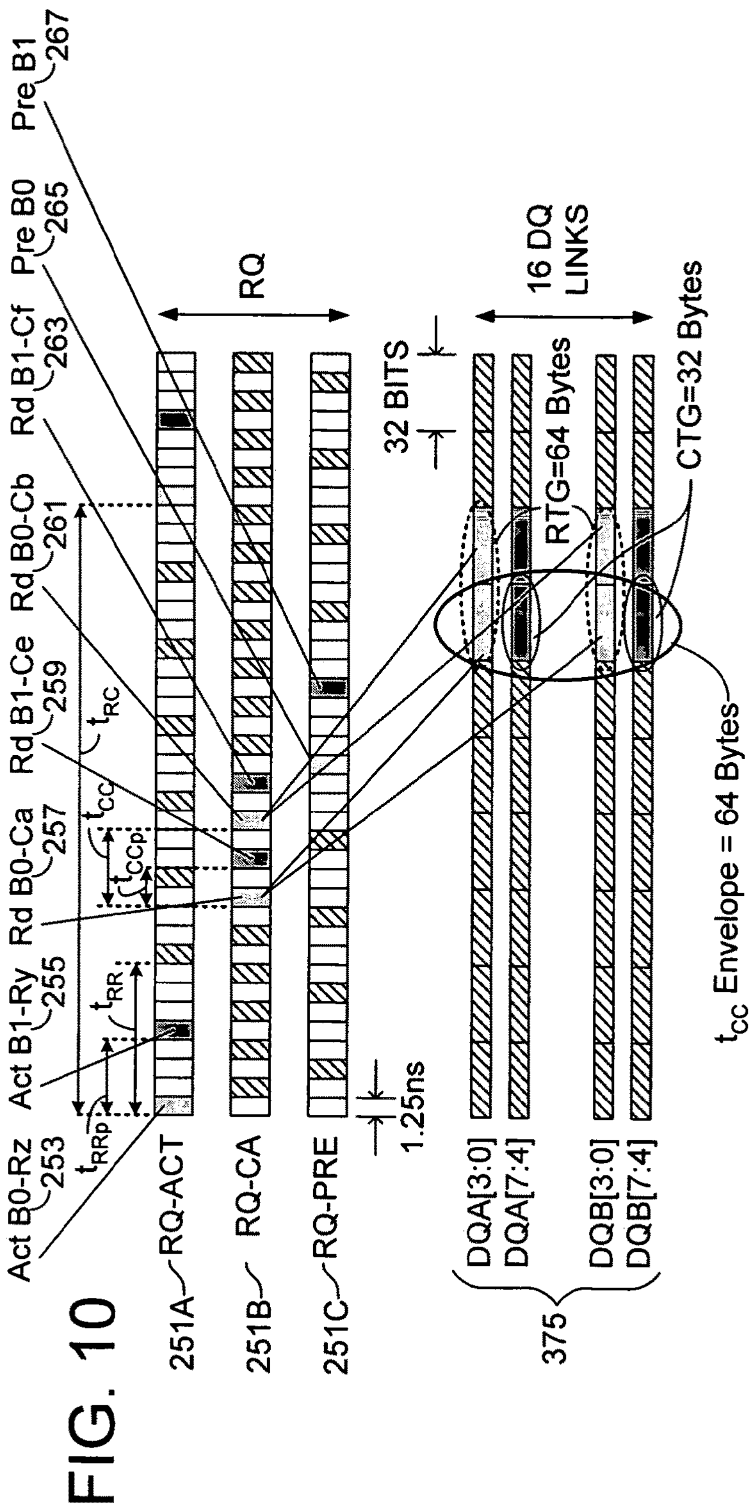
FIG. 10 illustrates exemplary link-staggered micro-threaded memory transactions that may be performed in an alternative embodiment of the memory device of FIG. 2.

FIG. 10 illustrates exemplary link-staggered micro-threaded memory transactions that may be performed in an alternative embodiment of the memory device 100 of FIG. 2. Row activation requests 253 and 255, micro-threaded column access requests 257, 259, 261 and 263, and pre-charge requests 265 and 267 are received in the request interface 101 and processed in generally the same manner as discussed above in reference to FIGS. 7-9. However, instead of subdividing the $t_{CC}$ envelope temporally (i.e., time-staggering the column data output in response to micro-threaded column access requests received in the same $t_{CC}$ interval), the $t_{CC}$ envelope is subdivided spatially through concurrent data transfer of the column data for same-$t_{CC}$-interval micro-threaded column access requests on different portions of the DQA and DQB data paths as shown at 375; an operation referred herein to as link staggering. That is, the column data transferred in response to micro-threaded column access request 257 is transmitted via a first subset of the DQA links and a first subset of the DQB links (e.g., DQA[3:0] and DQB[3:0], while column data transferred in response to micro-threaded column access request 259 is concurrently (i.e., partly or completely overlapping in time) transmitted via a second subset of the DQA lines and a second subset of the DQB links (e.g., DQA[7:4] and DQB [7:4]). Similarly, the column data transferred in response to micro-threaded column access requests 261 and 263 is transmitted during a subsequent $t_{CC}$ interval over the first and second subsets of DQ links, respectively. The $t_{CC}$ envelope remains at 64 bytes, with the column transaction granularity and row transaction granularity being 32 bytes and 64 bytes, respectively, as in the temporally-staggered embodiment of FIG. 8. Thus, the link-staggered approach provides effectively the same benefits as the temporally-staggered approach in terms of reduced row and column transaction granularity, but does so by allocating respective portions of the DQ paths to service the micro-threaded column access requests, instead of respective portions of the $t_{CC}$ interval.

Figure 12B:
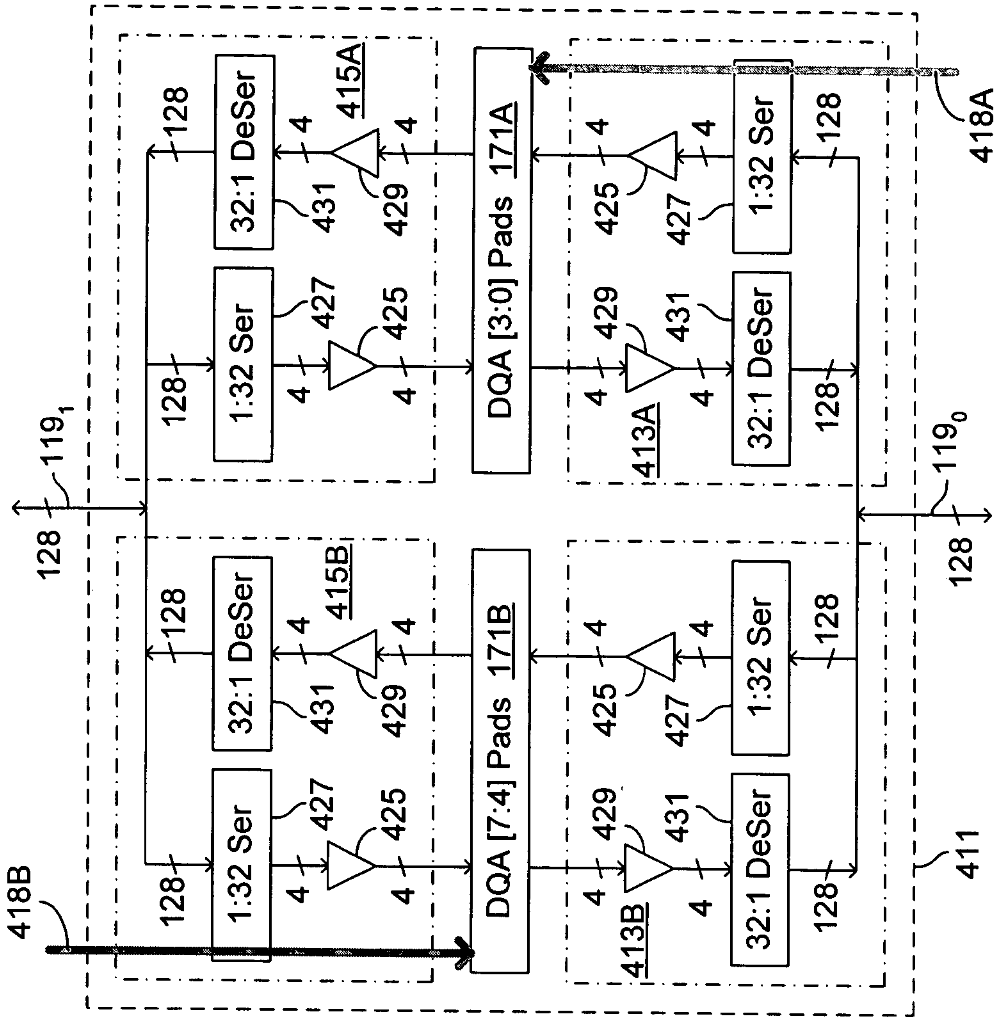
FIGS. 12A and 12B illustrate exemplary data path interfaces and that may be used to support the time-staggered and link staggered data transfers shown in FIGS. 8 and 10.
Figure 12A:
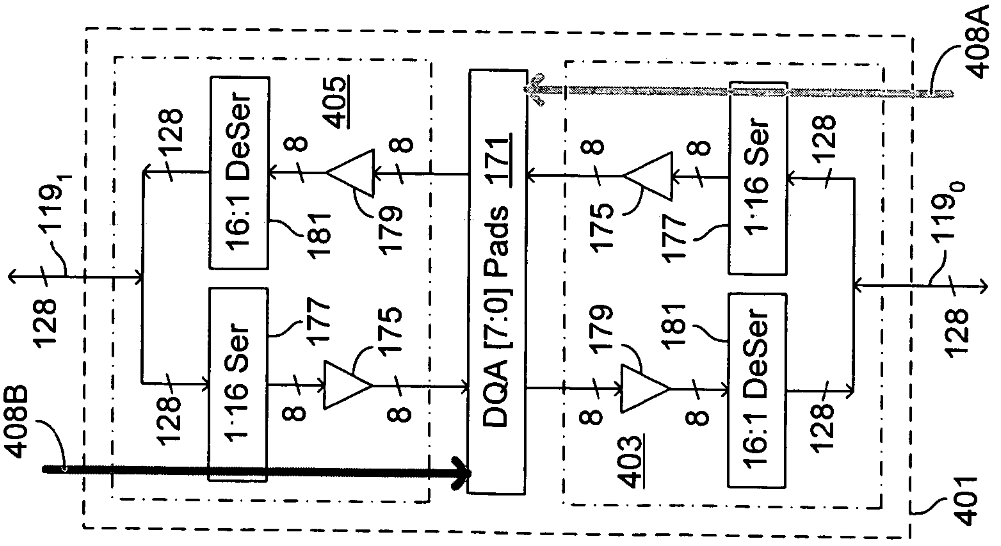

FIGS. 12A and 12B illustrate exemplary data path interfaces 401 and 411 that may be used to support the time-staggered and link staggered data transfers shown in FIGS. 8 and 10, respectively. The data path interface 401 of FIG. 12A corresponds generally to the data path interface 105A described in reference to FIG. 3 and includes DQA pads 171 and a pair of transceivers 403 and 405 coupled between the pads 171 and respective column data paths $\mathbf{119}_0$ and $\mathbf{119}_1$. Each transceiver 403, 405 includes a data serializer 177 and transmitter 175 to generate an output data stream, and a receiver 179 and data deserializer 181 to receive an incoming data stream. More specifically, in the exemplary embodiment shown, the data serializer 177 converts 128-bit column data values received via the column data path 119 into a sequence of sixteen 8-bit values (e.g., picking off one byte at a time in round-robin fashion from each of sixteen different offsets within the 128-bit column data) which are delivered to the transmitter 175 for transmission in respective transmission intervals via the DQA pads 171. Conversely, a sequence of sixteen 8-bit values recovered by the receiver 179 are delivered to the data deserializer 181 which gathers the values into a 128-bit column data value that is provided to the column decoder via column data path 119. In the time-staggered data transfer operation illustrated in FIG. 8, the data transfer path through transceiver 403 is used during a first partial $t_{CC}$ interval, and the data transfer path through transceiver 405 is used during the second partial $t_{CC}$ interval, as indicated by arrows 408A and 408B which are shaded to correspond to the column access transactions of FIG. 8.

In the data path interface 411 of FIG. 12B, the eight links of the DQA path are subdivided into two groups of four links, DQA[3:0] and DQA[7:4], and used to transfer data for respective micro-threaded column transactions. Accordingly, a first pair of transceivers 413A/415A is coupled to a first set of four DQA pads 171A and a second pair of transceivers 413B/415B is coupled to a second set of four DQA pads 171B, with each individual transceiver including an output data path formed by a data serializer 427 and transmitter 425, and an input data path formed by a receiver 429 and data deserializer 431. As each 128-bit column data value is transferred over half the number of signal links (e.g., four instead of eight), the data serializer is a 1:32 data serializer (i.e., converting the 128-bit column data value into a sequence of thirty-two 4-bit data values) instead of the 1:16 data serializer of FIG. 12A, and the data deserializer is a 32:1 data deserializer (gathering a sequence of thirty-two 4-bit values into a 128-bit column data value) instead of the 16:1 data deserializer 181 of FIG. 12A. Thus, each transceiver 413A, 415A, 413B, 415B transfers a 128-bit column data between a column data path 119 and a smaller number of DQ links, but over twice the interval (i.e., over a full $t_{CC}$ interval rather than a half $t_{CC}$ interval).

As in the embodiment of FIG. 12A, the micro-threaded column transactions serviced in the same $t_{CC}$ interval are directed alternately to odd and even banks so that one set of four data path links is fed by data from (or feeds data to) one of the column data paths $\mathbf{119}_0$ and $\mathbf{119}_1$ over a given $t_{CC}$ interval, and the other set of four data path links is concurrently fed by data from (or feeds data to) the other of the column data paths $\mathbf{119}_0$ and $\mathbf{119}_1$ during the $t_{CC}$ interval. This data flow arrangement is shown, for example by arrows 418A and 418B which are shaded to correspond to the column access transactions of FIG. 10.

Comparing FIGS. 12A and 12B, it can be seen that the data path interfaces 401 and 411 differ primarily in the operation of the data serializer and data deserializer circuits. That is, the two four-link transmitters 425 in transceivers 413A and 413B may be implemented and connected to the eight DQA pads (i.e., 171A and 171B) so as to be equivalent to the single eight-link transmitter 175 in transceiver 403, and the two four-link receivers 429 in transceivers 413A and 413B may likewise be equivalent to the eight-link receiver 179 in transceiver 403. The 1:16 data serializers 177 in transceivers 403 and 405 differ from the 1:32 data serializers 427 in transceivers 413A, 413B, 415A and 415B primarily by the manner in which incoming 128-bit column data is distributed to the DQA data pads; data deserializer 177 delivering 8-bit chunks of the 128-bit column data to eight DQA pads over 16 transmission intervals and, data deserializer 427 delivering 4-bit chunks of the 128-bit column data to four DQA pads over 32 transmission intervals. The 16:1 data deserializers and 32:1 data deserializers are similarly different in the manner of data distribution from DQA pads to column data values. Thus, in one embodiment, the data path interfaces 401 and 411 are implemented by a single data path interface circuit having data serializer and data deserializer circuits that are configurable (e.g., through mode register programming) to support either link-staggered or time-staggered data transfer in response to micro-threaded column access requests.

Figure 11:
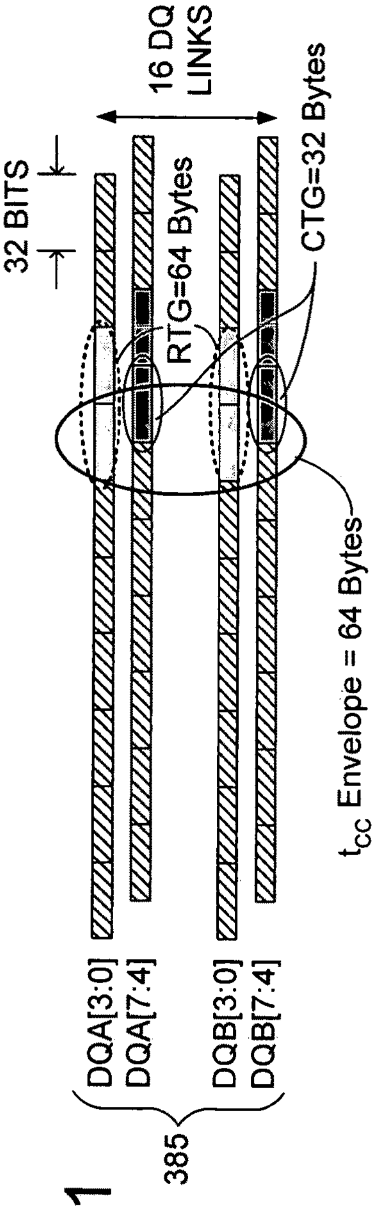
FIG. 11 illustrates an alternative link-staggered data transfer mode that may be used in other memory device embodiments.

Referring to FIGS. 10 and 12B, it should be noted that, because column data retrieved in response to micro-threaded column access request 257 will become available for transfer before column data retrieved in response to micro-threaded column access request 259, the first-retrieved column data may be buffered (e.g., within the data path interface 411) until the second-retrieved column data is available, thereby enabling simultaneous (i.e., fully concurrent) transfer of the column data for the two access requests. Alternatively, as shown in FIG. 11, the first-retrieved column data (i.e., retrieved in response to request 257) may be output as soon as it becomes available, thus resulting in a time-staggering of the same-row transmissions on the upper and lower partitions of the data path as shown at 385, with transfer of the second-retrieved column data being delayed relative to transfer of the first-retrieved column data by a partial $t_{CC}$ interval (i.e., $t_{CCp}$). The transmissions over the signal path partitions are thus partially overlapped (but still concurrent over a partial $t_{CC}$ interval). Such an approach may be desirable in some applications, as no buffering of column data is required and a single, deterministic memory access latency applies to each micro-threaded column access. By contrast, if column data retrieved in response to a first micro-threaded column access request is buffered to enable simultaneous, link-staggered transfer with column data retrieved in response to a second micro-threaded column access request, the two micro-threaded column access requests may have different, though still deterministic, memory access latencies.

Figure 13:
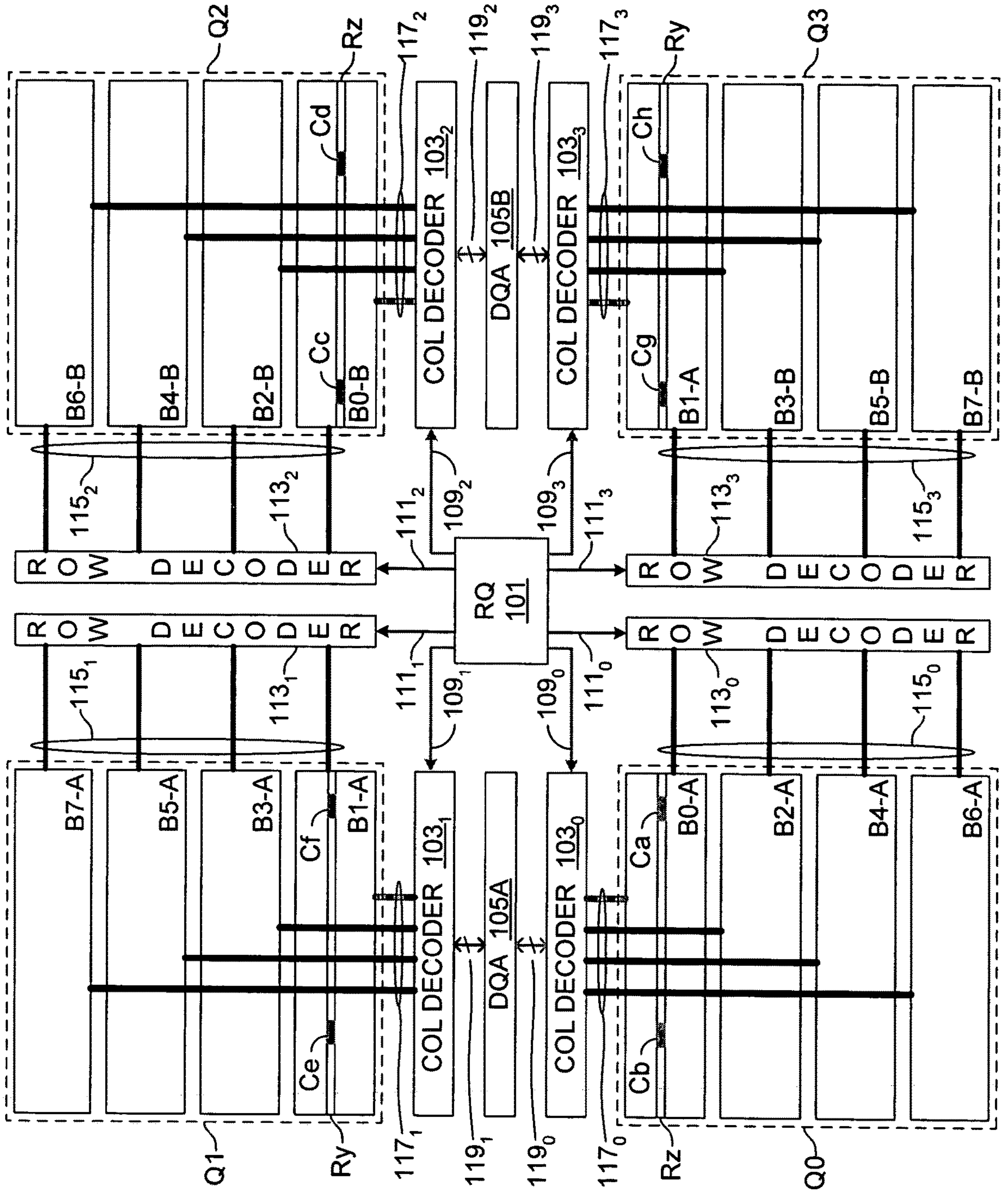
FIGS. 13 and 14 illustrate a memory device and an exemplary sequence of micro-threaded memory transactions that may be performed in the memory device when operated in an alternative micro-threaded mode.
Figure 14:
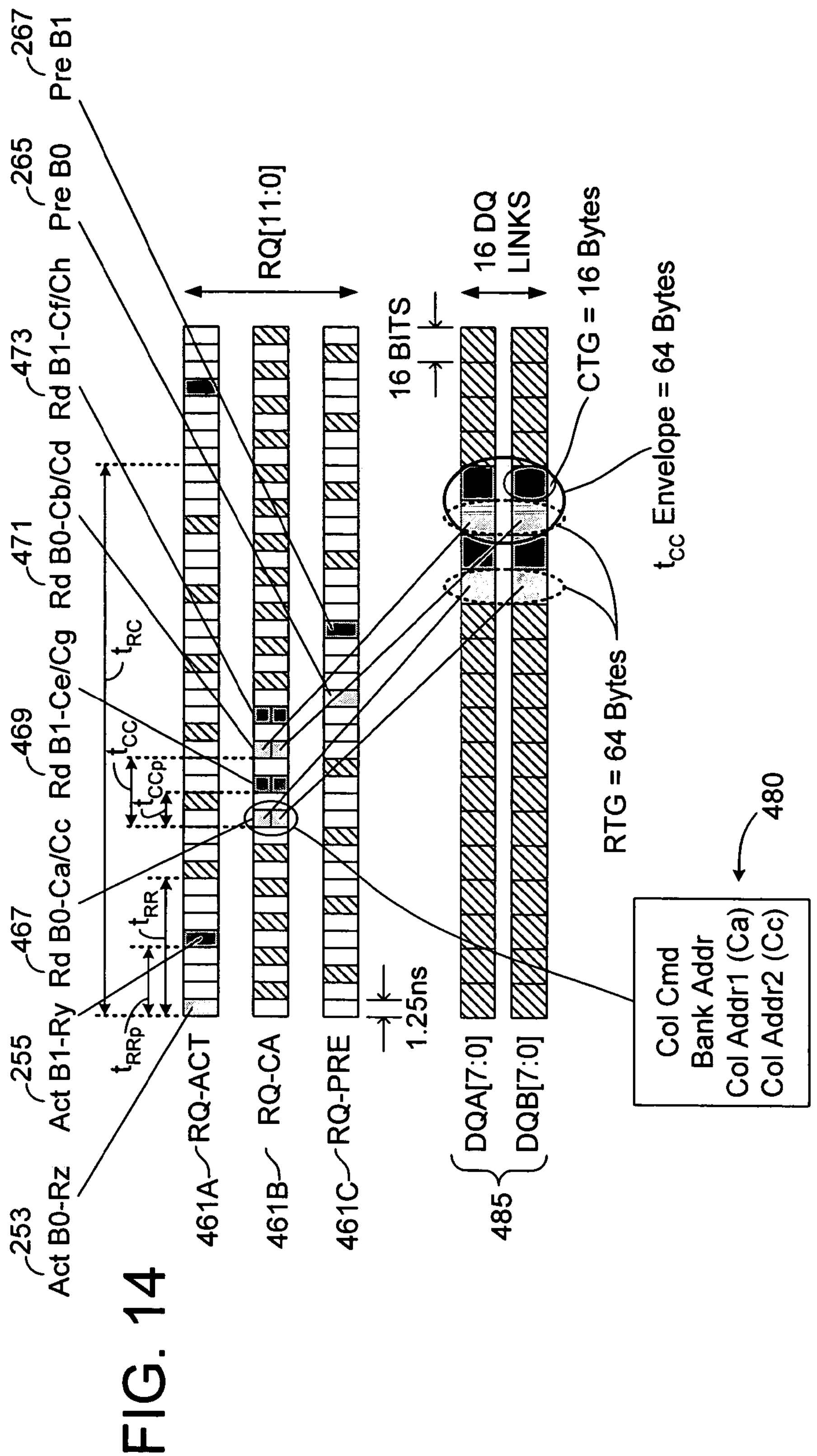

FIGS. 13 and 14 illustrate an exemplary sequence of micro-threaded memory transactions that may be performed in the memory device 100 of FIG. 2 when operated in an alternative micro-threaded mode at full signaling rate (e.g., data and request bandwidth doubled over the legacy 3.2 Gb/s and 0.8 Gb/s signaling rates described above). In the alternative micro-threaded mode, referred to herein as a sub-bank micro-threaded mode, the number of micro-threaded column transactions per $t_{CC}$ envelope is doubled relative to the micro-threaded mode of FIGS. 7 and 8 by increasing the number of column addresses provided in each column access request, and by applying the pairs of column addresses delivered in each column access request to different sub-banks of the same bank. Referring to the row activation pipeline 461A, column access pipeline 4616 and precharge pipeline 461C shown in FIG. 14, for example, a sequence of row activation requests 253, 255 is received as in FIG. 8 (i.e., with the pair of requests received within each $t_{RR}$ interval being directed alternately to even and odd banks), and a sequence of micro-threaded column access requests 467, 469, 471, 473 are also received as in FIG. 8, but with each access request including a bank address and two column addresses as shown at 480. By applying the two column addresses against alternating sub-banks of a specified even or odd bank (i.e., sub-bank micro-threading), two distinct 16-byte column data values may be retrieved per micro-threaded column access, thus achieving 16-byte column transaction granularity. In the particular example of FIGS. 13 and 14, for instance, a first micro-threaded column access request 467 specifies a read at column ‘a’ of sub-bank B0-A and a read at column ‘c’ of sub-bank B0-B (i.e., Rd B0-Ca/Cc), while a second micro-threaded column access 469 received within the same $t_{CC}$ interval specifies read at column ‘e’ of sub-bank B1-A and a read at column ‘g’ of sub-bank B1-B (Rd B1-Ce/Cg). In a subsequent $t_{CC}$ interval, two additional micro-threaded column access requests 471 and 473 are received, the first specifying a read at columns ‘b’ and ‘d’ of the B0-A and B0-B sub-banks (Rd B0-Cb/Cd), and the second specifying a read at columns ‘f’ and ‘h’ of the B1-A and B1-B sub-banks (Rd B1-Cf/Ch). As shown at 275, the $t_{CC}$ envelope is temporally subdivided between successive $t_{CCp}$ intervals and spatially subdivided between DQA and DQB data path links to accommodate the four column data transfers that correspond to the four column addresses received in each pair of micro-threaded column access requests. Thus, through sub-bank micro-threading, the column transaction granularity is reduced to 16 bytes without reduction in the aggregate amount of transferred data (i.e., peak bandwidth of the memory device is maintained). The row transaction granularity remains at 64 bytes as four 16-byte column data transfers are performed per activated row.

Figure 15:
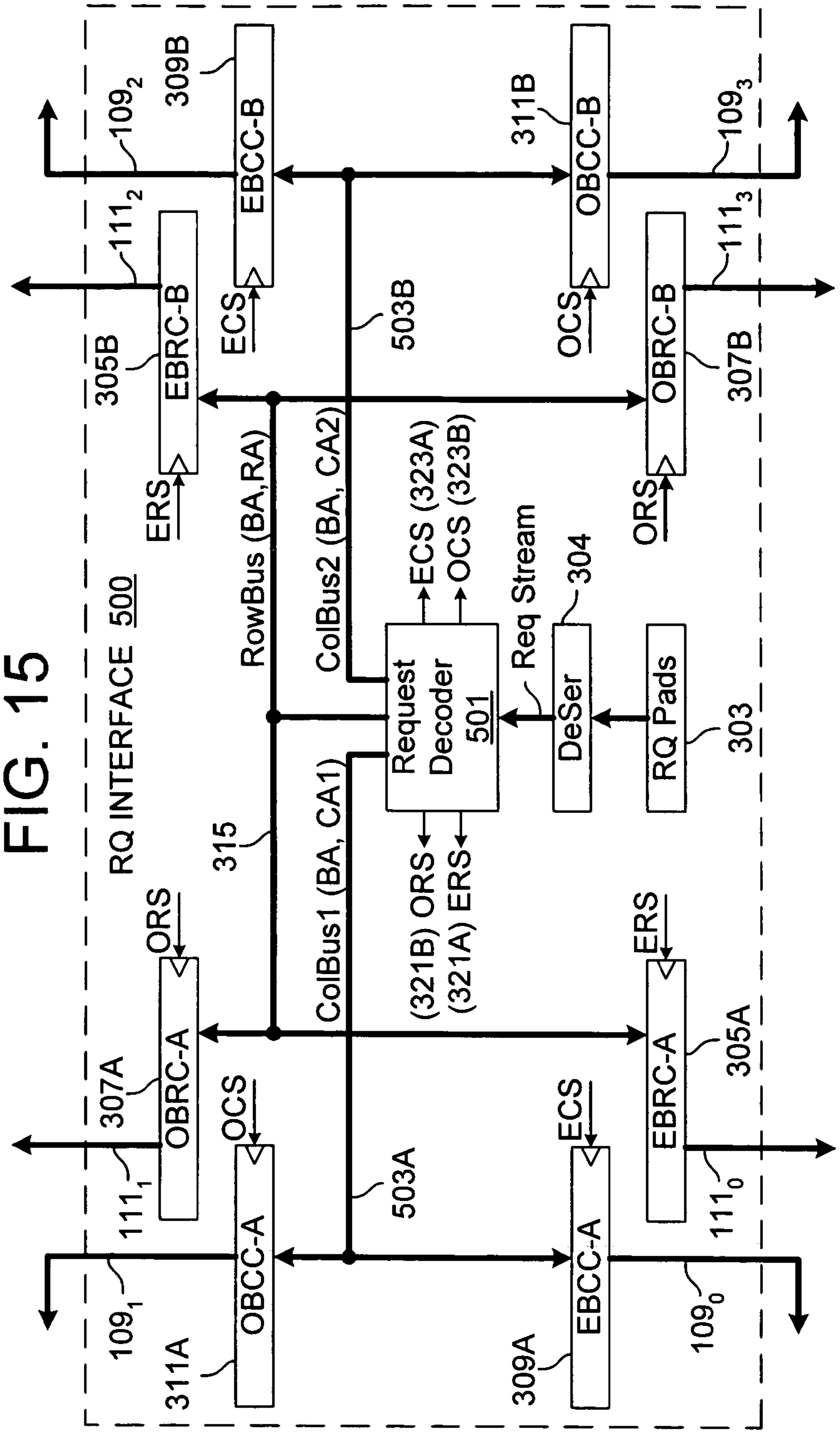
FIG. 15 illustrates an embodiment of a request interface that may be used within the memory device 100 of FIG. 2 to enable the micro-threaded memory transactions described in reference to FIGS. 13 and 14.

FIG. 15 illustrates an embodiment of a request interface 500 that may be used within the memory device 100 of FIG. 2 (i.e., to implement request interface 101) to enable the micro-threaded memory transactions described in reference to FIGS. 13 and 14. As in the embodiment of FIG. 5, the request interface 500 includes a request decoder 501 to process an incoming stream of requests (i.e., received via pads 303 and deserialized, if necessary, by optional request deserializer 304), even-bank row control registers 305A, 305B3, odd-bank row control registers 307A, 307B, even-bank column control registers 309A, 309B and odd-bank column control registers 311A, 311B. The request interface 500 also includes a row bus 315 coupled between the request decoder 501 and the even- and odd-bank row control registers 305, 307, a first column bus 503A coupled between the request decoder 501 and the even-bank column control registers 309 and a second column bus 503B coupled between the request decoder 501 and the odd-bank column control registers 311.

Upon decoding a row activation request, the request decoder 501 outputs the row address and bank address onto the row bus 315 and, as discussed in reference to FIG. 5, asserts either an even-row strobe signal 321A or odd-row strobe signal 3216 (i.e., depending on whether the request is directed to an even bank or odd bank) to load the bank and row address values into either the even-bank row control registers 305 or odd-bank row control registers 307. Upon decoding a micro-threaded column access request having a bank address and two column addresses (i.e., a sub-bank micro-threaded column access), the request decoder 501 outputs the first and second column addresses on the first and second column buses 503A and 503B, respectively, then asserts either an even-column strobe signal 323A or odd-column strobe signal 323B (i.e., depending on whether the request is directed to an even bank or odd bank) to load the first column address into either the even-bank or odd-bank column control register (305A or 307A) for the group A sub-banks (i.e., referring to FIG. 13, the sub-banks in quadrants Q0 and Q1), and to load the second column address into the corresponding even-bank or odd-bank column control register (305B or 307B) for the group B sub-banks (i.e., sub-banks in quadrants Q2 an Q3). In one embodiment, the bank address value received in the sub-banked micro-threaded column access request is output onto both the first and second column buses 503A and 503B and loaded, along with the first and second column addresses, into either the even-bank or odd-bank column control registers 309 or 311 in response to assertion of the even-column load or odd-column strobe signals 323A, 323B. In an alternative embodiment, a separate bank address bus may be provided and coupled in common to the even and odd-bank column control registers 309 and 311 (and to the request decoder 501) to enable a bank address supplied thereon to be loaded into bank address fields within those registers (or into separate bank address registers). Also, in another embodiment, a single column bus is coupled to all the column control registers 309, 311 and time-multiplexed to load the first column address into one of column control registers 309A and 311A, and the second column address into one of column control registers 309B and 309B in respective address transfer operations. In such an embodiment, distinct strobe signals may be provided to each of the four column control registers 309A, 309B, 311A, 311B to enable one column control register to be loaded at a time. Also, in all such embodiments, the two column addresses may be independently specified by the incoming micro-threaded column access request, or may be specified in relation to one another. For example, one of the two addresses may be specified as an arithmetic or logical offset from the other. The offset value may be specified in the column access request, or the column access request may include a value that is used indirectly to determine the offset value, for example, by indexing a lookup table of offset values.

In the embodiment of FIG. 15, the request decoder 501 may assert the register strobe signals 321A, 321B, 323A and 323B at the times shown in FIG. 9, thereby enabling the two column addresses received in each sub-bank micro-threaded column access request to be applied concurrently within each $t_{CCp}$ interval (i.e., simultaneously or at least partly overlapping in time) to retrieve respective sets of data from different columns of the same bank. In an embodiment having a shared, time-multiplexed column bus, four column strobe signals (e.g., ECS1, ECS2, OCS1, OCS2) may be asserted in succession to enable two column control register load operations per $t_{CCp}$ interval. For example signals ECS1 and ECS2 may be asserted one after another during a first $t_{CCp}$ interval, and OCS1 and OCS2 asserted one after another during a second $t_{CCp}$ interval.

Figure 16:
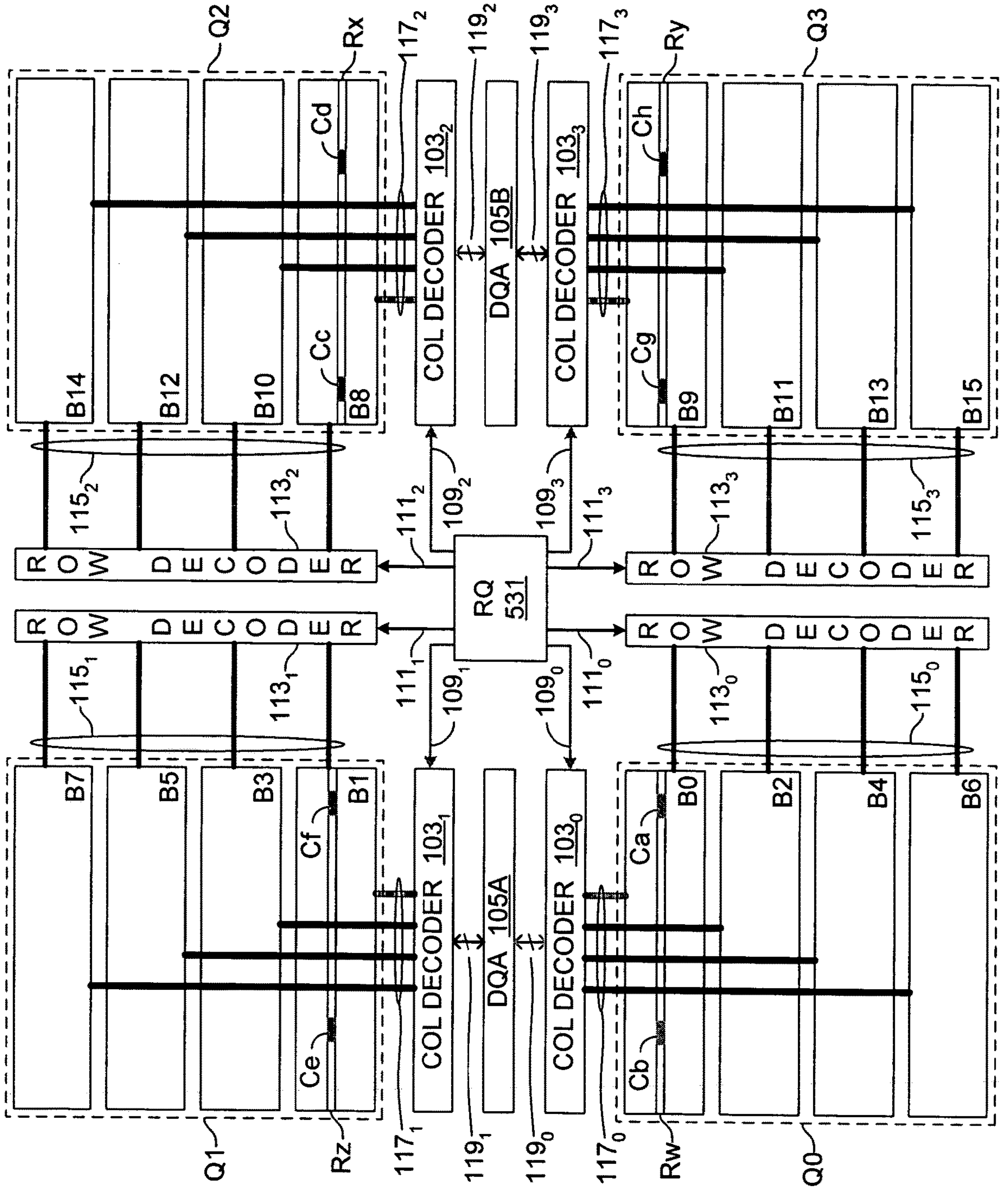
FIGS. 16 and 17 illustrate a memory device and an exemplary sequence of micro-threaded memory operations in which separate row and column addresses are used to access sub-banks in each of four storage bank quadrants of the memory device within a single $t_{CC}$ interval.
Figure 17:
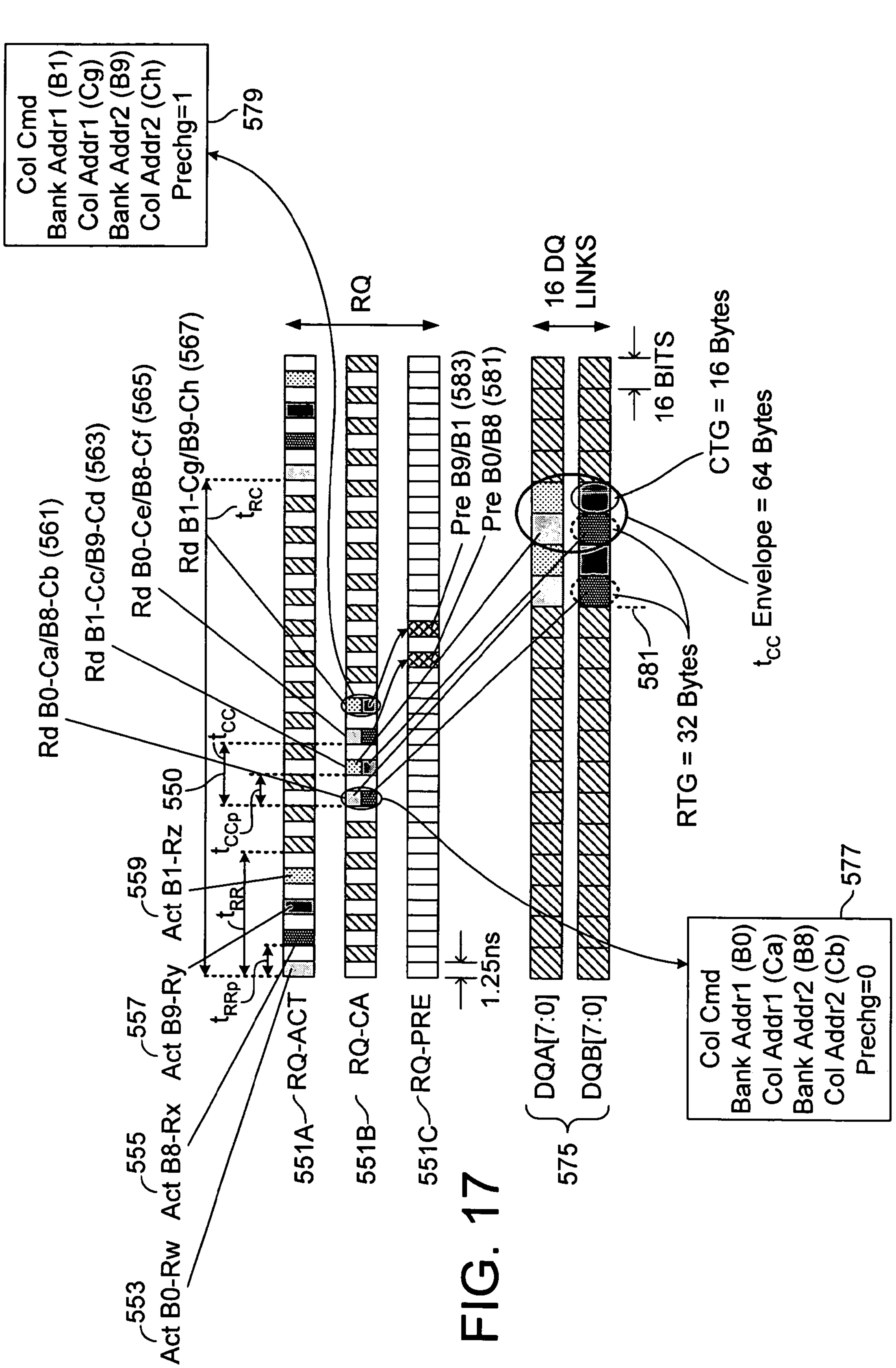

FIGS. 16 and 17 illustrate exemplary micro-threaded memory operations in which separate row and column addresses are used to access sub-banks in each of the four quadrants, $Q_0$-$Q_3$, of a memory device 530 within a single $t_{CC}$ interval. More precisely, because the request interface 531 of memory device 530 delivers unique bank, row and column addresses to the address decoders (i.e., column decoders 103 and row decoders 113) for each quadrant, the storage arrays in each quadrant are effectively converted from sub-banks to banks, thereby yielding a sixteen bank architecture having banks B0-B15 as shown in FIG. 16. As in the other memory device embodiments discussed above, memory device 530 may have more or fewer storage arrays in alternative embodiments, yielding correspondingly more or fewer banks. Also, any of the sixteen banks may include two or more constituent sub-banks.

Referring to FIGS. 16 and 17, the row activation pipeline 551A is more densely loaded than in previously described embodiments to deliver row activation requests 553, 555, 557 and 559 directed to banks within each of the four quadrants of the memory device 530 in a single $t_{RR}$ interval. That is, the $t_{RR}$ interval is sub-divided into four $t_{RRp}$ intervals, with a row activation request being received in each. In the specific example shown in FIGS. 16 and 17, rows 'w', 'x', 'y' and 'z' are activated one after another in banks B0, B8, B9 and B1, respectively (i.e., Act B0-Rw, Act B8-Rx, Act B9-Ry and Act B1-Rz), though rows may be activated in each of the four quadrants in different order in subsequent transactions or in alternative embodiments.

Referring to column access pipeline 551B, a predetermined time after the first row activation request 553 is received, a pair of dual-address micro-threaded column access requests 561, 563 are received over a first $t_{CC}$ interval 550, thereby delivering four bank addresses and four column addresses that may be applied against pages opened in the four quadrants in response to activation requests 553, 555, 557 and 559. In the particular example shown, the first dual-address micro-threaded column access request 561 includes a first pair of addresses, Bank Addr1 and Col Addr1 as shown at 577, that specify an access at column 'a' of bank B0 (i.e., in the open page thereof), and a second pair of addresses, Bank Addr2 and Col Addr2, that specify an access at column 'b' of bank B8 (i.e., Rd B0-Ca/B8-Cb). The second dual-address micro-threaded column access request 563 specifies an access at column 'c' of bank B1 and column 'd' of bank B9 (Rd B1-Cc/B9-Cd). Because each of the four bank addresses provided in the pair of access requests 561 and 563 and specifies a bank in a different quadrant of the memory device 530, no column decoder or data path conflict arises in servicing the requests. Accordingly, a predetermined time after receipt of the four address values in the pair of access requests 561 and 563, four corresponding sets of column data are transmitted via the data path over a $t_{CC}$ interval that begins at 577. As shown at 575, the four sets of column data are transmitted in both link-staggered manner (i.e., two sets of data transferred on the DQA links and two sets transferred on the DQB links) and time-staggered manner (the column data corresponding to the first and access requests 561 and 563 being transferred in first and second $t_{CCp}$ intervals, respectively) within the 64-byte $t_{CC}$ envelope, with each set of column data having a 16 byte column transaction granularity.

Still referring to FIGS. 16 and 17, a second pair of dual-address micro-threaded column access requests 565 and 567 are received in the $t_{CC}$ interval that immediately follows interval 550. As in the first pair of access requests 561 and 563, the four bank addresses carried within the second pair of access requests specify accesses at selected columns of the previously activated rows of banks in each of the four quadrants of the memory device 530 (e.g., Rd B0-Ce/B8-Cf and Rd B1-Cg/B9-Ch). Accordingly, a predetermined time after receipt of the four address values in the second pair of micro-threaded column access requests 565 and 567, four corresponding sets of column data are transmitted via the data path. The four sets of column data are transmitted link-staggered and time-staggered within the 64-byte $t_{CC}$ envelope, with each set of column data having a 16 byte column transaction granularity. The $t_{RR}$ envelope remains at 128 bytes (i.e., twice the $t_{CC}$ envelope as $t_{RR}$=2$t_{CC}$ in this example), but, due to the four-way partitioning of the $t_{RR}$ interval, the row transaction granularity is reduced to 32 bytes.

Still referring to FIG. 17, the increased request density in row activation pipeline 551A may eliminate request intervals otherwise used to issue precharge requests. In one embodiment, precharge requests that would otherwise be transmitted during the intervals shown at 581 and 583 of a precharge request pipeline 551C, are instead handled by a sub-field within column access requests. For example, as shown in at 577 and 579, a precharge bit (or bits) may be included with each column access request to indicate whether a precharge operation is to be automatically performed upon conclusion of the requested access. Thus, in access request 561, the precharge bit is reset (e.g., "Prechg=0" as shown at 577) to defer the precharge operation, leaving the pages of the specified banks (B0 and B8) open for one or more subsequent column accesses. In access request 567, the precharge bit is set (e.g., "Prechg=1" as shown at 579), thereby instructing the memory device 530 to perform precharge operations in the specified banks (B1 and B9) at the conclusion of the specified column accesses.

FIG. 18 illustrates an embodiment of a request interface 600 that may be used to implement request interface 531 within the memory device 530 of FIG. 16 and to support the four-way micro-threaded transactions described in reference to FIG. 17. As in the embodiment of FIGS. 5 and 15, the request interface 600 includes a request decoder 601 to process an incoming stream of requests (i.e., received via pads 303 and deserialized, if necessary, by optional data deserializer 304), even-bank row control registers 305A, 3056, odd-bank row control registers 307A, 3076, even-bank column control registers 309A, 309B and odd-bank column control registers 311A, 311B. The request interface 600 also includes a row bus 315 coupled between the request decoder 601 and the even-bank and odd-bank row control registers 305, 307 and, as in the embodiment of FIG. 15, first and second column buses 503A and 503B coupled to the even-bank column control registers 109 and odd-bank column control registers 11, respectively.

Upon decoding a row activation request, the request decoder 601 outputs the row address and bank address onto the row bus 315, then asserts one of four row-register strobe signals 605A, 605B, 607A or 607B (ERSA, ERSB, ORSA, ORSB) according to the quadrant specified in the least two significant bits (or other bits) of the bank address; an address field referred to herein as the quadrant address. Assuming, for example, that incoming stream of activation requests is directed in round-robin fashion to quadrants Q0, Q2, Q1 and Q4 of the FIG. 16 memory device 530, then the row-register strobe signals 605A, 605B, 607A and 607B are asserted one after another in respective $t_{RRp}$ intervals. Other quadrant address sequences may be used in alternative embodiments, resulting in a different sequence of row-register strobe signal assertions.

Upon decoding a dual-address micro-threaded column access (e.g., request 561 of FIG. 17), the request decoder 601 outputs the first bank address and column address values therein onto the first column bus 503A and the second bank address and column address values therein (BA2, CA2) onto the second column bus 5036, then asserts either an even-column strobe signal 323A (ECS) or odd-column strobe signal 3236 (OCS) according to whether the pair of addressed banks are odd or even. In alternative embodiments, to avoid restrictions on the pair of banks addressed in a given multi-threaded column access request (e.g., enabling a column access directed to an odd bank to be paired with a column access directed to an even bank), separate column strobe signals and column address buses may be provided to each of the column control registers 309A, 309B, 311A and 311B, with any pair of the column strobe signals asserted to enable the corresponding column control registers to be simultaneously loaded. Also, as discussed above in reference to FIG. 15, a single time-multiplexed column bus may be coupled to all the column control registers 309, 311 to enable sequential loading of selected column control registers in any order.

FIG. 19 illustrates an exemplary timing of control signal assertions by the request decoder 601 of FIG. 18. In the particular example shown, row activation requests 553, 555, 557 and 559 are received in respective $t_{RRp}$ intervals, with each request being directed to a different quadrant in the exemplary order described in reference to sequence of FIGS. 16 and 17 (other row activation orders may be used). Thus, the request decoder 601 asserts the four row-register strobe signals ERSA, ERSB, ORSA, ORSB in respective $t_{RRp}$ intervals, as shown, to transfer the bank and row address values received in the four activation requests to the address-specified row registers 305, 307. Assuming that the same pattern of row activation requests is received in subsequent $t_{RR}$ intervals (i.e., same quadrant ordering, but arbitrary intra-quadrant bank address and row address), each of the four row-register strobe signals ERSA, ERSB, ORSA, ORSB may be asserted once per $t_{RR}$ interval in round-robin fashion.

Still referring to FIG. 19, column strobe signals ECS and OCS are asserted on partial $t_{CC}$ intervals (i.e., $t_{CCp}$) as in the embodiment of FIG. 9. As discussed, if the request decoder supports an arbitrary column control register loading sequence, four distinct column strobe signals may be generated by the request decoder and asserted in respective $t_{CCp}$ intervals in any order. If the incoming column access requests specify the same quadrant access order in each $t_{RR}$ cycle (or any group of $t_{RR}$ cycles), each of the column strobe signals may be asserted in round-robin fashion once per $t_{RR}$ interval or, in the case of the shared column strobe signals (ECS and OCS) shown in FIGS. 18 and 19, once per $t_{CC}$ interval.

FIGS. 20A and 20B illustrate exemplary row requests that may be issued to the memory devices 100 and 530 described above to initiate row operations (e.g., row activation operations and precharge operations). More specifically, FIG. 20A illustrates an exemplary ST-mode (single-threaded mode) row request that is issued when the memory devices 100, 530 are operated in a single-threaded mode, and FIG. 20B illustrates an exemplary MT-mode (micro-threaded-mode) row request issued when the memory devices are operated in a micro-threaded mode. In the particular embodiment shown, each row request is issued in two successive transfers (e.g., during odd and even phases of a clock signal or other timing signal) over a 12 bit request path (RQ0-RQ11) and therefore includes 24 bits. As shown, the ST-mode request includes a three-bit opcode formed by bits "OP," a three-bit bank address, BA0-BA2, and an eleven-bit row address, R0-R10. The opcode indicates the type of row operation to be performed (e.g., row activation or precharge), the bank address indicates which of the eight banks the row operation is directed to, and the row address indicates, at least in the case of a row activation operation, the row of the selected bank in which the operation is to be performed. The remaining seven bits of the ST-mode row request may be reserved (i.e., as indicated by the designation "rsrv") or used to carry information for controlling other functions within the memory device. The MT-mode row request of FIG. 20B is substantially the same as the ST-mode row request, except that one of the reserved bits in the ST-mode request (e.g., the even phase bit transferred on request link RQ3) is optionally used to carry an additional bank address bit, BA3, thereby enabling selection of one of one of sixteen banks within the 16-bank memory device 530 of FIG. 16. In alternative embodiments, row requests of FIGS. 20A and 20B may have different formats, different numbers of bits and may be transmitted in more or fewer transfers over a wider or narrower request path.

FIGS. 21A and 21B illustrate exemplary column requests that may be issued to the memory devices 100 and 530 described above to initiate column access operations (e.g., read operations and write operations). More specifically, FIG. 21A, illustrates an exemplary ST-mode (single-threaded mode) column request that is issued when the memory devices 100, 530 are operated in a single-threaded mode, and FIG. 21B illustrates an exemplary MT-mode (micro-threaded mode) column request issued when the memory devices are operated in a micro-threaded mode. In the embodiments shown, the ST-mode and MT-mode column requests are the same size as the corresponding ST-mode and MT-mode row requests (i.e., 24-bit requests formed by odd and even phase transfers over the 12 bit request path, RQ0-RQ11), but may be larger or smaller than the row requests in alternative embodiments. The ST-mode column request includes a five-bit opcode to specify the type of column access to be performed (e.g., read, write, masked write, etc.), a three-bit bank address, BC0-BC2, to specify one of eight open pages to be accessed (i.e., an open page for one of the eight banks), and a 6-bit column address, C4-C9, to specify one of 64 column locations (also called column offsets) within the open page at which the specified column access operation is to be performed. Ten bits of the ST-mode column access request are reserved or allocated to other functions.

The MT-mode column request is similar to the ST-mode column access request except that the reserved bits of the ST-mode column access request are used to carry a second bank address BCy0-BCy2 and a second column address, Cy4-Cy9, the first bank address and first column address being carried in the same bits as the bank address and column address of the ST-mode column request, but designated BCx0-BCx2 and Cx4-Cx9. By this arrangement, each column request may carry the two distinct bank and column addresses used in the sixteen-bank memory device described in reference to FIGS. 16-19. In alternative embodiments, a second column address, but not a second bank address may be provided in the MT-mode column request (e.g., as in the embodiments described in reference to FIGS. 13-15) and in other alternative embodiments, a single column address and single bank address are provided per column access request (e.g., as in the embodiments described in reference to FIGS. 7-9). Also, in the embodiment described in reference to FIG. 17, the higher density of row activation commands in the row activation pipeline consumes the request path bandwidth that might otherwise be used to transfer precharge commands. Accordingly, in the exemplary MT-mode column request of FIG. 21A, one bit (i.e., odd phase bit transferred over the RQ11 link) is used to indicate whether an auto-precharge operation (AP) is to be performed at the conclusion of the indicated column access operation. In alternative embodiments, the ST-mode and/or MT-mode column requests may have different formats, different numbers of bits and may be transmitted in more or fewer transfers over a wider or narrower request path.

Figure 22:
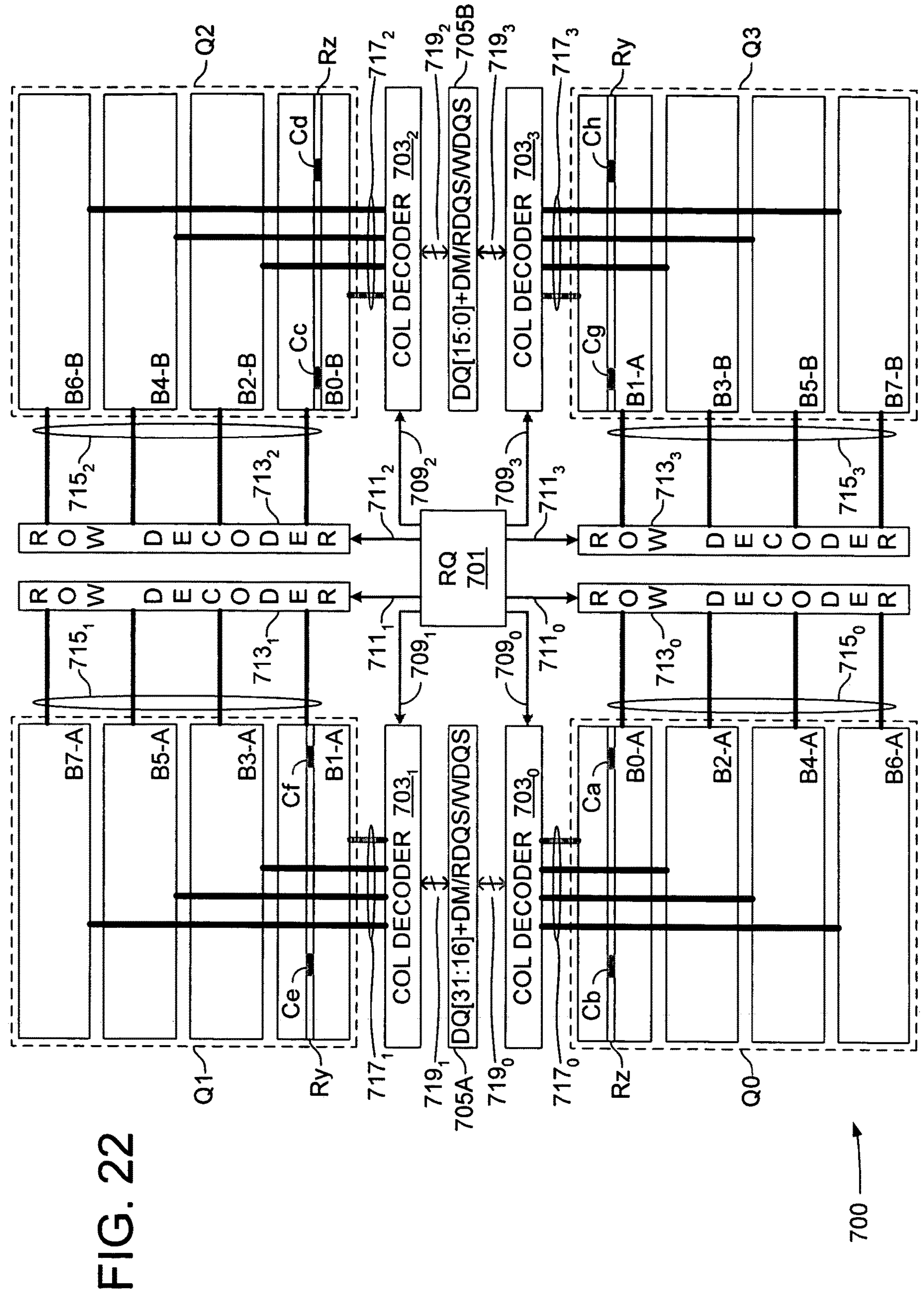
FIGS. 22 and 23 illustrate a memory device having a request interface and data path interface to interface with legacy request and data paths, and an exemplary sequence of micro-threaded memory operations in the memory device.
Figure 23:
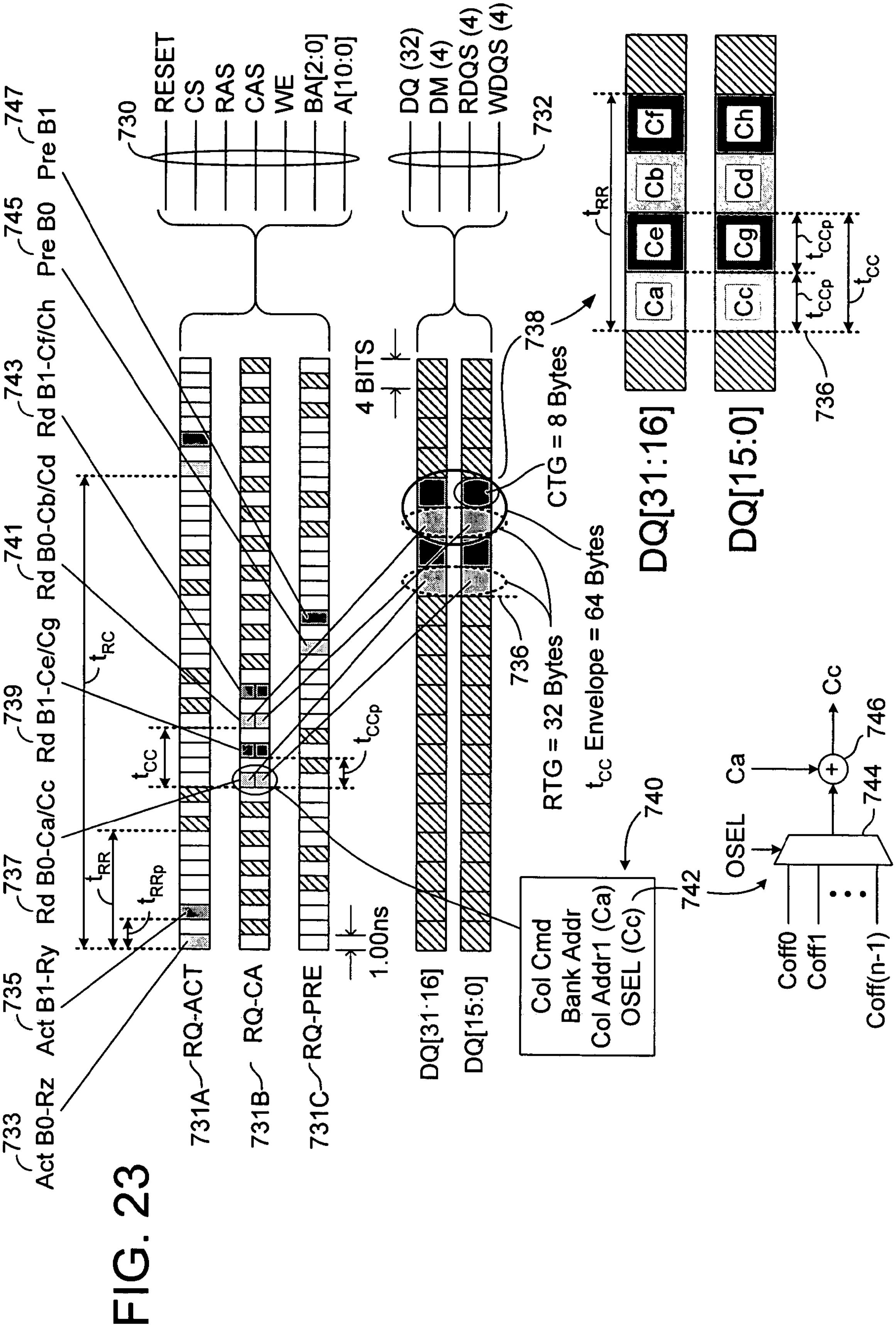

FIGS. 22 and 23 illustrate exemplary micro-threaded memory operations in a memory device 700 having a request interface 701 and data path interface 705A, 705B to interface with legacy request and data paths. Referring to FIG. 23, the request interface receives row and column requests (including address components thereof) via a 19-bit request path 730 formed by a reset line (RESET), chip-select line (CS), row-address-strobe line (RAS), column-address-strobe line (CAS), write-enable line (WE), three bank address lines (BA[2:0]) and eleven address lines (A[10:0]). The data path interface is coupled to an external data path 732 formed by 32 data lines (DQ), four data-mask lines (DM), four read data strobe lines (RDQS), and four write data strobe lines (WDQS). The data-mask lines are used to carry respective mask bits during masked-write operations, with each mask bit indicating whether a corresponding byte carried on the DQ lines is to be written or not. The read data strobe lines carry read data strobe signals output from the memory device to time reception of corresponding read data in the memory controller or other control device. The write data strobe lines carry write data strobe signals output from the memory controller (or other control device) to time reception of write data within the memory device 700. Each of the signal lines in the request path 730 and/or data path 732 may be single-ended or differential. Also, in alternative embodiments, different numbers and types of signals may be conducted via the request path 730 and/or data path 732.

In the embodiment of FIG. 22, memory device 700 has substantially the same architecture as memory device 100 of FIG. 1. That is, the memory device 700 has four quadrants, Q0-Q3, eight banks B0-B7 (each formed by a pair of A and B sub-banks), together with column decoders $\mathbf{703}_0$-$\mathbf{703}_3$ and row decoders $\mathbf{713}_0$-$\mathbf{713}_3$ that correspond to the column decoders $\mathbf{103}_0$-$\mathbf{103}_3$ and row decoders $\mathbf{113}_0$-$\mathbf{113}_3$ of FIG. 1, though the banks may have different width and/or depth dimensions and the column and row decoders correspondingly revised to accommodate the differently-dimensioned banks. Also, signal paths $\mathbf{709}_0$-$\mathbf{709}_3$, $\mathbf{711}_0$-$\mathbf{711}_3$, $\mathbf{715}_0$-$\mathbf{715}_3$, $\mathbf{717}_0$-$\mathbf{717}_3$ and $\mathbf{719}_0$-$\mathbf{719}_3$ correspond to the signal paths $\mathbf{109}_0$-$\mathbf{109}_3$, $\mathbf{111}_0$-$\mathbf{111}_3$, $\mathbf{115}_0$-$\mathbf{115}_3$, $\mathbf{117}_0$-$\mathbf{117}_3$ and $\mathbf{119}_0$-$\mathbf{119}_3$ of FIG. 1, though such signal paths may include different numbers of signal lines as necessary to accommodate the different bank dimensions. Further, as with the memory device 100, memory device 700 is assumed for purpose of description to be a DRAM device, but may be any type of memory device having multiple storage arrays that share addressing and/or data path resources in a manner that imposes timing constraints on sequential accesses directed to the different storage arrays. Also, the memory device 700 may have a different number of banks, sub-banks per bank and/or number of sub-banks per decoder-sharing group in alternative embodiments.

Turning to FIG. 23, a row activation pipeline 731A, column access pipeline 731B, and precharge pipeline 731C illustrate an exemplary sequence of row activation requests, column access requests and precharge requests received in the request interface 701 via request path 730. Referring first to row activation pipeline 731A, a pair of row activation requests directed alternately to even and odd banks of the memory device 700, are received in each $t_{RR}$ interval, starting with row activation requests 733 and 735. The request interface 701 responds to each pair of row activation requests by initiating row activation operations in the corresponding banks of the memory device 700.

A predetermined time after receipt of the row activation requests 733 and 735, a sequence of four multi-address, micro-threaded column access requests 737, 739, 741 and 743 are received, each pair of the column access requests being received in a respective $t_{CC}$ interval and each individual column access request received within a given $t_{CC}$ interval being directed the open page for the bank specified in a respective one of row activation requests 733 and 755. Referring to FIGS. 22 and 23, for example, column access request 737 is directed to the open page of bank B0 (opened in response to row activation request 733) and specifies accesses therein at column addresses 'a' and 'c.' Column access request 739, received in the same $t_{CC}$ interval as column access request 737, is directed to the open page of bank B1 (opened in response to row activation request 735) and specifies accesses therein at column addresses 'e' and 'g.' Column access requests 741 and 743 are received in a second $t_{CC}$ interval, with column access request 741 directed to columns 'b' and 'd' of the open page of bank B0, and column access request 743 directed to columns 'f' and 'h' of the open page of bank B1. The open pages are closed in precharge operations requested in precharge requests 745 and 747. In the particular embodiment shown, each request interval is 1 ns (i.e., requests are transferred over the individual signal lines of path 730 at 1 Gb/s), so that an 8 ns $t_{RR}$ constraint and a 4 ns $t_{CC}$ constraint are assumed. Also, the $t_{RC}$ constraint is assumed to be 40 ns, so that activation requests directed to the rows specified in requests 733 and 735 are not issued again until after a 40 nS interval has elapsed. Other request transfer rates may be used and different $t_{RR}$, $t_{CC}$ and/or $t_{RC}$ constraints may apply in alternative embodiments.

The request decoder responds to the incoming column access requests 737, 739, 741 and 743 by issuing signals to the appropriate column decoders to perform the access operations (e.g., read or write operations), with data that corresponds to each column access being transferred via DQ links DQ[31:0] over a respective partial $t_{CC}$ interval ($t_{CCp}$). More specifically, as shown in detail view 738, each $t_{CC}$ envelope is spatially and temporally subdivided so that, over the $t_{CCp}$ interval starting at 736, data that corresponds to column 'a' of column access request 737 (i.e., data being written to column 'a' or read from column 'a') is transferred via a first portion of the DQ links, DQ[31:16], and data that corresponds to column 'c' of column access request 737 is transferred via a second portion of the DQ links, DQ[15:0]. Similarly, during the next $t_{CCp}$ interval, data that corresponds to columns 'e' and 'g' of column access request 739 is transferred via DQ links, DQ[31:16] and DQ[15:0], respectively. Thus, over the $t_{CC}$ interval starting at 736, data transfers that correspond to four different micro-threaded column access transactions are carried out. In the exemplary embodiment shown, data is transferred over each of the DQ links at 2 Gb/s, so that four bits per link are transferred over each 2 ns $t_{CCp}$ interval. Consequently, an 8-byte column transaction granularity is achieved in a device otherwise having a 32-byte $t_{CC}$ envelope. During the $t_{CC}$ interval that follows the Ce/Cg data transfer, four additional data transfers are carried out in response to the micro-threaded column access requests specified in requests 741 and 743. That is, during a first $t_{CCp}$ interval, data that corresponds to columns 'b' and 'd' of column access request 741 is transferred via DQ links DQ[31:16] and DQ[15:0], respectively, and during the next $t_{CCp}$ interval, data that corresponds to columns 'f' and 'h' of column access request 743 is transferred via DQ links DQ[31:16] and DQ[15:0], respectively. Thus, the total amount of data transferred over the $t_{RR}$ interval starting at 736 is 64 bytes, with one half of the total $t_{RR}$ envelope being allocated to data transfer for each of the rows activated in response to row activation requests 733 and 735. That is, the 64-byte $t_{RR}$ envelope is temporally subdivided between the rows activated in response to requests 733 and 735 to achieve a 32-byte row transaction granularity.

Depending on the number of bits required to specify a column address within the memory device of FIG. 23, the 19-bit request size (i.e., established by the width of request path 730) may be insufficient to carry two complete column addresses. In one embodiment, this circumstance is overcome by storing a set of offset values within the memory device 700 and including an offset select value within incoming multi-address column access requests to select one of the pre-stored offset values. The selected offset value may then be used directly as the second column address or may be combined with a fully specified column address to form a relative column address. For example, in the exemplary format shown at 740, column access request 737 includes an operation specifier, "Col Cmd," that specifies the type of column access (e.g., read, write, masked write, etc.); a bank address, "Bank Addr," that specifies the bank to which the column access is directed; a fully-specified column address, "Col Addr1," that specifies a first column address (e.g., column 'a' in request 737); and an offset select value, "OSEL," that specifies a pre-stored offset value to be summed (or otherwise arithmetically or logically combined) with the fully-specified column address to produce the second column address. That is, as shown at 742, the offset select value may be applied to the control input of a multiplexer 744 to select one of n offset values, Coff0-Coff(n−1), to be summed with column address, Ca, in adder 746, thereby producing the second column address, Cc.

Figure 24:
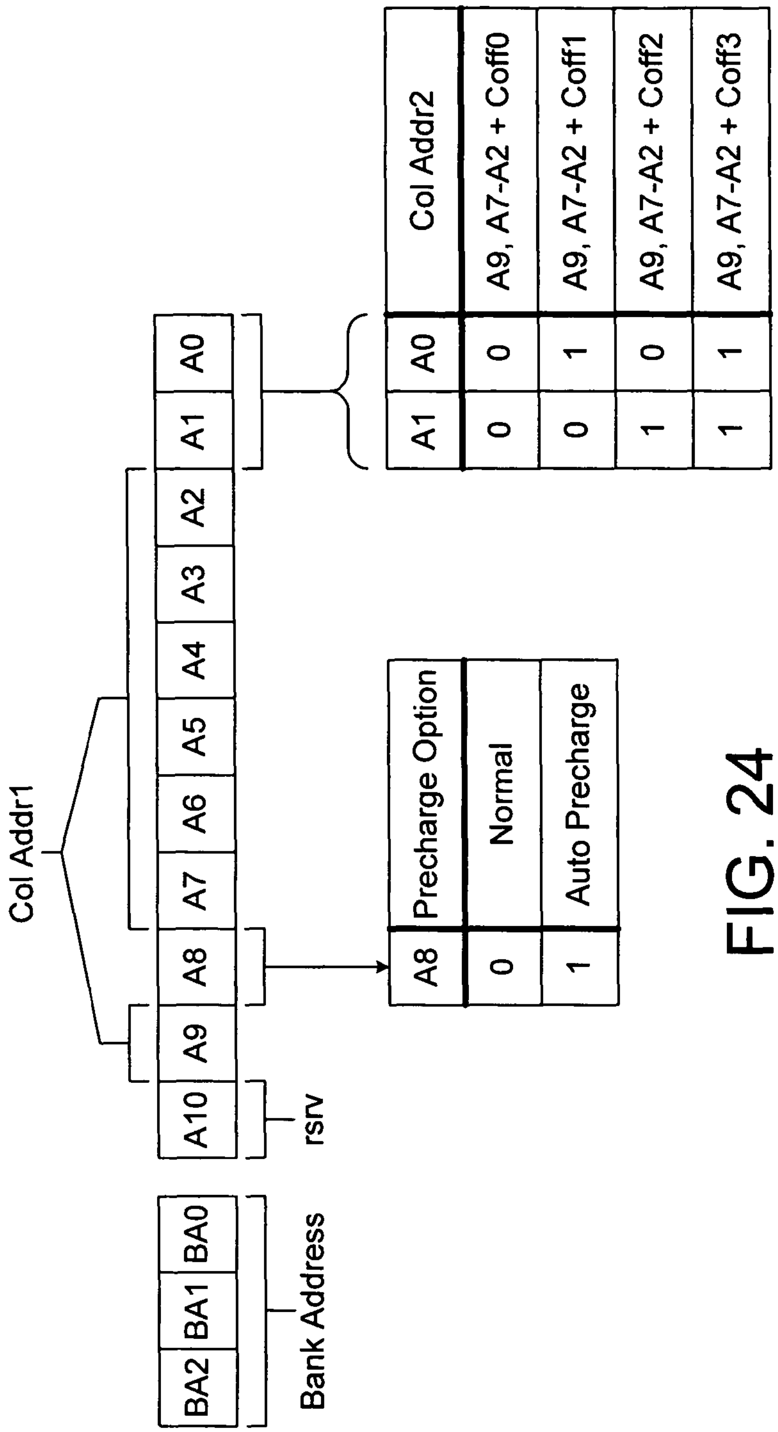
FIG. 24 illustrates a more detailed example of address information provided via the request path shown in FIG. 23.

FIG. 24 illustrates a more detailed example of address information provided, via lines BA[2:0] and A[10:0] of request path 730, as part of a column access request. The BA[2:0] lines carry a three-bit bank address specifying one of eight banks, while address lines A9 and A7-A2 carry a fully-specified, seven-bit column address, "Col Addr1." Address lines A1 and A0 carry a two-bit offset select value which is applied to select one of four column addresses, Coff0-Coff3 to be added to the fully-specified column address. The resulting relative column address constitutes the second column address, "Col Addr2," specified in the column access request. The signal carried on address line A8 indicates whether a normal precharge or auto-precharge is to be carried out (e.g., the auto-precharge occurring at the conclusion of the specified column access operation), and the signal carried on address line A10 is reserved. Different signal encodings on the bank address lines and address lines or other lines of the request path may be used in alternative embodiments. Also, more or fewer column offsets may be stored to enable a larger selection of column offset values. For example, bit A10 may be used to carry the most significant bit of an offset select value, thereby enabling selection of one of eight column offset values.

Figure 25:
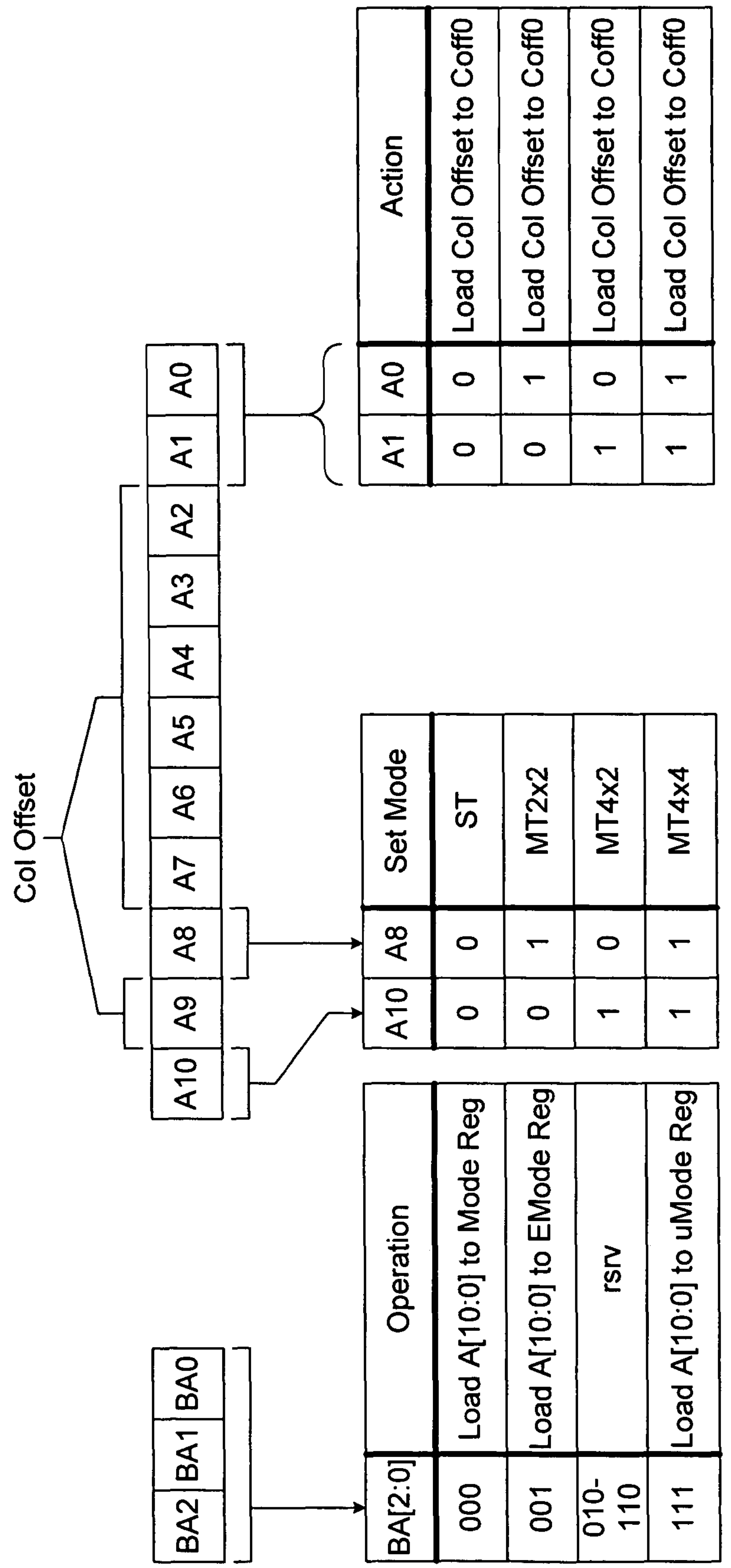
FIG. 25 illustrates exemplary configuration information that may be provided in conjunction with a load mode register command issued to the memory device of FIG. 22.

FIG. 25 illustrates exemplary configuration information that may be provided in conjunction with a load mode register command issued to the memory device 700 of FIG. 22. The load mode register command may be specified, for example, by driving the CS, RAS, CAS, and WE lines of the request path low during a request interval. As shown, the signals carried on lines BA[2:0] indicate the nature of the operation to be performed, with '000' and '001' codes indicating that bits A[10:0] (i.e., the signals carried on lines A[10:0]) are to be loaded into a device mode register or extended mode register, respectively, (e.g., to program device output latency, burst length and/or other device operating characteristics), codes '010-110' being reserved or used for other functions, and code '111' indicating that bits A[10:0] are to be loaded into a micro-thread mode register (i.e., uMode register). In a load to the micro-thread mode register, bits A9 and A7-A2 form a column offset value to be loaded into one of four column offset fields of the micro-thread mode register, and bits A1 and A0 indicate which of the four column offset fields, Coff0-Coff3, is to be loaded. Bits A8 and A10 are coded to one of four values (00, 01, 10, 11) to specify either a single-threaded mode (ST) within the memory device; a two-by-two micro-threaded mode (MT2×2) in which a single column address is provided in each micro-threaded column access request to enable two-way partitioning of the $t_{CC}$ envelope and with the micro-threaded column accesses in each $t_{RR}$ interval directed to two different banks (e.g., to enable micro-threading as described in reference to FIGS. 7-9); a four-by-two micro-threaded mode (MT4×2) in which two column address are provided in each micro-threaded column access request to enable four-way partitioning of the $t_{CC}$ envelope and with the micro-threaded column access in each $t_{RR}$ interval directed to two different banks (e.g., as described in reference to FIG. 23); and a four-by-four micro-threaded mode (MT4×4) in which four row activation requests are received per $t_{RR}$ interval to enable each of four dual-address column access requests to be directed to a different bank, thereby achieving four-way partitioning of each $t_{CC}$ interval and enabling four different banks to be accessed in each $t_{RR}$ interval (e.g., as described in reference to FIG. 17).

Figure 26:
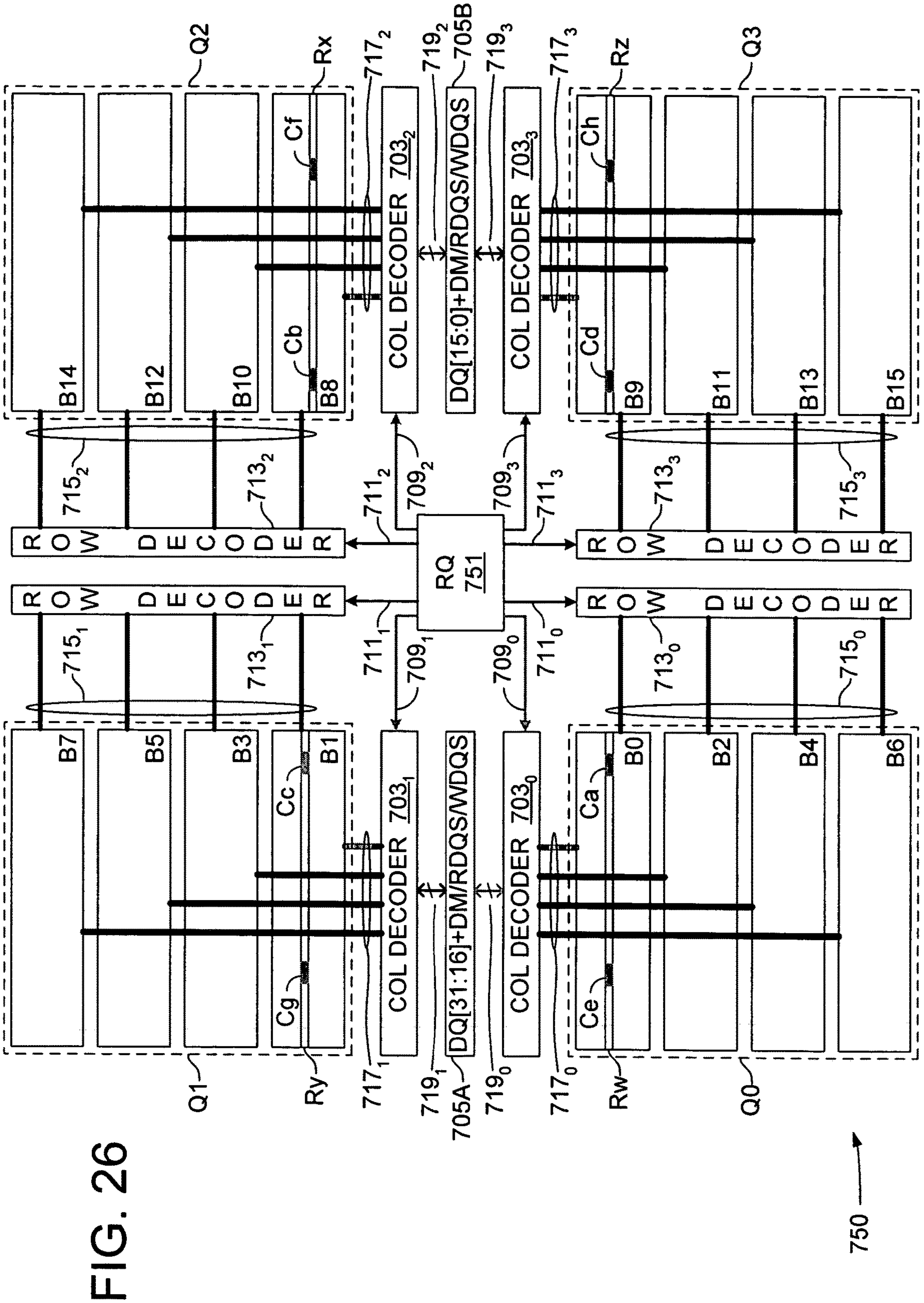
FIGS. 26 and 27 illustrate a memory device having the data path interface described in reference to FIGS. 22 and 23, and an exemplary sequence of four-by-four micro-threaded memory operations in the memory device.
Figure 27:
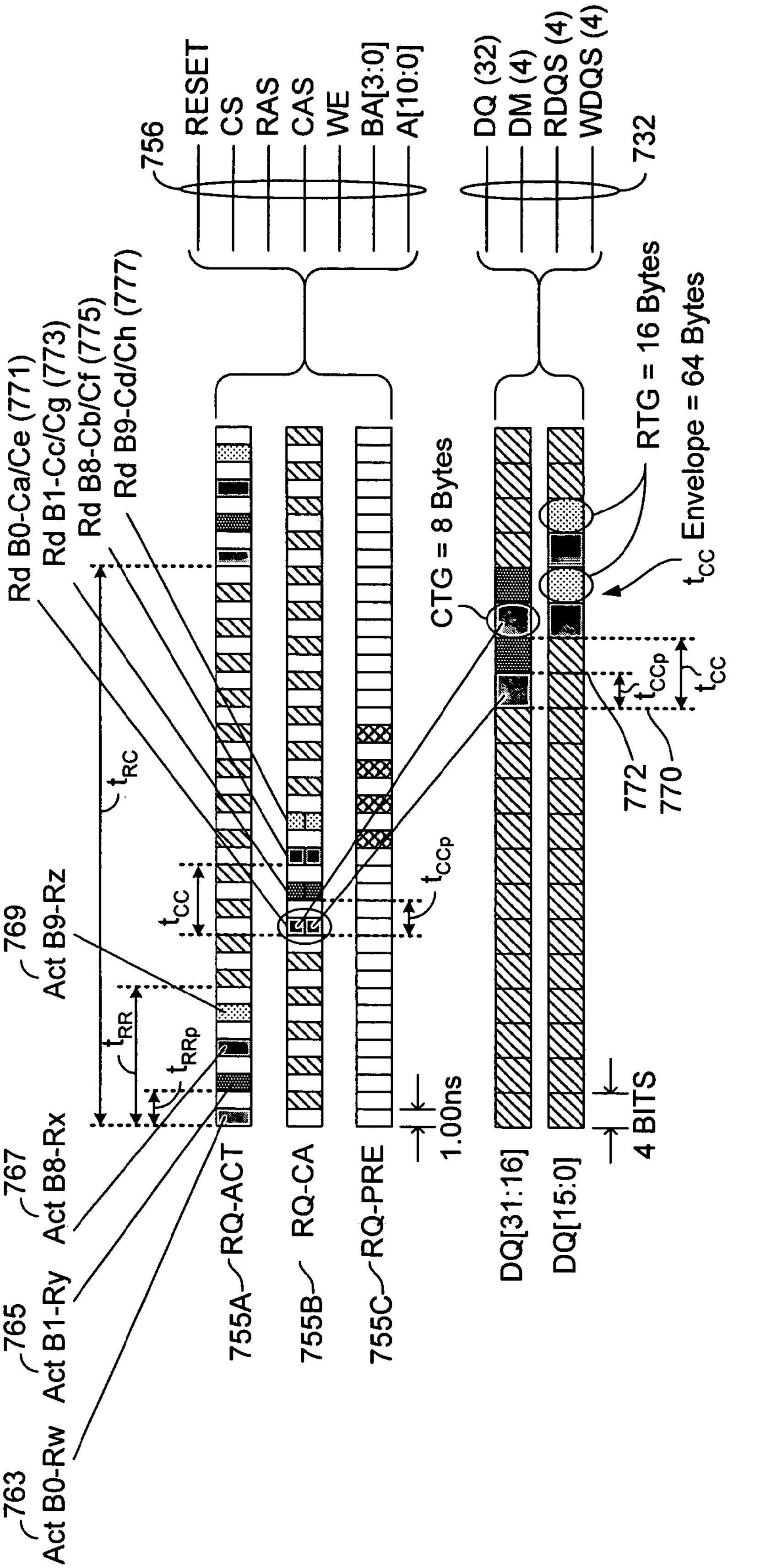

FIGS. 26 and 27 illustrate four-by-four micro-threaded memory operations in a memory device 750 having the data path interfaces 705A and 705B described in reference to FIGS. 22 and 23 to interface with a legacy data path, and having a request interface 751 that is substantially similar to the request interface 701, except that an additional bank address input is provided to receive a fourth bank address bit. By this arrangement, a sequence of row activation requests specifying a bank in each of the four quadrants (Q0-Q3) of the memory device may be received within a single $t_{RR}$ interval, thereby enabling each of four dual-address column access requests to be directed to a respective one of the four quadrants. Because unique bank, row and column addresses may be delivered to the address decoders (i.e., column decoders 703 and row decoders 713) for each quadrant, the storage arrays in each quadrant are effectively converted from sub-banks to banks, thereby yielding a sixteen bank architecture having banks B0-B15 as shown in FIG. 26. As in the other memory device embodiments discussed above, memory device 750 may have more or fewer storage arrays in alternative embodiments yielding correspondingly more or fewer banks. Also, any of the sixteen banks may include any number of constituent sub-banks.

Referring to FIG. 27, the row activation pipeline 755A is more densely loaded than in the embodiment described in reference to FIG. 23 to deliver row activation requests 763, 765, 767 and 769 directed to banks with each of the four quadrants of the memory device 750 in a single $t_{RR}$ interval. That is, the $t_{RR}$ interval is sub-divided into four $t_{RRp}$ intervals, with a row activation request being received in each. In the specific example shown in FIGS. 26 and 27, rows 'w', 'y', 'x' and 'z' are activated one after another in banks B0, B1, B8 and B9, though rows may be activated in each of the four quadrants in different order in subsequent transactions or in alternative embodiments.

Referring to column access pipeline 755B, a predetermined time after the first row activation request 763 is received, a pair of dual-address micro-threaded column access requests 771, 773 are received one after another in a first $t_{CC}$ interval. The first column access request 771 is directed to the same bank (B0) as the first row activation request 763 and specifies a pair of column locations 'a' and 'e' (e.g., a fully-specified column address and offset select value as discussed in reference to FIGS. 23-25) to be accessed one after another in successive $t_{CC}$ intervals. The second column access request 773 is similarly directed to the same bank (B1) as the second row activation request 765 and specifies a pair of column locations 'c' and 'g' to be accessed one after another in successive $t_{CC}$ intervals. Column data that corresponds to the first column address 'a' of column access request 771 is transferred a predetermined time later over the $t_{CCp}$ interval starting at 770 and via the subset of DQ links, DQ[31:16] coupled to the data path interface 705A for banks B0-B7. Column data that corresponds to the first column address 'e' of column access request 773 is transferred via the same DQ link subset, DQ[31:16], over the $t_{CCp}$ interval that starts at 772 (i.e., over the second half of the $t_{CC}$ interval that starts at 770). During the succeeding $t_{CC}$ interval, transfers from the open pages are repeated in respective $t_{CCp}$ intervals to transfer B0, column 'e' data and B1, column 'g' data. Thus, data for the two column access requests directed to low order banks, B0-B7, are transferred in interleaved fashion (i.e., B0-Ca, B1-Cc, B0-Ce, B1-Cg) in respective $t_{CCp}$ intervals and over a subset of the DQ links. Data for the two column access requests 775, 777 directed to high-order banks, B8-B15, are similarly transferred in interleaved fashion (i.e., B8-Cb, B9-Cd, B8-Cf, B9-Ch) in respective $t_{CCp}$ intervals and over the DQ link subset, DQ[15:0]. Overall, the entire data transfer sequence in response to the column access requests 775, 777 occurs over a $t_{RR}$ interval that starts at 772. In the embodiment of FIG. 27, the data transferred in response to column access requests 777 and 775 is delayed by a $t_{CC}$ interval relative to the data transferred in response to column access requests 771, 773 due to the receipt of the column access requests 777 and 775 one $t_{CC}$ interval after requests 771 and 773. In an alternative embodiment, the data to be transferred in response to the earlier-received pair of column access requests may be buffered, then output over the same $t_{RR}$ interval as the data transferred in response to the later-received pair of column access requests. In either case, because each 32-byte $t_{CC}$ envelope is spatially halved and temporally halved to accommodate four micro-threaded column access transactions, an 8-byte column transaction granularity is achieved. Also, because each 64-byte $t_{RR}$ envelope is subdivided to enable data transfer to or from four different banks, a sixteen byte row transaction granularity is achieved.

Still referring to FIGS. 26 and 27, the relative addressing scheme discussed in reference to FIGS. 23-25 may be used to convey the second column address in each of the column access requests 771, 773, 775, 777. Also, because an additional bank address bit is provided via line BA[3] of signal path 756, the operation encoding shown in the bank address field of FIG. 25 may be different and/or include additional or different operations. Further, because bandwidth for specifying precharge operations is consumed by the more densely loaded row request pipeline 755A, precharge operations may be specified by the auto-precharge option indicated in FIG. 24 (i.e., A8=1). Such precharge operations are shown in cross-hatched request intervals in the precharge pipeline of 755C to provide an example of when such operations are carried out, but are specified in the corresponding column access requests 771, 773, 775 and 777, rather than in explicit precharge requests.

Figure 28:
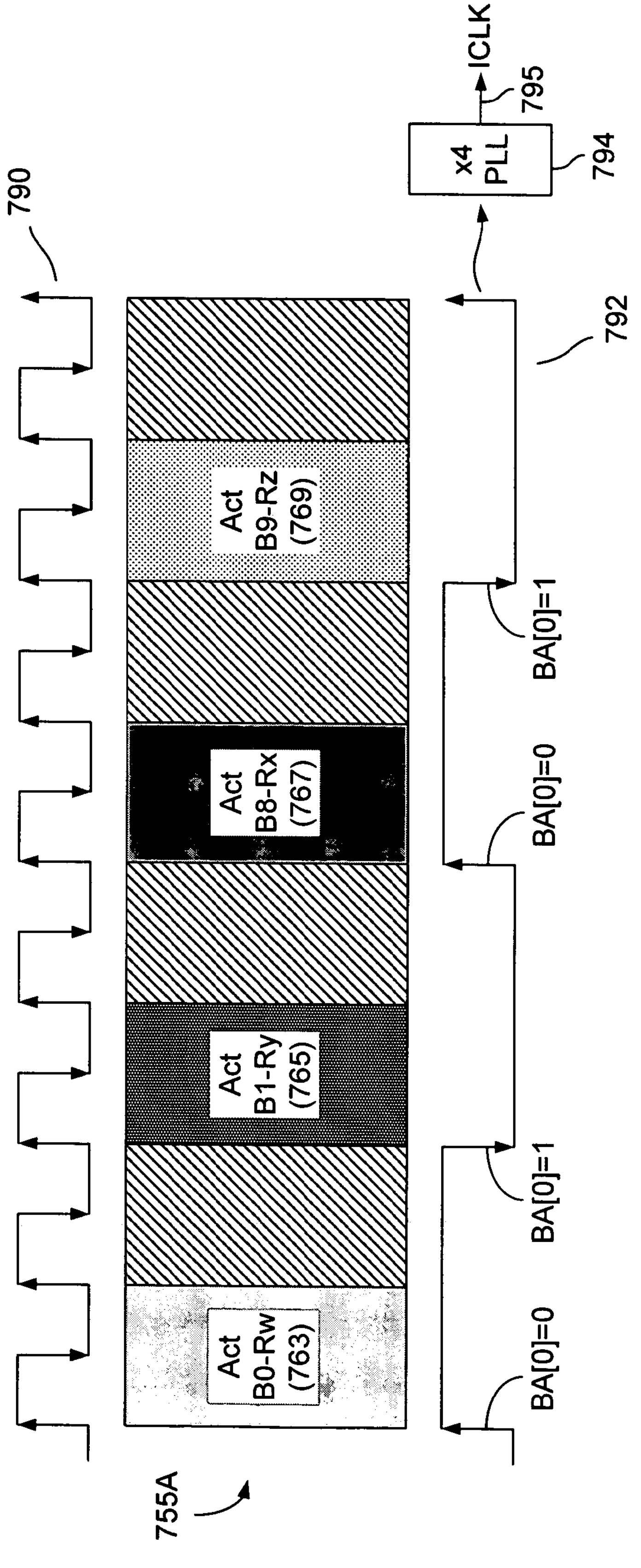
FIG. 28 illustrates an exemplary timing signal arrangement that may be used to convey a fourth bank address bit to the memory device of FIG. 26.

FIG. 28 illustrates an exemplary timing signal arrangement that may be used to convey the fourth bank address bit used in the embodiments of FIGS. 26 and 27, thereby obviating the added BA signal link and enabling four-by-four micro-threaded operation using the legacy signal path 730 of FIG. 23. In the particular example shown, instead of using a full-frequency timing signal 790 (i.e., clock signal or strobe signal) to time request transfer over the request path, a reduced-frequency timing signal 792 that exhibits alternating rising and falling edges at the start of every second request interval is used to convey the least significant bank address bit, BA[0], while the BA[2:0] signal lines are used to convey the most significant bank address bits BA[3:1]. If the first quadrant to be accessed in a given $t_{RR}$ interval is an even quadrant (Q0 or Q2), the timing signal 792 is output with a rising edge that arrives at the memory device synchronously with respect to the corresponding row activation request (or column access request) to convey BA[0]='0.' If the first quadrant to be accessed is an odd quadrant (Q1 or Q3), the timing signal is output with a falling edge that arrives at the memory device synchronously with respect to the corresponding row activation request to convey BA[0]='1.' In the embodiment of FIGS. 26 and 27, the least significant bit of the bank address toggles with each successive row activation request (or column access request), so that edge of the timing signal that corresponds to the second row activation request (or column access request) within a given $t_{RR}$ interval will select the appropriate odd or even bank set; the opposite bank set selected by the edge of the timing signal that corresponds to the first row activation request. In the particular example shown in FIG. 28, a portion of the row request pipeline 755A containing row activation requests 763, 765, 767 and 769 is shown in edge alignment with the timing signal 792. The initial rising edge transition of the timing signal 792 indicates that BA[0] is a 0 so that, by delivering address values BA[3:1]=000 in row activation request 763 (i.e., via lines BA[2:0] of the request path), bank B0 is specified by the row activation request 763. The subsequent falling edge transition of the timing signal coincides with the arrival of row activation request 765 and indicates that BA[0]=1. Accordingly, by delivering address values BA[3:1]=000 in row activation request 765, bank B1 is specified. Banks B8 and B9 are similarly specified in row activation requests 767 and 769 by specifying BA[3:1]=100 in conjunction with a rising-edge transition and falling-edge transition, respectively, of timing signal 792. A clock recovery circuit such as phase-locked loop 794 may be used to generate an internal timing signal 795 that is phase aligned with transitions of timing signal 792 but having a frequency that corresponds, for example, to the frequency of signal 790. The internal timing signal 795, which may itself be a clock signal or strobe signal, may then be used to control sampling of signals conveyed on the request path in order to capture a new request in each request interval.

Figure 29:
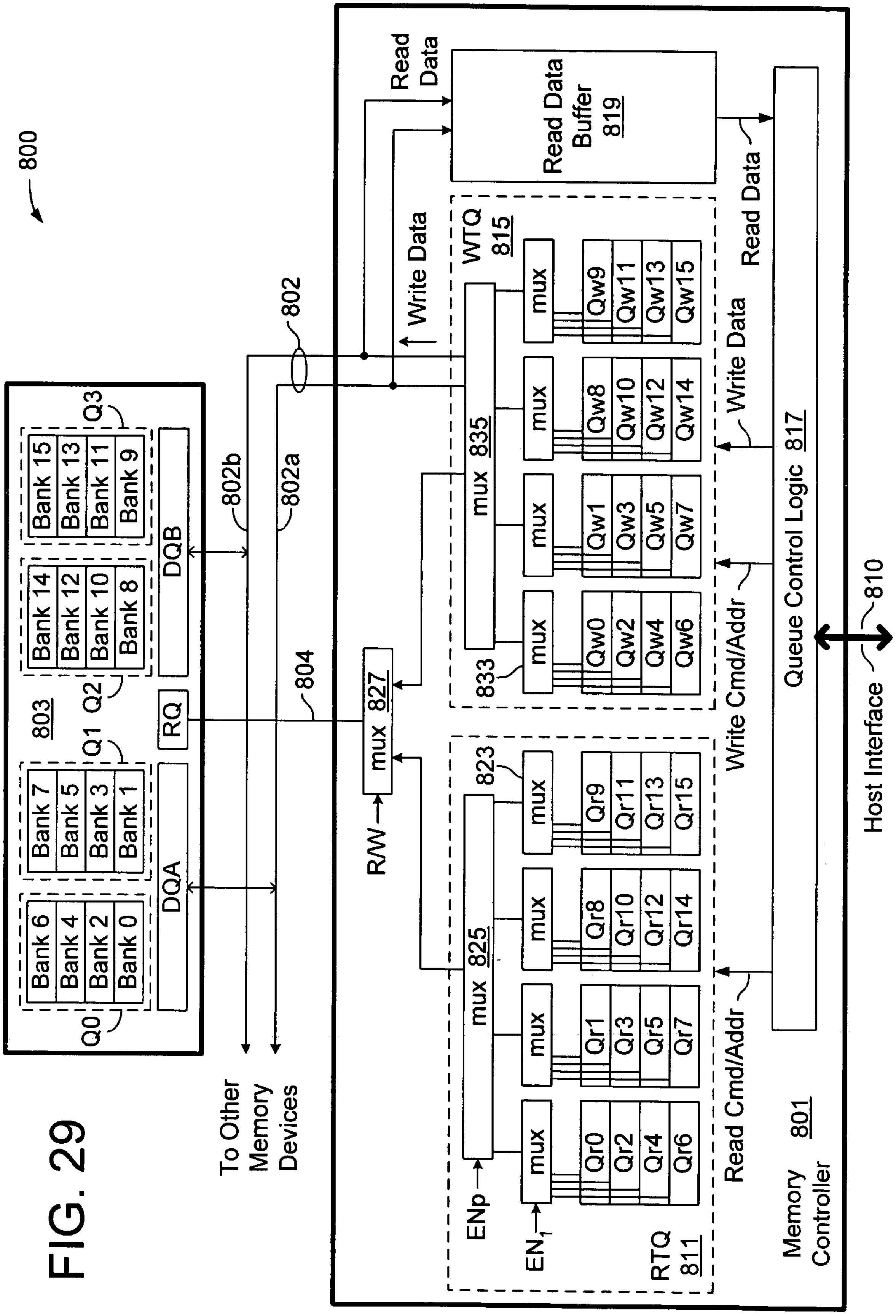
FIG. 29 illustrates an embodiment of a memory system that includes a memory controller and at least one micro-threaded memory device.

FIG. 29 illustrates an embodiment of a memory system 800 that includes a memory controller 801 and at least one micro-threaded memory device 803. The micro-threaded memory device 803 may be implemented according to any of the above-described embodiments, but for present purpose is assumed to have at least two data path interfaces, DQA and DQB, for accessing respective sets of eight storage banks (i.e., DQA is used to transfer data to and from banks B0-B7, and DQB is used to transfer data to and from banks B8-B15), and a request interface, RQ, for receiving row and column requests and controlling execution of the requested row and column operations. The storage banks themselves are additionally organized in quadrants, Q0-Q3, as described above in reference to memory devices 100, 530, 700 and 750, though other storage bank organizations may be used. The DQA and DQB data path interfaces are coupled to the memory controller via respective subsets of DQ links 802*a* and 802*b* within data path 802, and the request interface is coupled to the memory controller via a request path 804. In the embodiment shown, the request path 804 is formed by a set of point-to-point links, while the data path 802 is formed by multi-drop links (i.e., data path interfaces of one or more other memory devices may be coupled to the data path or a subset of the DQ links thereof). In alternative embodiments, the request path 804 may be a multi-drop path coupled to request interfaces of one or more additional memory devices (not shown) and/or the data path 802 may be formed by point-to-point links between the memory controller 801 and memory device 803. Also, the memory device 803 may be one of multiple memory devices disposed on a memory module and coupled to a buffering circuit via a set of point-to-point links (or a multi-drop path). The buffering circuit may receive requests and/or data directed to any of the memory devices on the memory module, and retransmit the requests and/or data to the target memory device via the corresponding set of point-to-point links.

The memory controller 801 includes a read transaction queue 811 (RTQ), write transaction queue 815 (WTQ), read data buffer 819, queue control logic 817 and host interface 810. During an initialization or reconfiguration operation, system configuration requests are delivered to the memory controller 801 which, in turn, programs the memory device 803 (including other memory devices if present) to operate in the specified mode, for example, by issuing programming information via request path 804, data path 802 and/or one or more other paths between the memory controller 801 and the memory device 803 (e.g., a sideband path, not shown). In one embodiment, for example, the memory controller 801 or other device may read a configuration memory associated with memory device 803 (e.g., a serial presence detect (SPD) or the like) to determine operating characteristics, constraints and modes of the memory device 803 (e.g., in the case of a dual-inline memory module (DIMM) or the like having the memory device 803 and one or more other like devices mounted thereto, the tCC, tRR and/or tRC constraints for memory device 803 may be recorded within the configuration memory), then pass such information back to a processor or other host. The processor may process such information (e.g., as part of basic input-output service (BIOS) code execution), then program the memory controller 801 to establish a desired memory configuration, including instructing the memory controller 801 to program the memory device 803. For example, the memory controller 801 may be instructed to issue micro-thread-mode register set commands as described in reference to FIG. 25 to program the memory device 803 for single-threaded operating mode, or any of the micro-threaded operating modes described above (e.g., the MT2×2, MT4×2 and MT4×4 operating modes described above). The memory controller 801 may also include one or more internal configuration registers that are programmed in response to instructions received via host interface 810 to establish single-threaded control mode or micro-threaded control mode.

After the memory device 803 and memory controller 801 have been configured (or re-configured in the case where operating modes may be switched during run-time operation), one or more host devices such as a general purposes processor, graphics processor, network processor, and/or direct memory access (DMA) controller may issue memory access requests to the memory controller 801, including memory read requests, memory write requests, masked write requests, read-modify-write requests and so forth. The incoming memory access requests are received in the queue control logic 817 which, in turn, queues the requests in either the read transaction queue 811 or write transaction queue 815 according to whether they specify read or write access.

The read transaction queue (RTQ) 811 includes four sets of read queues, Qr0/2/4/6, Qr1/3/5/7, Qr8/10/12/14 and Qr9/11/13/15 that correspond to four quadrants of storage banks within the memory device 803. When read requests are received within the queue control logic 817, the queue control logic 817 determines, based on address information included with the request, the memory device and storage bank to which the request is directed and stores the request in the corresponding read queue. For example, requests directed to bank 0 of the memory device 803 are stored in read queue Qr0, requests directed to bank 8 are stored in read queue Qr8 and so forth. By organizing the read requests within the read queues in this manner, the memory controller 801 is able to issue row activation and column access requests in an order that supports micro-threaded memory access transactions within the memory device 803. For example, assuming that each of the four sets of read queues includes at least one memory read request, then the queue control logic 817 may issue respective enable signals (i.e., $EN_1$, $EN_2$, $EN_3$, $EN_4$, only one of which is shown in FIG. 29) to first stage multiplexers 823 to control the selection of one of the four read queues from each set during a given $t_{RR}$ interval. The queue control logic 817 additionally issues a selection-enable signal (ENp) to second stage multiplexer 825 to select one of the four first stage multiplexers 823 to output a read request from a selected read queue during each $t_{RRp}$ interval or, in the case of column access requests, during each $t_{CCp}$ interval. That is, the queue control logic 817 may transition the ENp signal from one state to another at the end of each $t_{RRp}$ or $t_{CCp}$ interval to select another of the first stage multiplexers 823, thereby enabling requests to be directed to each of the four quadrants of the memory device in round robin fashion. The first stage multiplexer 825 outputs requests to read/write multiplexer 827 which passes requests from either the read transaction queue 811 or write transaction queue 815 onto request path 804 in response to a control signal (R/W) from the queue control logic 817. Read data output from the memory device 803 in response to the micro-threaded read requests are delivered to the memory controller 801 via data path 802 and buffered in a read data buffer 819. The queue control logic 817 associates the read data with corresponding host read requests and outputs the read data to the requesting host device via the host interface.

The write transaction queue 815 includes four sets of write queues (i.e., Qw0/2/4/6, Qw1/3/5/7, Qw8/10/12/14 and Qw9/11/13/15), first stage multiplexers 833 and second stage multiplexer 835, each of which operate in generally the same manner as their counterparts in the read transaction queue 811, except that the write queues store and output write data in addition to write requests. Thus, write requests may be issued to each of the four quadrants of the memory device 803 on even $t_{RRp}$ or $t_{CCp}$ intervals to initiate micro-threaded write transactions therein.

Embodiments in Computer-Readable Media

It should be noted that the various circuits disclosed herein (e.g., memory devices or component circuits thereof) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A memory device comprising:

bank groups, each bank group having banks of memory; and a command interface to receive, from a memory controller, via at least one link that is to couple the command interface with the memory controller, row activation commands to instruct row activations and column access commands to instruct column accesses;

wherein a first interval that is to transpire between back-to-back row activations to banks within different ones of the bank groups, is shorter than a second interval that is to transpire between back-to-back row activations to banks within a common one of the bank groups, a third interval that is to transpire between back-to-back column accesses to banks within different ones of the bank groups, is shorter than a fourth interval that is to transpire between back-to-back column accesses to banks within a common one of the bank groups, and each of the row activation commands and the column access commands are to be received via the at least one link, on a time-multiplexed basis.

2. The memory device of claim 1, wherein:

the memory device further comprises circuitry to receive a clock signal from a memory controller, the clock signal having clock transitions;

each of the first interval, the second interval, the third interval and the fourth interval are defined by respective numbers of the clock transitions; and the third interval is shorter than the first interval.

3. The memory device of claim 1, wherein:

each bank includes a first sub-bank and a second sub-bank;

the first sub-bank is in a first bank group of the bank groups; and the second sub-bank is in a second bank group of the bank groups.

4. The memory device of claim 3, wherein:

each sub-bank in the first bank group shares first row decoder circuitry and first column decoder circuitry with each other sub-bank in the first bank group; and each sub-bank in the second bank group shares second row decoder circuitry and second column decoder circuitry with each other sub-bank in the second bank group.

5. The memory device of claim 1, further comprising circuitry to service the row activation commands and the column activation commands, wherein the circuitry to service the row activation commands and the column activation commands is to receive at least one column access command for each row activation command, in order to access a column within a row activated by a corresponding row activation command, and wherein the command interface is to receive bank address information from the memory controller for each row activation command and for each column access command, in order to select a bank and in order to select one of the bank groups in the bank groups.

6. The memory device of claim 5, wherein the circuitry to service the row activation commands and the column activation commands is to receive, for a given row activation command, at least two column access commands, in order to access different columns within a row activated by the given row activation command.

7. The memory device of claim 1, wherein the memory device further comprises a data interface to transfer data with the memory controller via links, using respective, mutually-exclusive subsets of the links to transfer data in association with the back-to-back column accesses to banks within different ones of the bank groups.

8. The memory device of claim 1, wherein:

the memory device further comprises a data interface to transfer data with the memory controller via links, in association with each column access command; and the memory device further comprises serialization/deserialization circuitry to transfer serialized data with the memory controller over each of the links in association with each column access command.

9. The memory device of claim 1, wherein the memory device further comprises a data interface to transfer each of data and write mask values with the memory controller, via respective link subsets.

10. The memory device of claim 1, wherein the memory device is to receive interleaved row activation commands and interleaved column access commands for back-to-back data accesses in different ones of the bank groups, and is to receive bank address information as part of each command of the row activation commands and column access commands, to select a bank group of the bank groups, and to select a bank within the selected bank group.

11. The memory device of claim 1, wherein:

the first interval is longer than the third interval and the second interval is longer than the fourth interval.

12. A memory device comprising:

bank groups, each bank group having banks of memory;

circuitry to receive a clock signal from a memory controller, the clock signal having clock transitions;

a command interface to receive row activation commands and column access commands from the memory controller, via a command bus having at least one link;

a data interface to transfer data with the memory controller in association with each column access command; and circuitry coupled to the command interface to receive the row activation commands and the column access commands from the command interface and to service the row activation commands and the column access commands, such that a first interval, defined by a first number of clock transitions to transpire between back-to-back row activations to banks within different ones of the bank groups, is shorter than a second interval, defined by a second number of clock transitions to transpire between back-to-back row activations to banks within a common one of the bank groups, and a third interval, defined by a third number of clock transitions to transpire between back-to-back column accesses to banks within different ones of the bank groups, is shorter than a fourth interval, defined by a fourth number of clock transitions to transpire between back-to-back column accesses to banks within a common one of the bank groups; and wherein each of the row activation commands and the column access commands are to be received via the at least one link, on a time-multiplexed basis.

13. The memory device of claim 12, wherein:

each bank includes a first sub-bank and a second sub-bank;

the first sub-bank is in a first bank group of the bank groups; and the second sub-bank is in a second bank group of the bank groups.

14. The memory device of claim 13, wherein:

each sub-bank in the first bank group shares first row decoder circuitry and first column decoder circuitry with each other sub-bank in the first bank group;

each sub-bank in the second bank group shares second row decoder circuitry and second column decoder circuitry with each other sub-bank in the second bank group; and the third interval is shorter than the first interval.

15. The memory device of claim 13, wherein the circuitry to receive and service is to receive at least one column access command for each row activation command, in order to access a column within a row activated by a corresponding row activation command.

16. The memory device of claim 12, wherein the memory device also comprises a data interface to transfer data with the memory controller via links, using respective, mutually-exclusive subsets of the links to transfer data in association with the back-to-back column accesses to banks within different ones of the bank groups.

17. The memory device of claim 12, wherein:

the memory device further comprises a data interface to transfer data with the memory controller via links, in association with each column access command; and the memory device further comprises serialization/deserialization circuitry to transfer serialized data with the memory controller over each of the links in association with each column access command.

18. The memory device of claim 12, wherein the memory device further comprises a data interface to transfer each of data and write mask values, with the memory controller, via respective link subsets.

19. A method of operation in a memory device, the memory device having bank groups, each bank group having banks of memory, the method comprising:

receiving a clock signal from a memory controller, the clock signal having clock transitions;

receiving from the memory controller, via a command interface having at least one link, row activation commands to instruct respective row activations and column access commands to instruct respective column accesses, each row activation command to specify a respective one of the bank groups for the row activations, and each column access command to specify a respective one of the bank groups for each column access, such that a first interval, defined by a first number of clock transitions to transpire between back-to-back row activations to banks within different ones of the bank groups, is shorter than a second interval, defined by a second number of clock transitions to transpire between back-to-back row activations to banks within a common one of the bank groups, and a third interval, defined by a third number of clock transitions to transpire between back-to-back column accesses to banks within different ones of the bank groups, is shorter than a fourth interval, defined by a fourth number of clock transitions to transpire between back-to-back column accesses to banks within a common one of the bank groups; and wherein each of the row activation commands and the column access commands are to be received via the at least one link, on a time-multiplexed basis.

20. The method of claim 19, wherein:

each bank includes a first sub-bank and a second sub-bank;

the first sub-bank is in a first bank group of the bank groups;

the second sub-bank is in a second bank group of the bank groups;

each sub-bank in the first bank group shares row decoder circuitry and column decoder circuitry with each other sub-bank in the first bank group; and each sub-bank in the second bank group shares row decoder circuitry and column decoder circuitry with each other sub-bank in the second bank group.

21. The method of claim 19, wherein:

the method further comprises receiving bank address information as part of each command of the row activation commands and column access commands, to receive memory controller communication of selection of a bank group of the bank groups, and to receive memory controller selection of a bank within the selected bank group; and the third interval is shorter than the first interval.

* * * * *

UNITED STATES PATENT AND TRADEMARK OFFICE

CERTIFICATE OF CORRECTION

PATENT NO. : 11,797,227 B2
APPLICATION NO. : 16/405479
DATED : October 24, 2023
INVENTOR(S) : Frederick A. Ware et al.

It is certified that error appears in the above-identified patent and that said Letters Patent is hereby corrected as shown below:

In the Specification

Column 16, Line 52:
Delete "3216"
Insert --321B--
Column 16, Line 57:
Delete "3216"
Insert --321B--
Column 17, Line 3:
Delete "3236"
Insert --323B--
Column 17, Line 4:
Delete "3116"
Insert --311B--
Column 19, Line 57:
Delete "4616"
Insert --461B--
Column 20, Line 37:
Delete "305B3"
Insert --305B--
Column 20, Line 51:
Delete "3216"
Insert --321B--

Signed and Sealed this
Ninth Day of January, 2024

Katherine Kelly Vidal

Katherine Kelly Vidal
*Director of the United States Patent and Trademark Office*